(12) United States Patent
Morlion et al.

(10) Patent No.: US 7,709,747 B2
(45) Date of Patent: May 4, 2010

(54) MATCHED-IMPEDANCE SURFACE-MOUNT TECHNOLOGY FOOTPRINTS

(75) Inventors: Danny L. C. Morlion, Ghent (BE); Stefaan Sercu, Brasschaat (BE); Winnie Heyvaert, Brasschaat (BE); Jan De Geest, Wetteren (BE)

(73) Assignee: FCI, Versailles (FR)

( * ) Notice: Subject to any disclaimer, the term of this patent is extended or adjusted under 35 U.S.C. 154(b) by 951 days.

(21) Appl. No.: 11/287,926

(22) Filed: Nov. 28, 2005

(65) Prior Publication Data

US 2006/0232301 A1 Oct. 19, 2006

Related U.S. Application Data

(60) Provisional application No. 60/631,545, filed on Nov. 29, 2004, provisional application No. 60/686,514, filed on Jun. 1, 2005.

(51) Int. Cl.
*H01R 12/04* (2006.01)
*H05K 1/11* (2006.01)

(52) U.S. Cl. .................................. 174/262; 361/794
(58) Field of Classification Search ......... 174/261–266; 361/792–795
See application file for complete search history.

(56) References Cited

U.S. PATENT DOCUMENTS

| | | | |
|---|---|---|---|
| 4,636,919 A | 1/1987 | Itakura et al. | |
| 5,516,030 A | 5/1996 | Denton | 228/180.22 |
| 5,784,262 A | 7/1998 | Sherman | 361/777 |
| 6,150,729 A | 11/2000 | Ghahghahi et al. | |
| 6,198,635 B1 * | 3/2001 | Shenoy et al. | 361/760 |
| 6,232,564 B1 | 5/2001 | Arndt et al. | |
| 6,373,139 B1 | 4/2002 | Clark | 257/774 |

(Continued)

FOREIGN PATENT DOCUMENTS

WO WO 2005/081595 A2 9/2005

(Continued)

OTHER PUBLICATIONS

De Geest, J. PhD. et al., "Connector Footprint Optimization Enables 10Gb+ Signal Transmission", DesignCon 2005, 1-25.

*Primary Examiner*—Jeremy C Norris
(74) *Attorney, Agent, or Firm*—Woodcock Washburn LLP

(57) ABSTRACT

Disclosed are methodologies for defining matched-impedance surface-mount technology footprints on a substrate such as a printed circuit board, for example, that is adapted to receive an electrical component having an arrangement of terminal leads. Such a footprint may include an arrangement of electrically-conductive pads and an arrangement of electrically-conductive vias. The via arrangement may differ from the pad arrangement. The vias may be arranged to increase routing density, while limiting cross-talk and providing for matched impedance between the component and the substrate. The via arrangement may be altered to achieve a desired routing density on a layer of the board. Increasing the routing density may decrease the number of board layers, which tends to decrease capacitance and thereby increase impedance. Ground vias and signal vias may be arranged with respect to one another in such a manner as to affect impedance. Thus, the via arrangement may be altered to achieve an impedance that matches the impedance of the component. The via arrangement may be also be altered to limit cross-talk among neighboring signal conductors. Thus, the via arrangement may be defined to balance the impedance, cross-talk, and routing density requirements of the system.

40 Claims, 43 Drawing Sheets

U.S. PATENT DOCUMENTS

| | | | |
|---|---|---|---|
| 6,530,790 B1 | 3/2003 | McNamara et al. | 439/108 |
| 6,538,213 B1 | 3/2003 | Carden et al. | |
| 6,717,825 B2 | 4/2004 | Volstorf | |
| 7,239,526 B1 | 7/2007 | Bibee | |
| 7,242,592 B2 | 7/2007 | Payne et al. | 361/792 |
| 2004/0080465 A1* | 4/2004 | Hendler et al. | 343/795 |
| 2004/0216071 A1 | 10/2004 | Miller | |
| 2005/0202722 A1 | 9/2005 | Reginer et al. | |
| 2006/0232301 A1 | 10/2006 | Morlion et al. | |
| 2007/0050736 A1 | 3/2007 | Bickford et al. | 716/2 |

FOREIGN PATENT DOCUMENTS

| | | |
|---|---|---|
| WO | WO 2005/081596 A2 | 9/2005 |
| WO | WO 2006/053891 | 5/2006 |

* cited by examiner

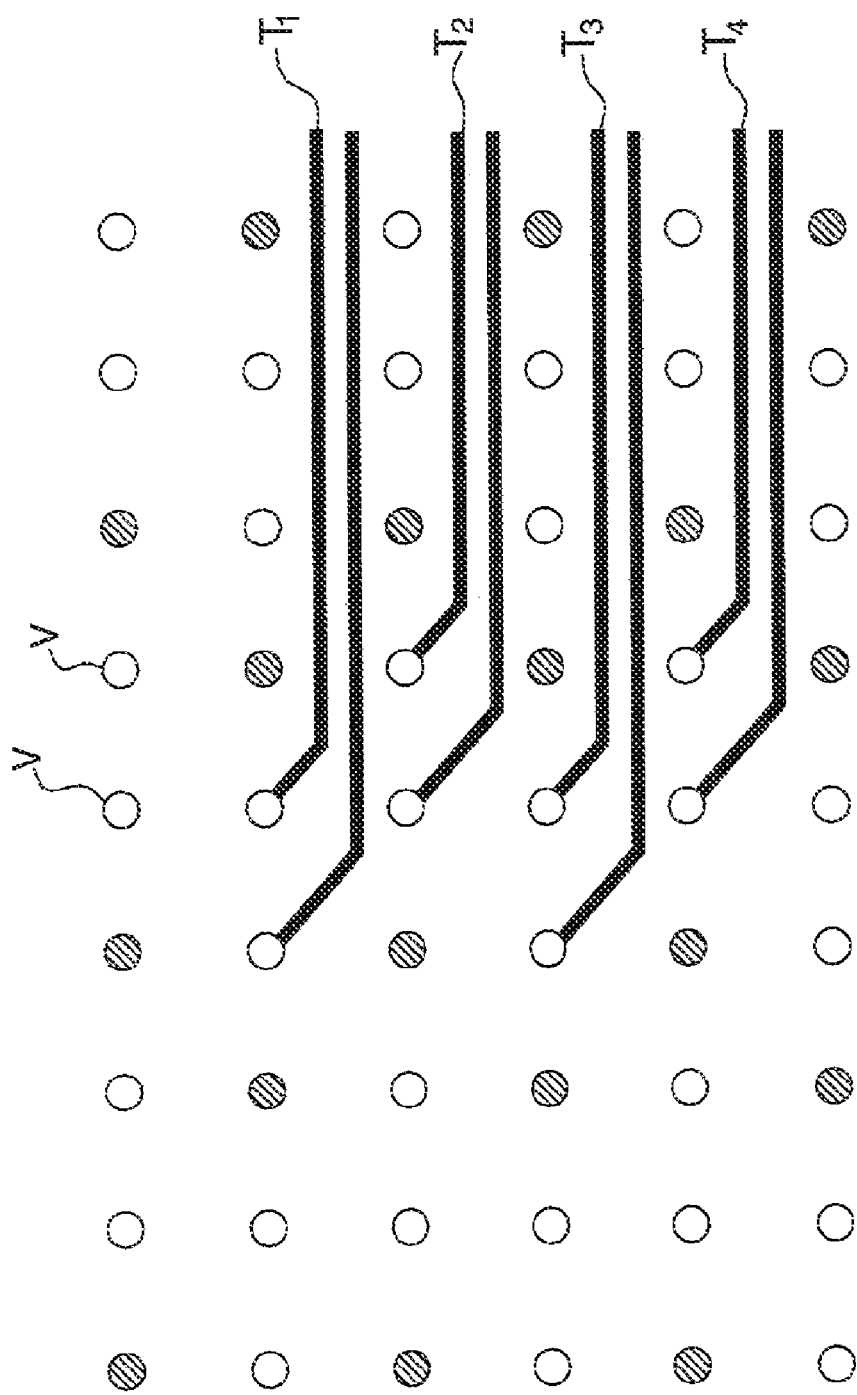

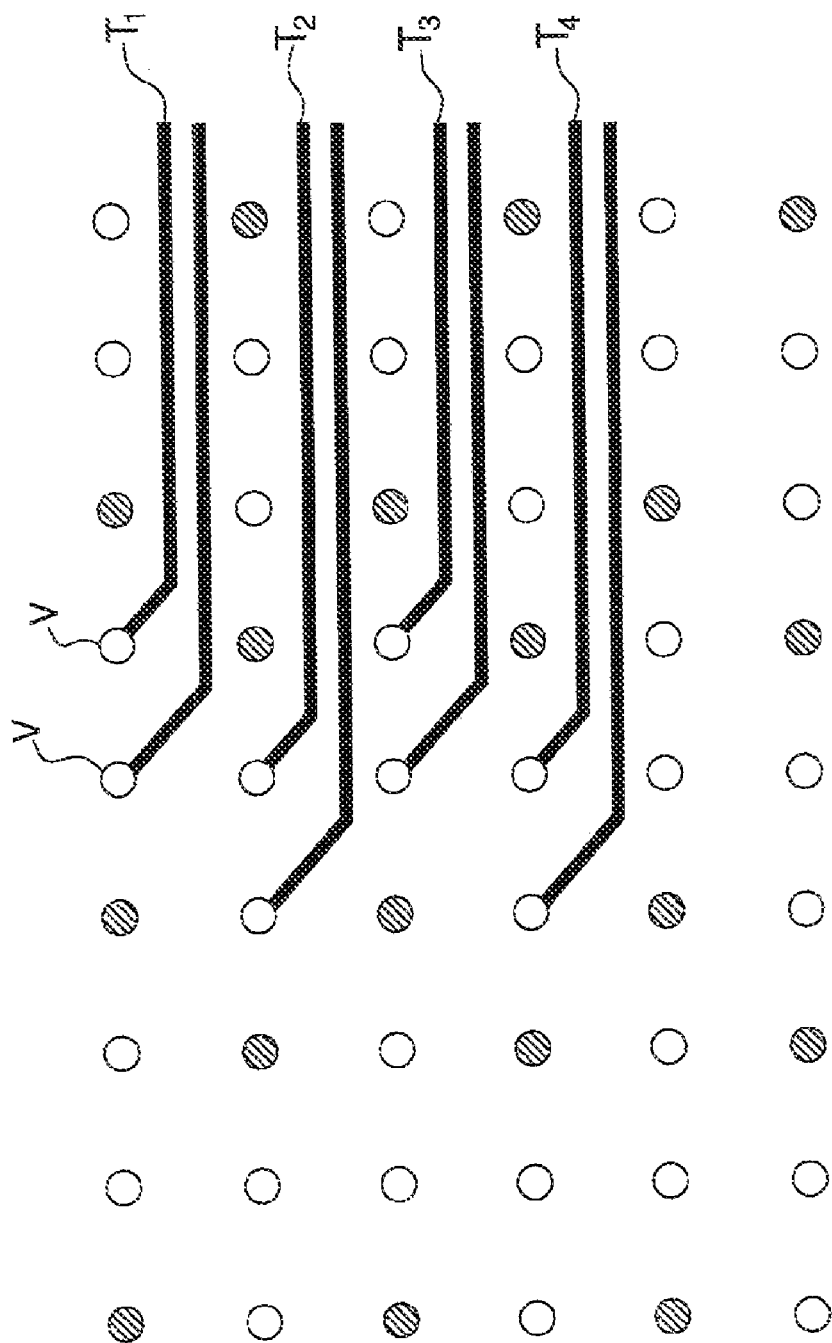

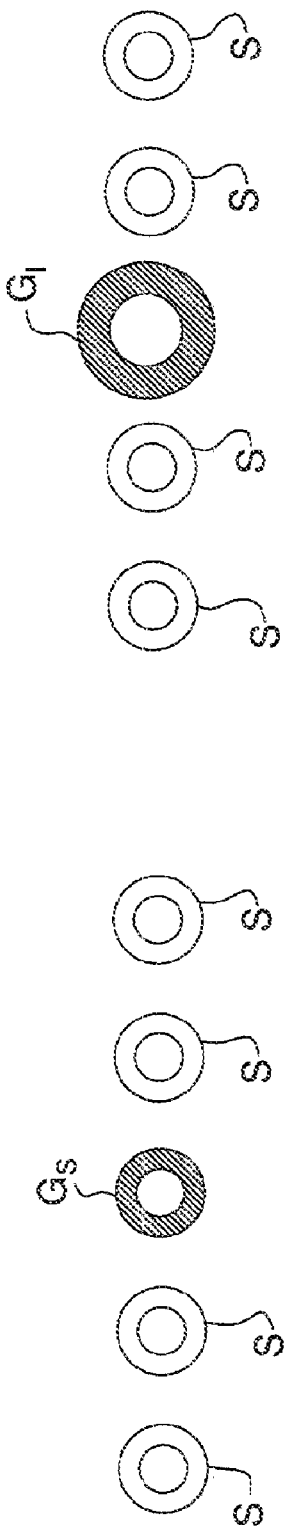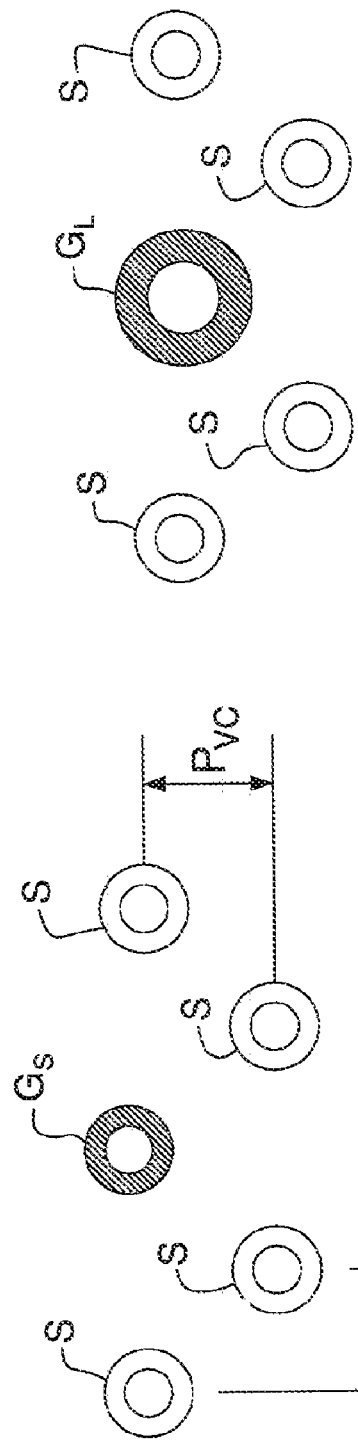

MATCHED-IMPEDANCE SURFACE-MOUNT TECHNOLOGY FOOTPRINTS

CROSS-REFERENCE TO RELATED APPLICATIONS

This application claims benefit under 35 U.S.C. § 119(e) of provisional U.S. patent application No. 60/631,545, filed Nov. 29, 2004, and of provisional U.S. patent application No. 60/686,514, filed Jun. 1, 2005.

This application is related to U.S. patent application Ser. No. 11/287,951, filed 28 Nov. 2005, now U.S. Pat. No. 7,284,221 filed [on even date herewith and entitled "High-Frequency, High-Signal-Density, Surface-Mount Technology Footprint Definitions"], and to provisional U.S. patent application No. 60/631,499, filed Nov. 29, 2004.

The contents of each of the above-referenced U.S. patent applications is incorporated herein by reference.

FIELD OF THE INVENTION

Generally, the invention relates to electrical connector/circuit board systems. More particularly, the invention relates to methodologies for defining surface-mount-technology footprints on such circuit boards wherein vias are disposed relative to one another in a via arrangement that differs from the pad arrangement and provides for a routing density of electrically conductive traces disposed on the substrate that is greater than the routing density the circuit board would have if the signal via arrangement were the same as the signal pad arrangement.

BACKGROUND

Typically, an electrical component, such as an electrical connector, for example, may include a plurality of electrically-conductive contacts, the terminal portions of which may be arranged in a matrix of rows and columns, for example. The contacts L may be signal conductors or ground conductors, and may be arranged along columns in a signal-signal-ground arrangement. Adjacent signal contacts may form differential signal pairs, though the signal contacts may be single-ended signal conductors. Such a component may include any combination of differential signal pairs and single-ended signal conductors.

Terminal portions of the contacts may be received by a substrate, such as a backplane or printed circuit board. At the board termination level, the contact leads may be terminated in plated through-holes (PTHs). PTH technology is a method of PCB manufacture whereby traces on one layer may be electrically connected through previously-drilled through-holes to traces on another layer using a plating method. When PTH technology is employed, the footprint, or arrangement of through-holes, must align with the arrangement of the terminal portions of the leads so that the terminal portions of the leads may be received by corresponding through-holes in the substrate.

Plated through-holes, however, constrain routing density (i.e., the number of traces that may be disposed onto the surface of a board layer). Plated through-holes, therefore, tend to increase the number of board layers necessary to provide required routing. Increasing the number of layers, however, increases board thickness and manufacturing cost. It also increases capacitance due to the increased number of ground planes. Increasing capacitance decreases impedance. Consequently, the board impedance may be driven lower than the component impedance, which creates a undesirable discontinuity between the board impedance and the component impedance. It is desirable that the component impedance and the board impedance be matched as nearly as possible to avoid signal reflections that occur because of the impedance discontinuity. Such reflections created unwanted noise that degrades signal integrity.

Alternatively, an electrical component may be mounted to a circuit board using surface mount technology (SMT). SMT involves electrically connecting terminal ends of the contacts to the surface of the substrate by electrically connecting each terminal end to a respective SMT pad located on the surface of the substrate. The terminal ends of the contacts, which may include electrically-conductive solder balls, for example, are typically soldered to the pads. On multi-layer boards, the SMT pads are typically electrically connected to vias that extend between the layers of the board and electrically connect SMT pads or traces on one layer to traces on another layer.

FIG. 1 depicts a typical SMT connector footprint comprising a plurality of SMT pads P arranged in a pad arrangement and a plurality of vias V arranged in a via arrangement. Each of the vias V is electrically connected to a respective one of the SMT pads P. The SMT pads P and vias V may be arranged in a so-called "dog-bone" pattern, as shown. As shown in the inset, a "dog bone" may include an SMT pad P, a via V, a via pad VP, and an electrically conductive via trace VT that electrically connects the via pad and the SMT pad. It should be understood, however, that vias and SMT pads need not be arranged in such a dog-bone pattern. Alternatively, an SMT pad may overlap partially or completely with a corresponding via pad such that there is a direct connection between the SMT pad and the via pad. Such a configuration is typically referred to as "via-in-pad."

The SMT pads and vias may be arranged into rows and columns. As shown in FIG. 1, columns extend along the horizontal direction, perpendicular to the board edge E. Rows extend along the vertical direction, parallel to the board edge E. The spacing between the centerlines of adjacent rows may be referred to as the row pitch $P_R$. The spacing between the centerlines of adjacent columns may be referred to as the column pitch $P_C$.

The SMT pads P and vias V may be ground conductors or signal conductors. Signal conductors may be used in either single-ended or differential signal transmission. High-speed (i.e., greater than 1 GHz) connectors typically use differential signal pairs for signal transmission. In differential signal transmission, each signal conductor may be paired with an adjacent signal conductor. A respective ground conductor may be disposed between adjacent pairs of signal conductors. In some connector systems, ground conductors may be included to decrease cross-talk among the signal conductors, and to promote impedance-matching.

The pad arrangement depicted in FIG. 1 may be the same as the lead arrangement in the component to be surface-mounted onto the board. For example, the SMT pads may be arranged into rows and columns just as the terminal portions of the leads are arranged into rows and columns. Further, the row pitch $P_R$ and column pitch $P_C$ of the pad arrangement may be the same as the row pitch and column pitch of the lead arrangement.

Similarly, the via arrangement may be the same as the pad arrangement. That is, the vias V may be arranged into rows and columns, for example, just as the SMT pads P are arranged into rows and columns. Further, the row pitch $P_{VR}$ and column pitch $P_{VC}$ of the via arrangement may be the same as the row pitch $P_R$ and column pitch $P_C$ of the pad arrangement.

As described above, it may be desirable to decrease the number of board layers in an effort to reduce electrical discontinuity between the connector and the board and between different layers in the board. One way to accomplish this would be to increase the routing density on each layer of the board. Tying the via arrangement to the pad arrangement, however, tends to constrain the board designer's ability to improve routing density.

For example, in a typical connector having a 2 mm column pitch, a horizontal routing channel (i.e., the board space between adjacent columns) may be wide enough to include only one pair of traces. A typical connector having a 3 mm column pitch may be wide enough to include two pairs of traces. Similarly, in a typical connector having a row pitch of 1.4 mm, a vertical routing channel (i.e., the board space between adjacent rows) may be wide enough to include only a single trace. Consequently, in order to have a signal pair connected "vertically" out of the connector, a first trace must be disposed between a first pair of rows and a second trace must be disposed between a different pair of rows. It is usually desirable, however, to have the traces associated with a signal pair disposed as closely to each other as possible.

SUMMARY

Methodologies are described for defining surface-mount technology (SMT) connector footprints for a substrate, such as a printed circuit board, for example. The substrate may be any substrate that is adapted to receive an electrical component having an arrangement of terminal lead portions (i.e., the terminal portions of the leads). Such a footprint may include an arrangement of electrically-conductive SMT pads. A respective SMT pad may be associated with each terminal lead portion. The SMT pads may be arranged in an arrangement that corresponds to the lead arrangement (i.e., the arrangement of the terminal lead portions). The footprint may also include an arrangement of electrically-conductive vias. Each via may be electrically connected to a respective one of the SMT pads. The vias may be arranged in an arrangement that differs from the pad arrangement (and, therefore, from the lead arrangement). The vias may be arranged in any of a number of ways that increase routing density of traces on the substrate, while limiting cross-talk among signal conductors and providing for matched impedance between the connector and the substrate.

The via arrangement may be altered, i.e., the vias may be moved relative to one another, to achieve a desired routing density on a layer of the board. Increasing the routing density may decrease the number of board layers, thereby decreasing capacitance and increasing impedance. Further, ground vias and signal vias may be arranged with respect to one another in such a manner as to affect impedance and cross-talk. The distance between the signal conductors that form a pair may affect the impedance between them. The distance between the pair and an associated ground conductor may also affect impedance. The via arrangement may be also be altered to achieve an acceptable level of cross-talk among adjacent signal conductors. Thus, according to the invention, the via arrangement may be altered to achieve a desired balance between routing density, impedance-matching, and cross-talk.

Rows of adjacent SMT pads may be in a signal-signal-ground configuration. Such an arrangement may be suitable for edge card applications, for example. The pads may be coupled to respective vias or plated through-holes arranged in columns. Adjacent columns of vias or plated through-holes, however, may be staggered such that a ground via or through-hole of one column may be adjacent to a signal via or plated through-hole of an adjacent column. In this way, for example, unstaggered horizontal rows of SMT pads may break-out to staggered vertical columns of vias or plated through-holes.

Thus, a circuit board may include a substrate, a plurality of electrically conductive pads disposed on the substrate in a row, a first ground via and a first signal via arranged in a first column, and a second ground via and a second signal via arranged in a second column, the second column adjacent to the first column. Each via of the first and second columns may be electrically connected to a respective one of the plurality of pads in the row. The first ground via may be adjacent to the second signal via.

Each of the first and second ground vias may be a plated through hole. Each of the first and second signal vias may be a plated through hole. The plurality of pads may be arranged in repeating three-pad cells of signal, signal, ground. The first ground contact and the second ground contact may form a first diagonal with respect to at least one of the first and second columns. The first signal contact and the second signal contact may form a second diagonal with respect to at least one of the first and second columns. The first diagonal may be adjacent to the second diagonal.

Electrical performance (i.e., impedance, cross-talk, and insertion loss) of SMT connector footprints can be optimized by varying certain parameters of the footprint. Example of such parameters include relative position of signal and ground via holes, the size of the drilled holes, the size of the pads, etc. Disclosed are various options for positioning via holes with respect to the SMT pads in order to optimize electrical performance. Routing density may also be optimized for eliminating layers in the PCB (to improve impedance-matching and reduce manufacturing cost). Reducing via hole size increases available routing channel width, which may be used for routing more or wider traces.

SMT connector footprints may be designed for any application that uses a high-speed, high-density SMT connector (e.g., SATA, SAS, DDR, PCI-Express, backplane, etc.). Once the connector is selected, and the hole diameter and signal/ground configurations are determined, a number of parameters remain that can be optimized to maximize the footprint performance. These parameters include via pad size, via anti-pad size and shape, and via stub length.

BRIEF DESCRIPTION OF THE DRAWINGS

FIGS. 22A and 22B depict an example footprint.

FIGS. 23A-C depict a footprint with signal pairs redirected to vias in different columns.

FIGS. 30A and 30B illustrate various ground via hole sizes for an arrangement of signal conductor vias.

FIGS. 31A and 31B illustrate various ground via hole sizes for another arrangement of signal conductor vias.

DETAILED DESCRIPTION

Figure 1:
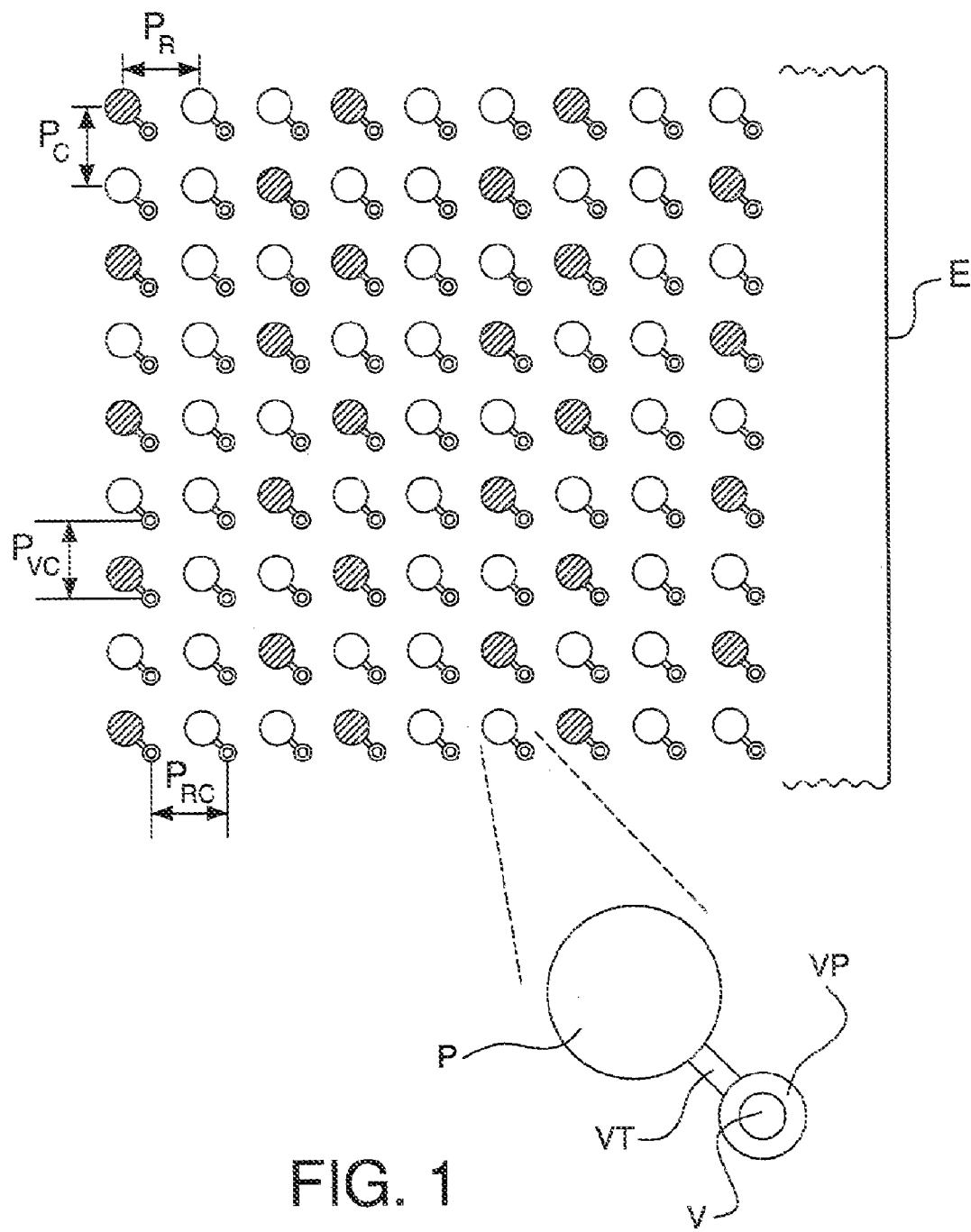
FIG. 1 depicts a substrate having a typical SMT connector footprint disposed thereon.
Figure 2A:
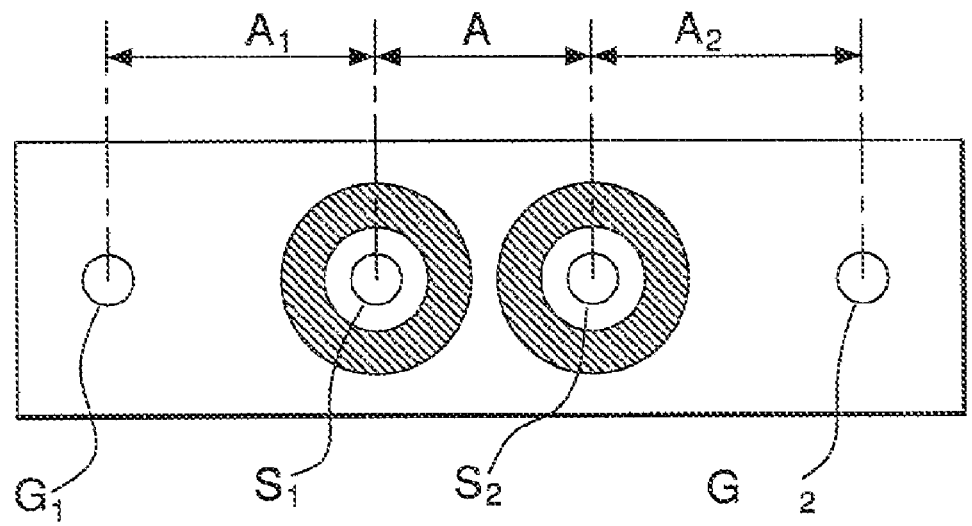
FIGS. 2A and 2B illustrate modifications that may be made to the footprint of FIG. 1 in accordance with the invention.
Figure 2B:
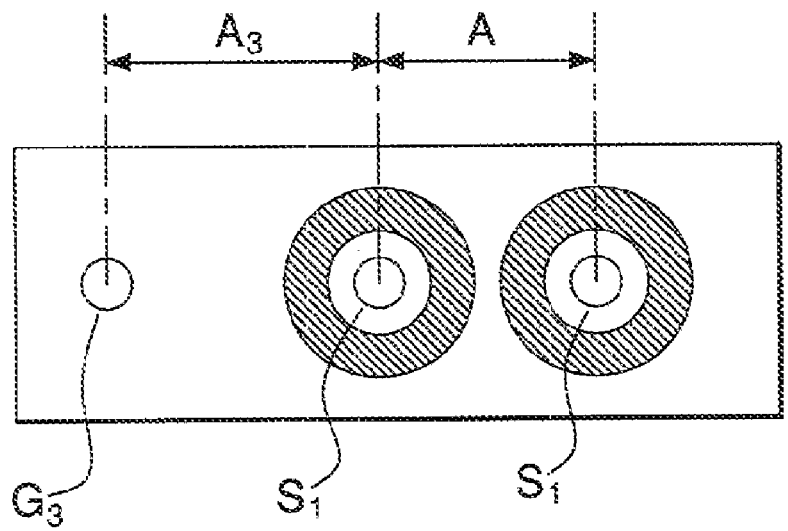

FIGS. 2A and 2B depict partial views of example embodiments of SMT connector footprints in accordance with an aspect of the invention. The via arrangement depicted in FIG. 1 may be modified in accordance with the embodiments depicts in FIGS. 2A and 2B to increase routing density, match impedance, and improve electrical performance of the system.

FIG. 2A depicts first and second ground conductor vias $G_1$ and $G_2$ and first and second signal conductor vias $S_1$ and $S_2$ disposed in a linear arrangement, such as a column or row. The signal conductor vias $S_1$ and $S_2$ may be used for either single-ended or differential signal transmission. According to the embodiment depicted in FIG. 2A, the pitch A between the adjacent signal conductor vias $S_1$ and $S_2$ may be less than the pitch $A_1$ between the signal conductor via $S_1$ and the ground conductor via $G_1$ that is adjacent to the signal conductor via $S_1$. The pitch A between the signal conductor vias $S_1$ and $S_2$ may be less than the pitch $A_2$ between the signal conductor via $S_2$ and the ground conductor via $G_2$ that is adjacent to the signal conductor via $S_2$. The pitch $A_1$ may be the same as, or different from, the pitch $A_2$. The actual distances A, $A_1$, and $A_2$ may be chosen to achieve a desired routing density and/or to optimize signal transmission performance through better impedance-matching and cross-talk reduction.

FIG. 2B depicts first and second signal conductor vias $S_1$, $S_2$ and a single ground conductor via $G_3$ disposed in a linear arrangement, such as a column or row. The signal conductor vias $S_1$, $S_2$ may be used for either single-ended or differential signal transmission. According to the embodiment depicted in FIG. 2B, the pitch A between the adjacent signal conductor vias $S_1$ and $S_2$ may be less than the pitch $A_3$ between the signal conductor via $S_1$ and the ground conductor via $G_3$ that is adjacent to the signal conductor via $S_1$. The actual distances A and $A_3$ may be chosen to achieve a desired routing density, while optimizing signal transmission performance through better impedance-matching and cross-talk reduction.

Figure 3A:
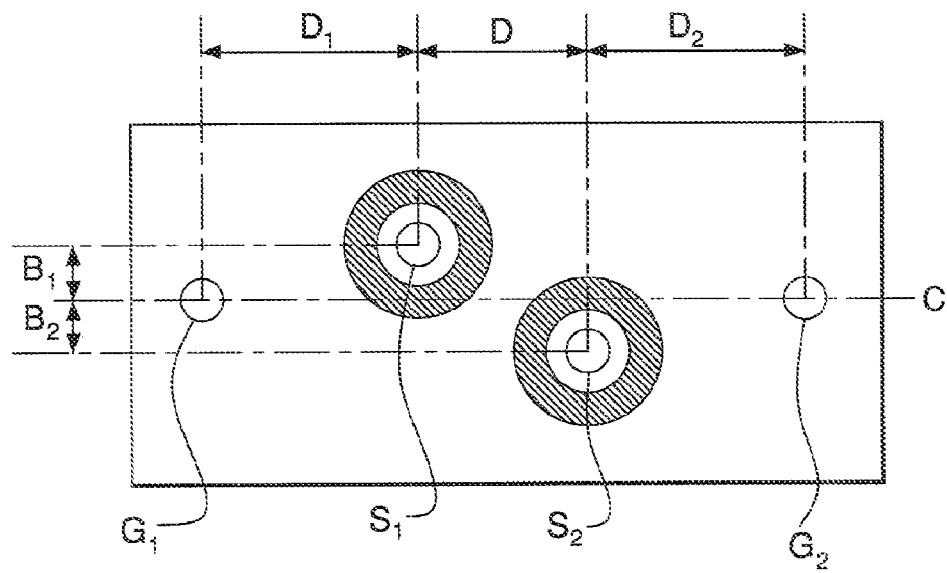
FIGS. 3A and 3B illustrate modifications that may be made to the footprint of FIG. 1 in accordance with the invention.
Figure 3B:
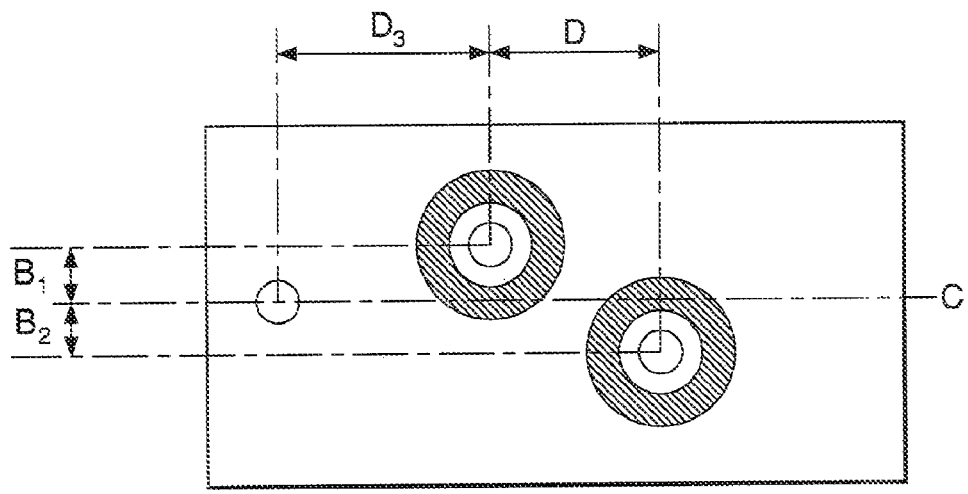

FIGS. 3A and 3B depict partial views of example embodiments of SMT connector footprints in accordance with an aspect of the invention. The via arrangement depicted in FIG. 1 may be modified in accordance with the embodiments depicted in FIGS. 3A and 3B to improve routing density and/or electrical performance of the system.

FIG. 3A depicts first and second ground conductor vias $G_1$, $G_2$ and first and second signal conductor vias $S_1$, $S_2$. The signal conductor vias $S_1$, $S_2$ may be used in either single-ended or differential signal transmission. As shown in FIG. 3A, the signal conductor vias $S_1$ and $S_2$ may be staggered relative to a centerline C along which the vias are disposed. That is, the signal conductor via $S_1$ may be offset by a distance $B_1$ from the centerline C in a first direction, and the signal conductor via $S_2$ may be offset by a distance $B_2$ from the centerline C in a second direction. The second direction may be opposite the first direction, as shown in FIG. 3A, or both signal vias may be offset from the centerline C in the same direction.

The offset $B_1$ may be the same as, or different from, the offset $B_2$. The ground conductor vias $G_1$ and $G_2$ may be located on the centerline C, as shown. Thus, the signal conductor vias $S_1$ and $S_2$ may be staggered with respect to each other in such a way as to be symmetrical with respect to the ground conductor vias $G_1$ and $G_2$ adjacent, respectively, to the signal conductor vias $S_1$ and $S_2$. The actual distances $B_1$, and $B_2$ may be chosen to achieve a desired routing density, while optimizing signal transmission performance through better impedance-matching and cross-talk reduction.

The pitch D (taken along the centerline C) between the adjacent signal conductor vias $S_1$ and $S_2$ may be less than the pitch $D_1$ between the signal conductor via $S_1$ and the ground conductor via $G_1$ that is adjacent to the signal conductor via $S_1$. The pitch D may be less than the pitch $D_2$ between the signal conductor via $S_2$ and the ground conductor via $G_2$ that is adjacent to the signal conductor via $S_2$. The pitch $D_1$ may be the same as, of different from, the pitch $D_2$. The actual distances D, $D_1$, and $D_2$ may be chosen to achieve a desired routing density, while optimizing signal transmission performance through better impedance-matching and cross-talk reduction.

FIG. 3B depicts first and second signal conductor vias $S_1$, $S_2$ and a single ground conductor via $G_3$. As shown in FIG. 3B, the signal conductor via $S_1$ may be offset by a distance $B_1$ from the centerline C in a first direction, and the signal conductor via $S_2$ may be offset by a distance $B_2$ from the centerline C in a second direction. The second direction may be opposite the first direction, as shown in FIG. 3B, or both signal vias may be offset from the centerline C in the same direction. The offset $B_1$ may be the same as, or different from, the offset $B_2$. The ground conductor via $G_3$ may be located on the centerline C, as shown.

The pitch D (taken along the centerline C) between the adjacent signal conductor vias $S_1$ and $S_2$ may be less than the pitch $D_3$ between the signal conductor via $S_1$ and the ground conductor via $G_3$ that is adjacent to the signal conductor via $S_1$. The actual distances D and $D_3$ may be chosen to achieve a desired routing density, while optimizing signal transmission performance through better impedance-matching and cross-talk reduction.

Figure 4A:
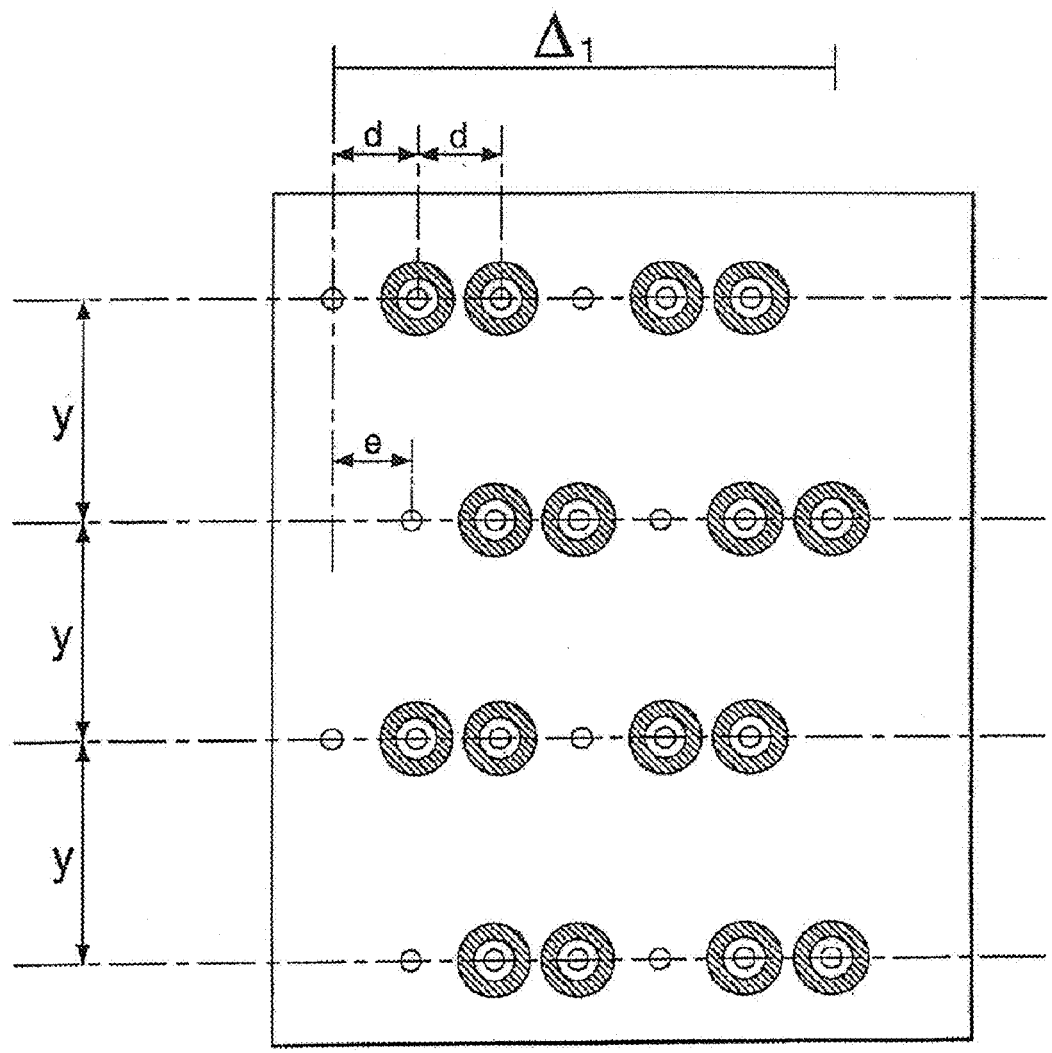
FIG. 4A depicts a partial view of an example embodiment of a prior art SMT connector footprint.

FIG. 4A depicts a via arrangement having a fixed column pitch y. That is, adjacent columns are spaced apart from one another by a distance y. Each column includes a plurality of vias arranged in a linear array in a ground-signal-signal configuration. The vias may be equally spaced from one another. That is, each ground via may be spaced apart from its adjacent signal via by a distance d, and adjacent signal vias may also be spaced apart from one another by a distance d. As shown, adjacent columns may be staggered relative to one another. That is, a column may be offset from an adjacent column by a distance e. As shown, the offset distance e may be the same as the distance d (i.e., one row pitch). It should be understood, however, that the offset may more or less than one row pitch (i.e., the offset distance e need not be the same as the distance d).

Figure 4B:
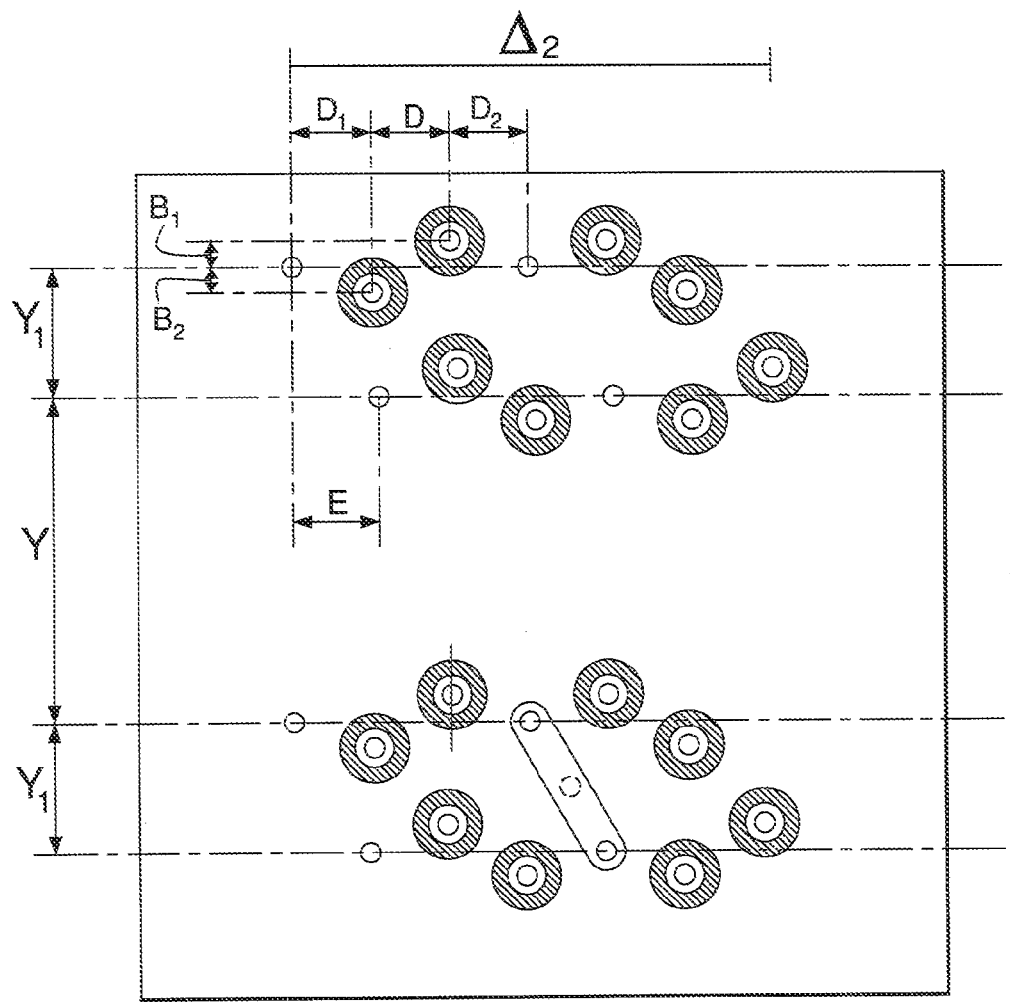
FIGS. 4B-4D depict partial views of example embodiments of SMT connector footprints in accordance with of the invention to show optimization of column pitch and distance between vias of adjacent rows, and the rotation of the vias within and between columns.

FIG. 4B illustrates optimization of column pitch distance and distance between vias of adjacent rows. It should be understood that the methodologies of the invention may be useful for optimizing signal integrity and routing density, even if neither is always maximized.

By comparison of the via arrangement depicted in FIG. 4B with the via arrangement depicted in FIG. 4A, it may be seen that the signal conductor vias may be moved relative to one another along the centerlines (as described above in connection with FIGS. 2A and 2B, for example). Moving the vias nearer to one another provides for increased routing density between adjacent rows. The values of $D_1$, $D_2$, and D, which may be chosen to optimize routing density between rows, may be the same or different from one another. The signal conductor vias may also be offset from their respective centerlines (as described above in connection with FIGS. 3A and 3B, for example). The values of $B_{1\ and\ B2}$, which may be chosen to achieve a desired limit on cross-talk, may be the same or different from one another.

Adjacent columns may be moved closer together. That is, the distance Y between column centerlines as depicted in FIG. 4B may be greater than the distance y between column centerlines as depicted in FIG. 4A. This provides for an increase in routing density between adjacent columns by widening the routing channels that exist to the left and right (as shown in FIG. 4B) of the via arrangement. That is, the distance $\Delta_1$ shown in FIG. 4A may be greater than the distance $\Delta_2$ shown in FIG. 4B. The values of Y and $Y_1$, as well as the amount of offset E between adjacent columns, may be chosen to balance the impedance, cross-talk, and routing density requirements of the system. As depicted in FIG. 4B, two adjacent ground vias, such as the circumscribed ground vias, for example, may be replaced by a single ground via (shown in dashed line) located between (e.g., at the midpoint between) the adjacent ground vias.

Figure 4C:
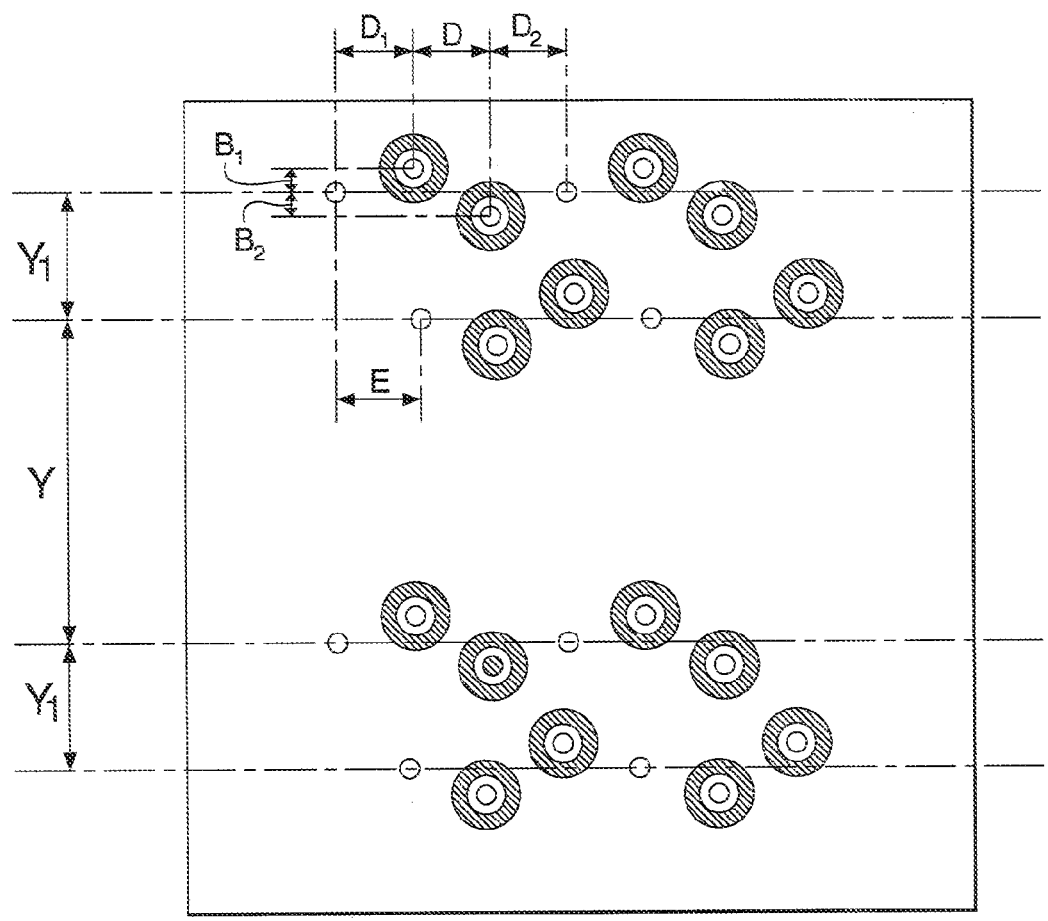
Figure 4D:
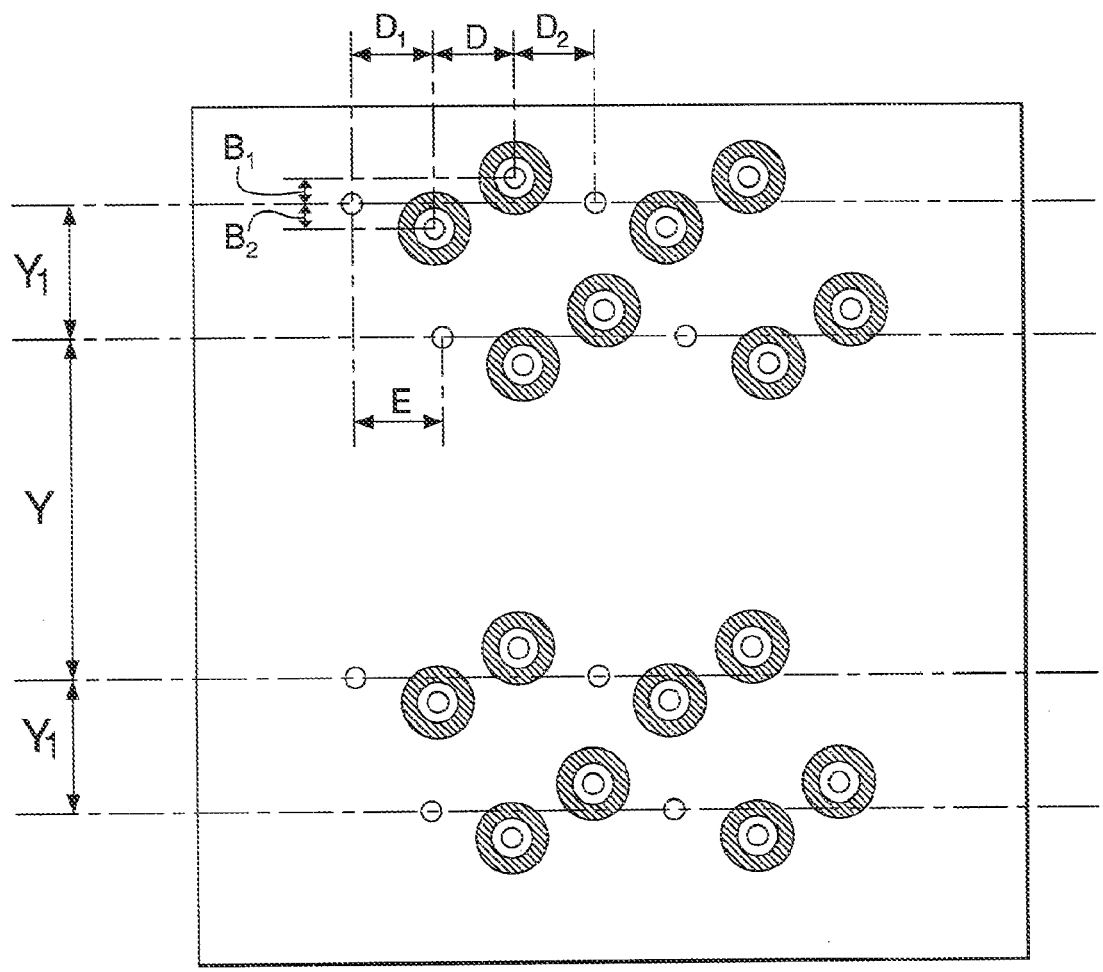

FIGS. 4C and 4D illustrate rotation of vias within and between columns. As shown in FIG. 4C, each signal conductor via may be offset from its respective centerline in a direction opposite the direction it is offset in the arrangement depicted in FIG. 4B. Put another way, each signal pair may be rotated 90° around its centerpoint, as compared with the arrangement depicted in FIG. 4B. FIG. 4D depicts an arrangement wherein only some of the pairs have been rotated relative to the arrangement depicts in FIG. 4B. The arrangement of ground vias is the same as the arrangement of ground vias depicted in FIGS. 4A and 4B.

Figure 5A:
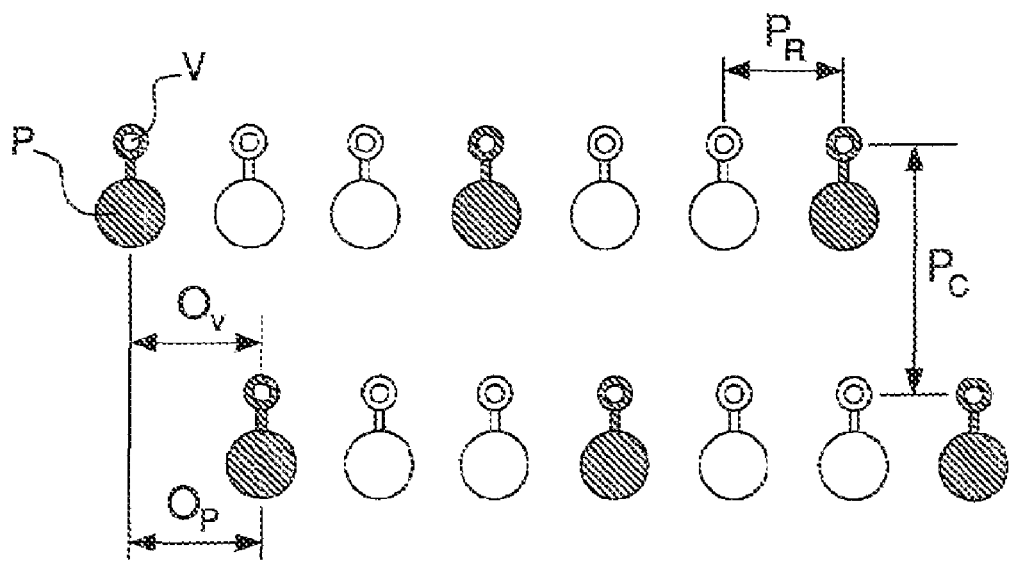
FIGS. 5A and 5B depict an example connector footprint.
Figure 5B:
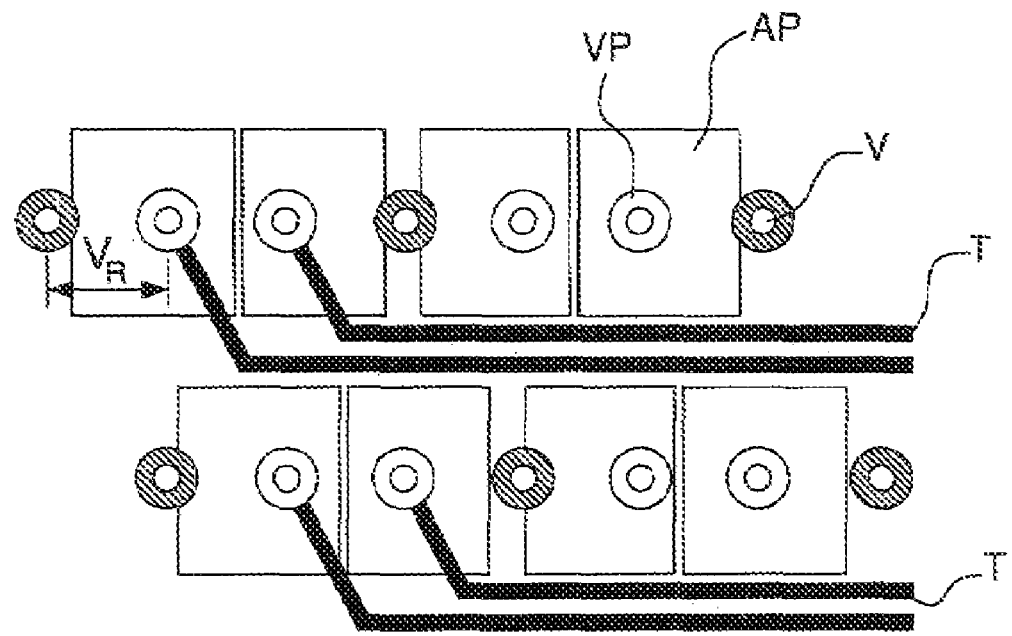

FIGS. 5A and 5B depict an example connector footprint. FIG. 5A depicts a top-layer configuration including two columns of vias V and pads P in a dog-bone configuration. As shown, the row pitch $P_{VR}$ of the via arrangement is the same as the row pitch $P_R$ of the SMT pad arrangement. The column pitch $P_{VC}$ of the via arrangement is the same as the column pitch $P_C$ of the SMT pad arrangement. The offset $O_{VC}$ between adjacent columns of vias is the same as the offset $O_C$ between adjacent columns of SMT pads. The column pitch $P_C$ might be about 2 mm in such a footprint. Thus, the via arrangement is the same as the pad arrangement. FIG. 5B depicts the arrangement of vias V on an inner layer, including an example arrangement of via anti-pads AP. As shown in FIG. 5B, one pair of traces T may be routed along the routing channel between adjacent columns. Via anti-pads would be disposed on a ground layer, and not on the same layer(s) as the traces.

Figure 6A:
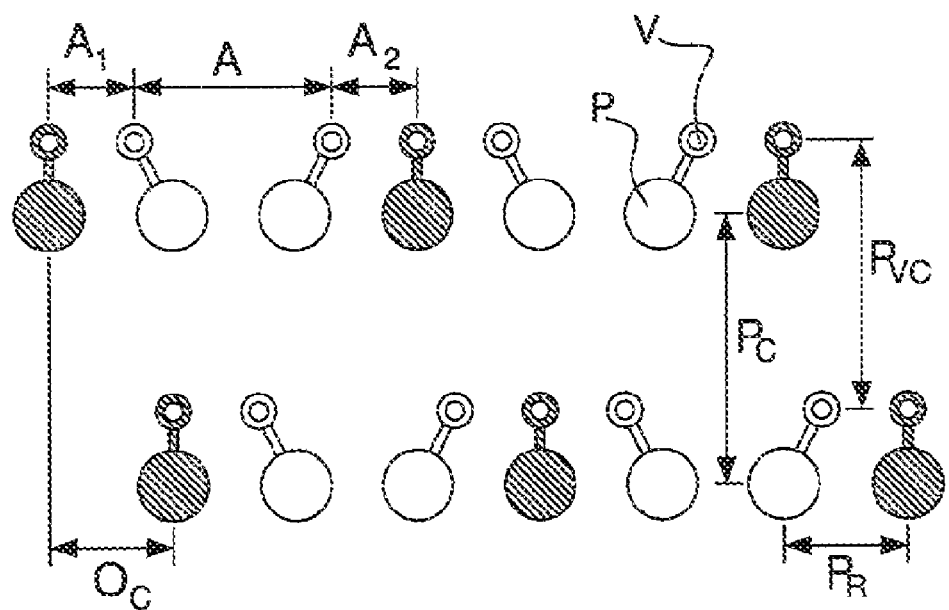
FIGS. 6A and 6B depict a footprint wherein the via arrangement depicted in FIGS. 5A and 5B has been altered within a column.
Figure 6B:
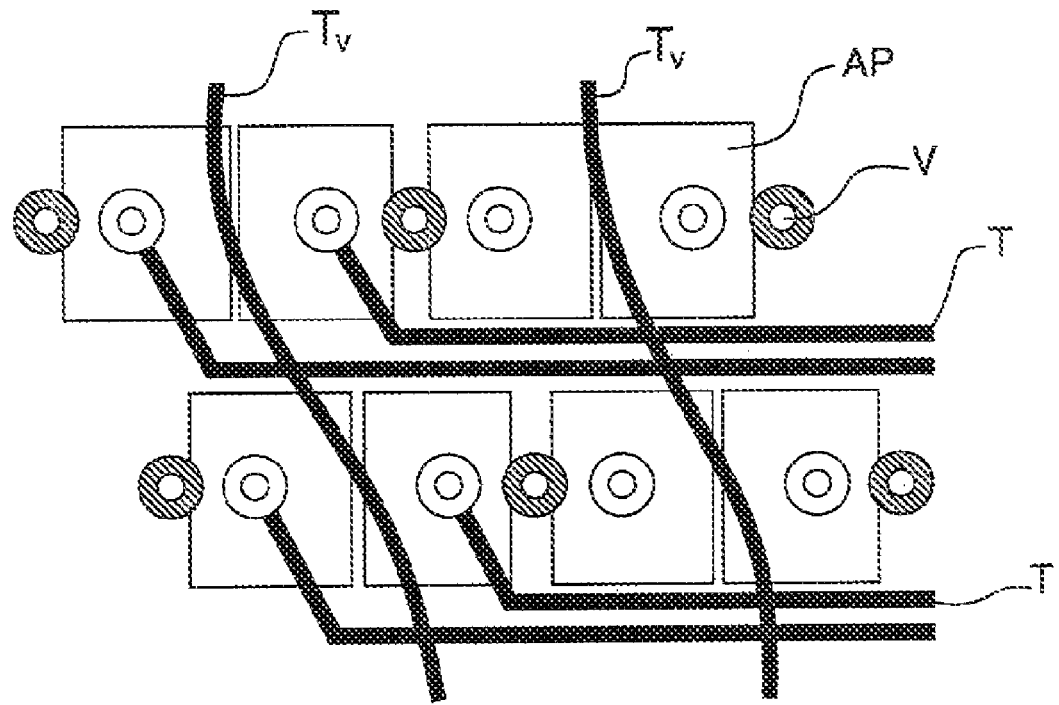

FIGS. 6A and 6B depict a footprint wherein a via arrangement such as depicted in FIGS. 5A and 5B has been altered within a column in a manner such as described above in connection with FIGS. 2A and 2B. The pad arrangement depicted in FIG. 6A is the same as the pad arrangement depicted in FIG. 5A. Adjacent columns of SMT pads are offset from one another by a distance $O_C$. The via column pitch $P_{VC}$ is the same as the SMT pad column pitch $P_C$. The via arrangement has been altered, however, such that the pitch A between adjacent signal conductor vias may be greater than the pitch $A_1$, $A_2$ between a signal conductor via and an adjacent ground conductor via. It is expected that an arrangement such as depicted in FIGS. 6A and 6B, will yield a higher impedance, and, consequently, a better impedance match, than an arrangement such as depicted in FIGS. 5A and 5B, even if routing density is unchanged. Also, the distance A between adjacent vias may be larger than the pad row pitch $P_R$. Thus, routing density may be improved because one or more traces $T_V$ may be disposed between adjacent rows as shown.

Figure 7A:
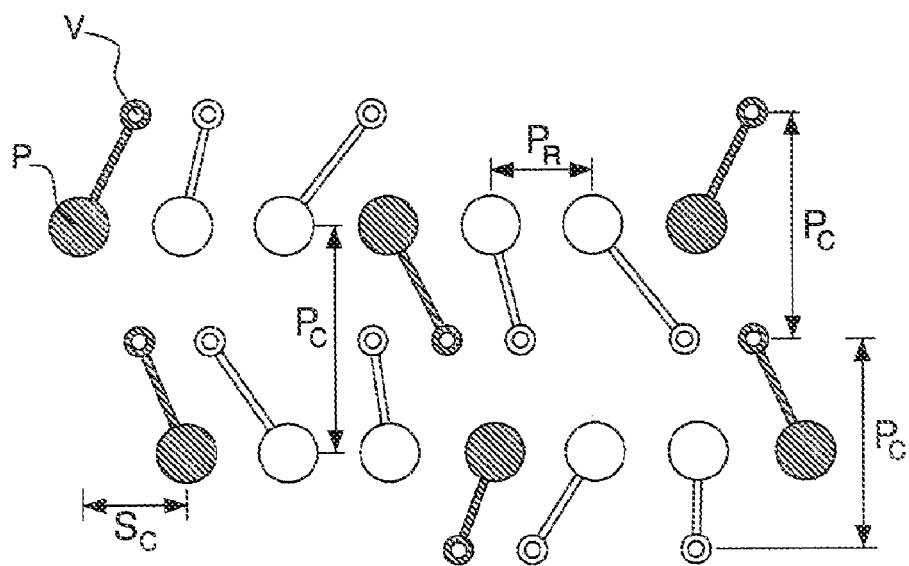
FIGS. 7A and 7B depict a footprint wherein pads from different pad columns are coupled to vias in the same via column.
Figure 7B:
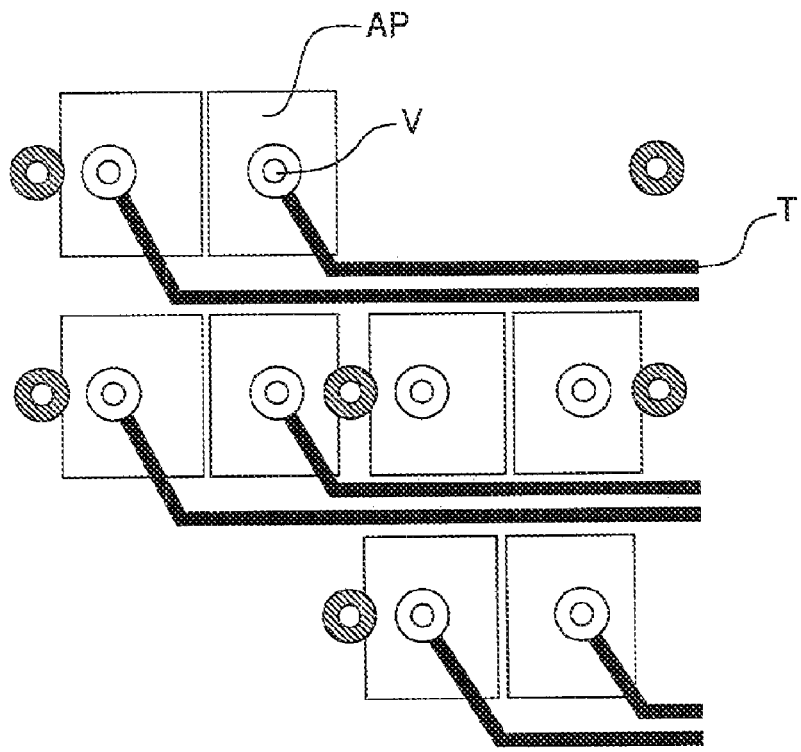

FIGS. 7A and 7B depict a footprint wherein a via arrangement such as depicted in FIGS. 5A and 5B has been altered in accordance with an aspect of the invention. The pad arrangement depicted in FIG. 7A is the same as the pad arrangement depicted in FIG. 5A. The via column pitch $P_{VC}$ is the same as the pad column pitch $P_C$. The footprint has been altered, however, such that pads P disposed in different columns are coupled to vias V disposed along a single column. For example, as shown in FIG. 7A, a pair of signal conductor pads $P_1$, $P_2$ in a first pad column (e.g., the upper pad column) may be connected to a first pair of signal conductor vias $V_1$, $V_2$ in a via column (e.g., the middle via column), while a pair of signal conductor pads $P_3$, $P_4$ in a second pad column (e.g., the lower pad column) may be connected to a second pair of signal conductor vias $V_3$, $V_4$ in the same via column.

It is expected that an arrangement such as depicted in FIGS. 7A and 7B will yield a lower cross-talk than an arrangement such as depicted in FIGS. 5A and 5B, even if routing density is unchanged. It is well understood that differential cross-talk is a function of the sum of the cross-talks among neighboring differential signal pairs. It is also well-understood that cross-talk between pairs of opposite signs may be less than cross-talk between pairs of the same sign, all other things being the same. That is, cross-talk between neighboring pairs may be less when one of the neighboring pairs is a signal transmitter pair and the other neighboring pair is a signal receiver pair. In accordance with an aspect of the invention, neighboring pairs may be chosen to minimize cross-talk by routing the pads associated with signal pairs having opposite signs to adjacent via pairs.

Figure 8A:
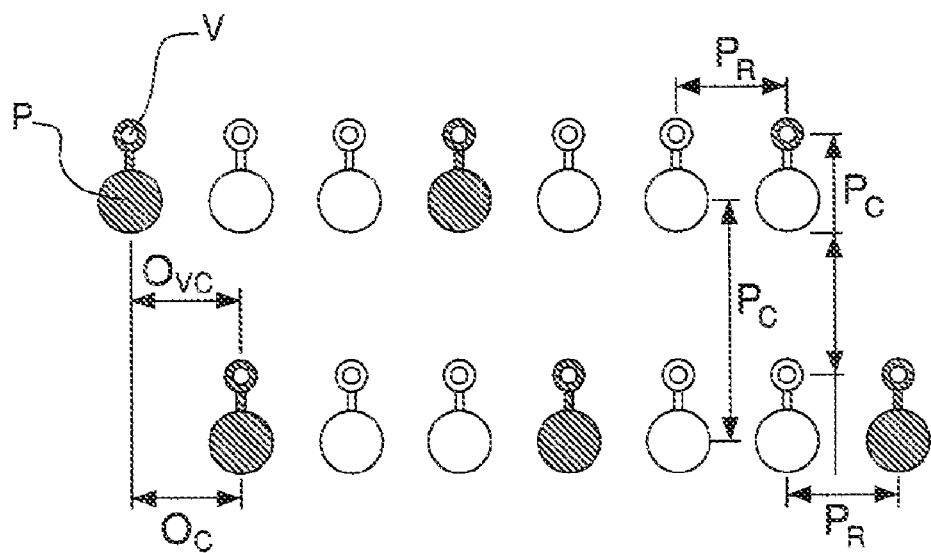
FIGS. 8A and 8B depict an example connector footprint.
Figure 8B:
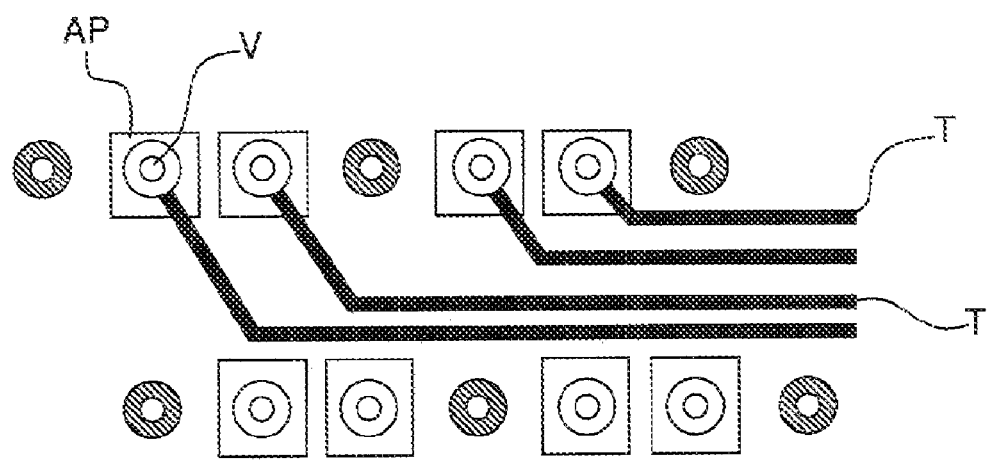

FIGS. 8A and 8B depict an example connector footprint. FIG. 8A depicts two columns of vias V and pads P in a dog-bone configuration. FIG. 8B depicts the arrangement of vias V on an inner layer, including an example arrangement of via anti-pads AP. As shown, the row pitch $P_{VR}$ of the via arrangement is the same as the row pitch $P_R$ of the SMT pad arrangement. The column pitch $P_{VC}$ of the via arrangement is the same as the column pitch $P_C$ of the SMT pad arrangement. The stagger $O_{VC}$ between adjacent columns of vias is the same as the offset $O_C$ between adjacent columns of SMT pads. Thus, the via arrangement is the same as the SMT pad arrangement. As shown in FIG. 8B, two pairs of traces T may be routed along the routing channel between adjacent columns. The column pitch $P_C$ might be about 3 mm in such a footprint.

Figure 9A:
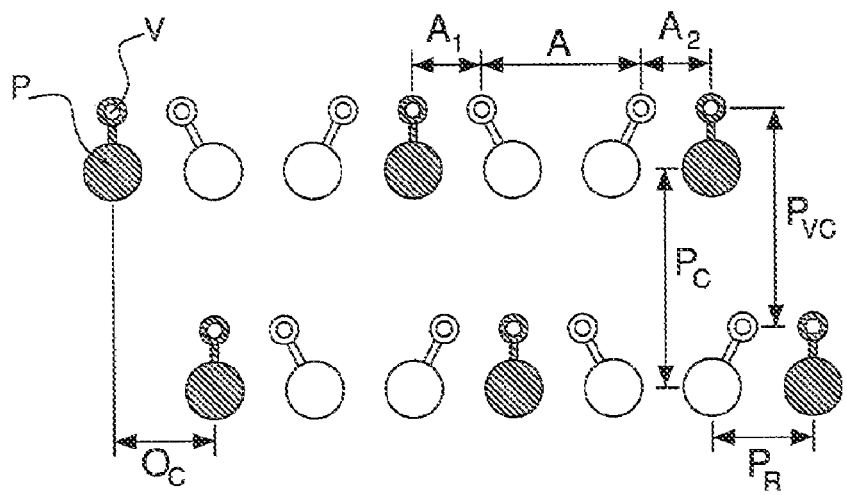
FIGS. 9A and 9B depict a footprint wherein the via arrangement depicted in FIGS. 8A and 8B has been altered within a column.
Figure 9B:
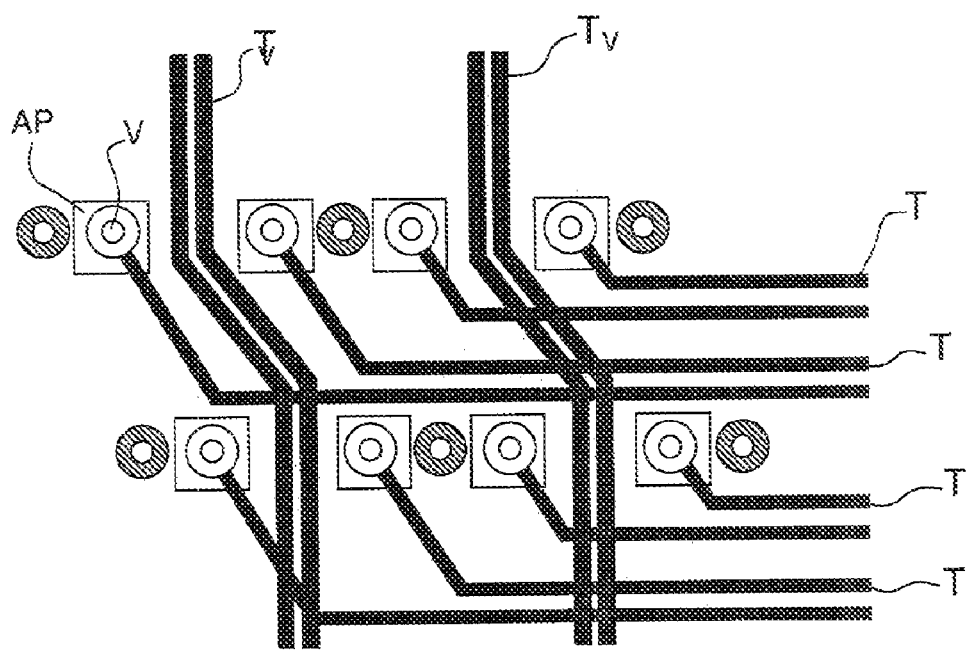

FIGS. 9A and 9B depict a footprint wherein a via arrangement such as depicted in FIGS. 8A and 8B has been altered within a column in a manner such as described above in connection with FIGS. 2A and 2B. As shown, the pitch A between adjacent signal conductor vias within a column may be greater than the pitch $A_1$, $A_2$ between a signal conductor via and an adjacent ground conductor via. Note that the anti-pads depicted in FIGS. 8B, 9B, 10B, and 11B may be smaller than the anti-pads depicted in FIGS. 5B, 6B, and 7B. It is expected that, consequently, signal integrity will not be as good using a footprint as depicted in FIGS. 9A and 9B as it would be using a footprint as depicted in FIGS. 6A and 6B. However, a pair of traces $T_V$ maybe routed along each such routing channel as shown. As described above, increasing routing density can tend to increase impedance by reducing the number of board layers. Thus, the footprint depicted in FIGS. 9A and 9B provides for a trade-off between signal integrity and impedance matching.

Figure 10A:
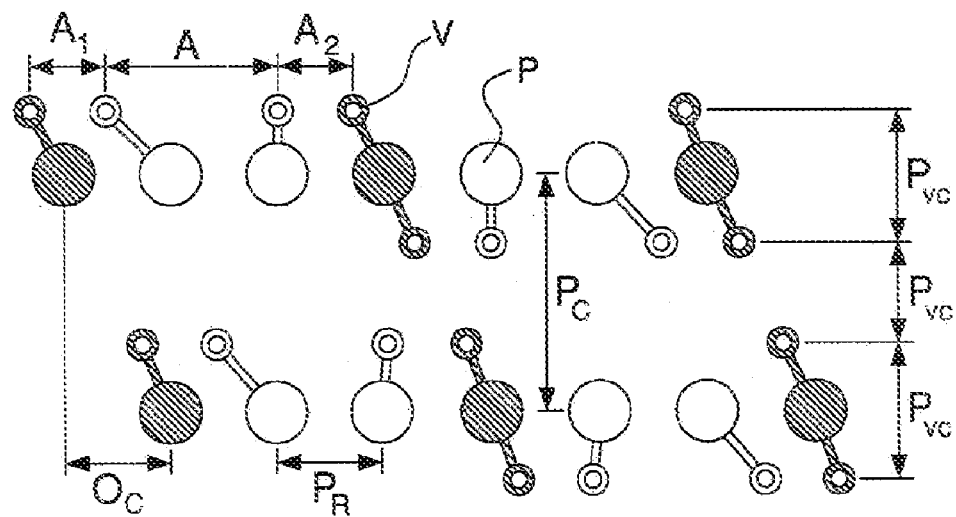
FIGS. 10A and 10B depict a footprint wherein the via arrangement depicted in FIGS. 8A and 8B has been altered to halve the via column pitch.
Figure 10B:
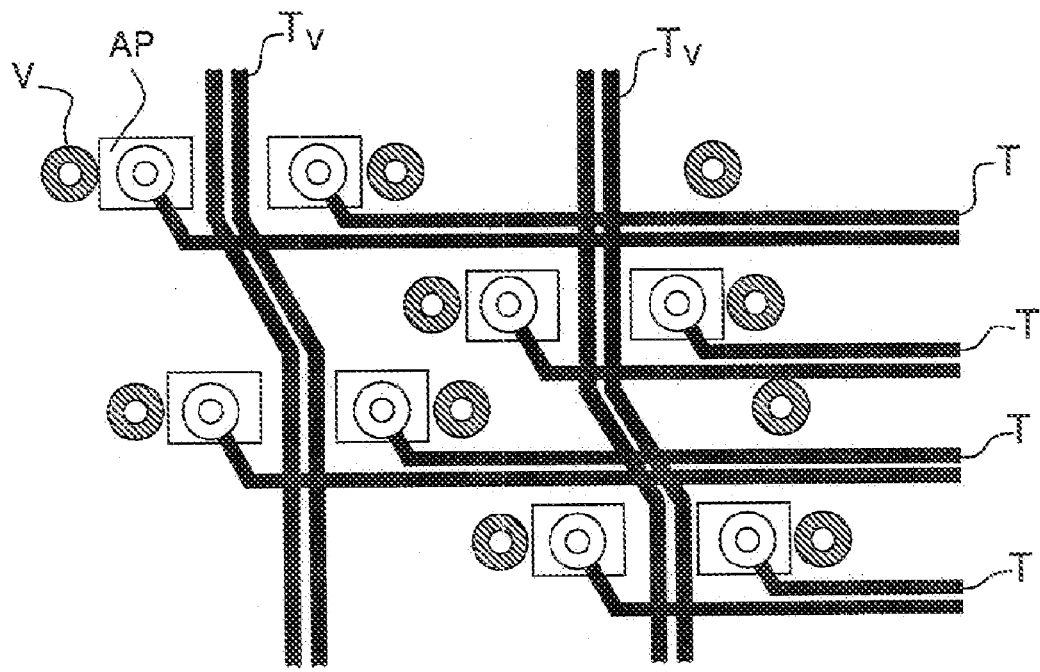

FIGS. 10A and 10B depict a footprint wherein a via arrangement such as depicted in FIGS. 9A and 9B has been further altered to halve the via column pitch. That is, the via column pitch $P_{VC}$ depicted in FIGS. 10A and 10B is about half of the via column pitch $P_{VC}$ depicted in FIGS. 9A and 9B (and, therefore, about half the SMT pad column pitch $P_C$). Consequently, the width of the routing channels between adjacent via columns is also halved. Because there are twice as many columns, however, and, consequently, twice as many routing channels, there is no decrease in routing density. By arranging the vias into four columns instead of two, however, the signal vias may be farther apart from one another, which tends to improve signal integrity.

Figure 11A:
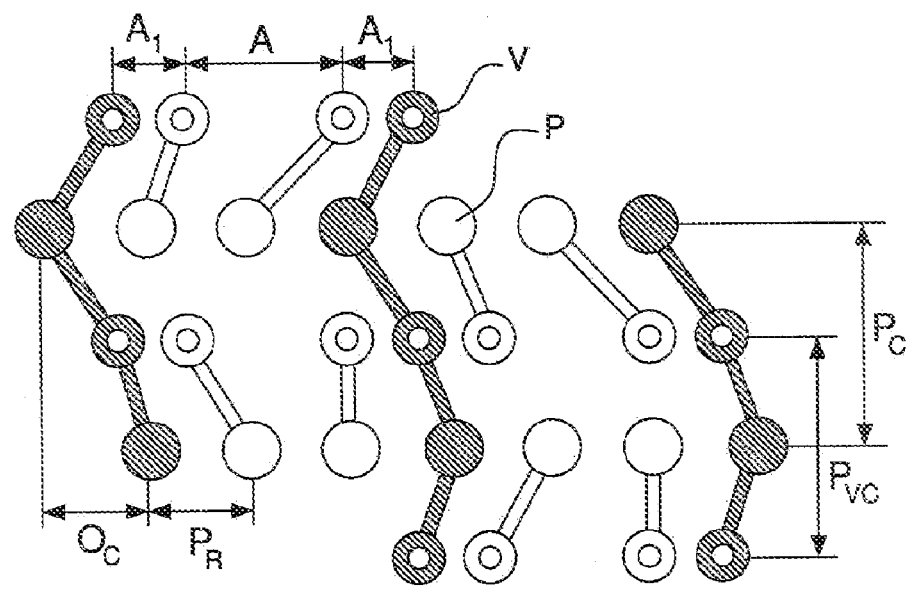
FIGS. 11A and 11B depict a footprint wherein pads from different pad columns are coupled to vias in the same via column.
Figure 11B:
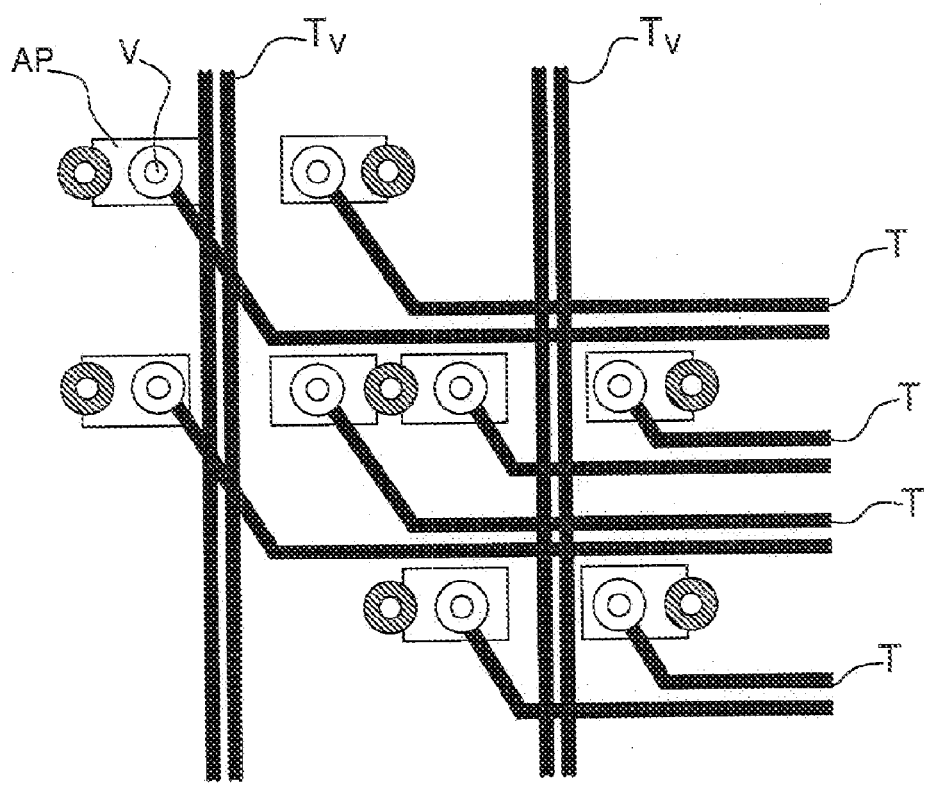

FIGS. 11A and 11B depict a footprint wherein a via arrangement such as depicted in FIGS. 8A and 8B has been altered in a manner such as described above in connection with FIGS. 2A and 2B and such that pads disposed in different columns are coupled to vias disposed along a single via column. The pad arrangement depicted in FIGS. 11A and 11B is the same as the pad arrangement depicted in FIGS. 8A and 8B. The via column pitch $P_{VC}$ depicted in FIGS. 11A and 11B is the same as the via column pitch $P_{VC}$ depicted in FIGS. 8A and 8B.

As shown in FIG. 11A, however, the pitch A between adjacent signal conductor vias within a column may be greater than the pitch $A_1$, $A_2$ between a signal conductor via and an adjacent ground conductor via. Further, a pair of signal conductor SMT pads P in a first pad column (e.g., the upper pad column shown in FIG. 11A) may be connected to a first pair of signal conductor vias V in a via column (e.g., the middle via column), while a pair of signal conductor SMT pads P in a second pad column (e.g., the lower pad column) may be connected to a second pair of signal conductor vias V in the via column. As described above in connection with FIGS. 7A and 7B, it is expected that an arrangement such as depicted in FIGS. 11A and 11B will yield a lower cross-talk than an arrangement such as depicted in FIGS. 8A and 8B, even if routing density is unchanged. Note that in the footprint depicted in FIGS. 11A and 11B, the routing channels between rows provide for relatively straight traces $T_V$, rather than serpentine traces as depicted in FIGS. 9A and 9B.

Figure 12A:
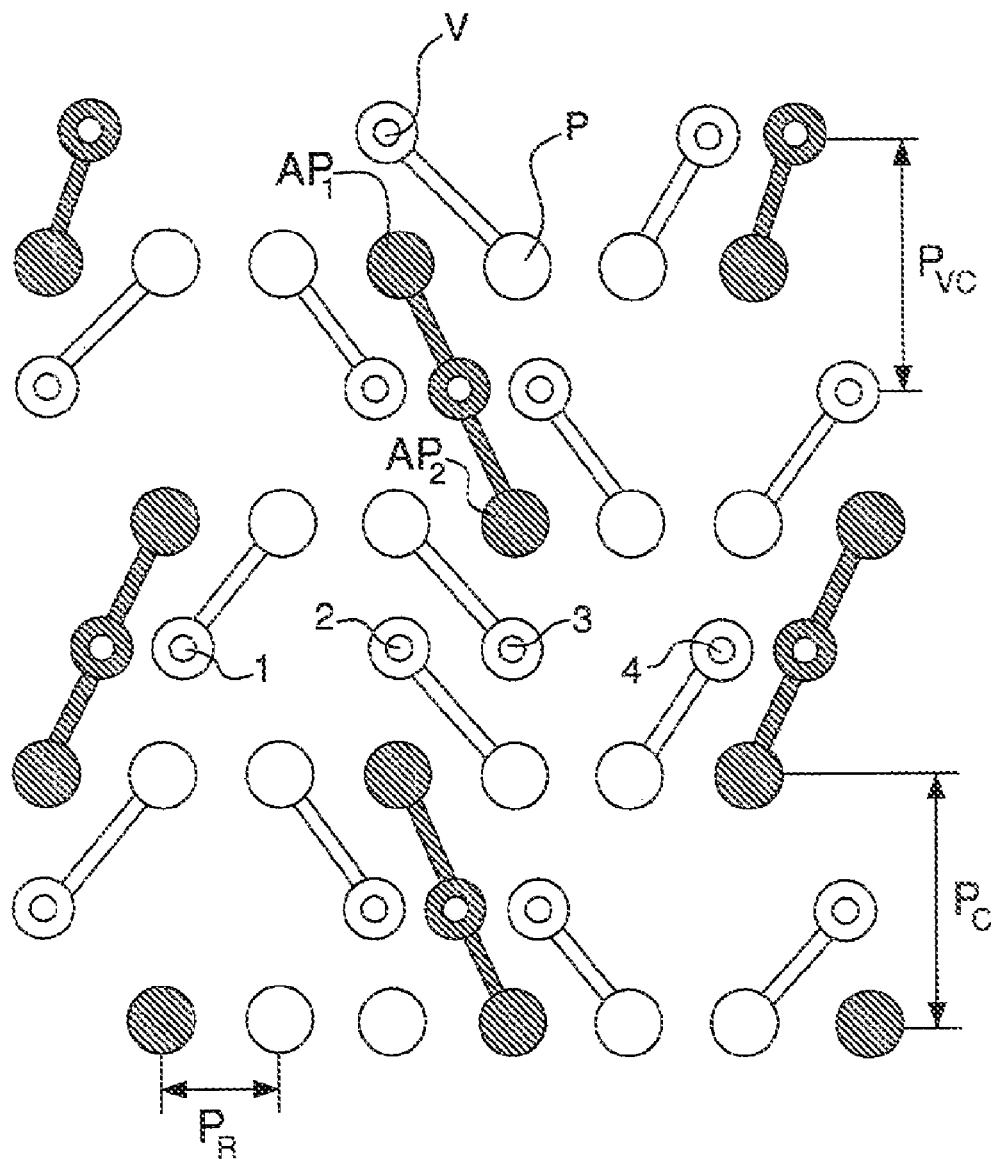
FIGS. 12A and 12B depict a footprint that provides for double-density routing with split signal pairs.
Figure 12B:
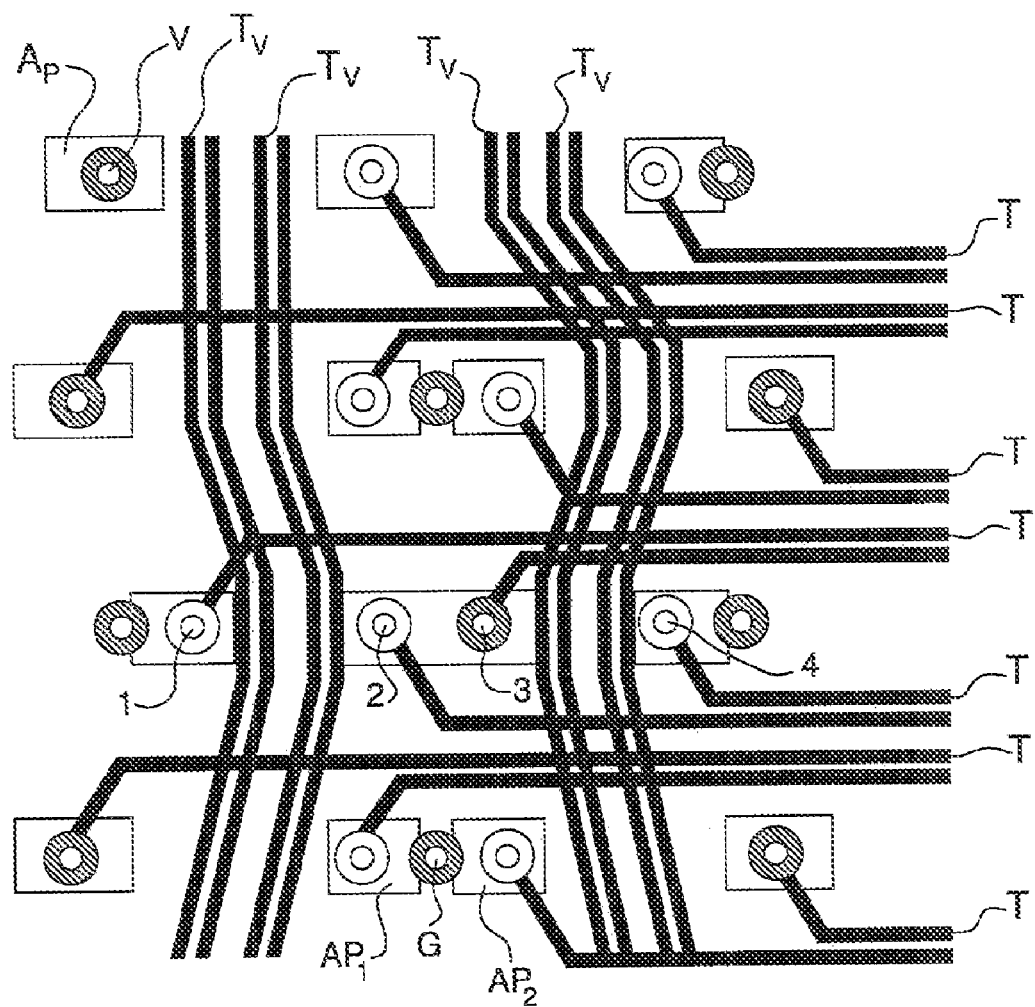

FIGS. 12A and 12B depict a footprint wherein a via arrangement such as depicted in FIGS. 8A and 8B has been altered to provide for double-density routing between adjacent rows while maintaining double-density routing between adjacent columns (e.g., four pairs rather than two). The pad arrangement depicted in FIG. 12A is the same as the pad arrangement depicted in FIG. 8A, though four columns of pads are depicted in FIG. 12A. As most clearly seen in FIG. 12B, signal pairs may be split. For example, signal conductors 1 and 3 may form a first pair, while signal conductors 2 and 4 form a second pair. In other words, the vias may be arranged such that adjacent signal conductor vias are associated with different differential signal pairs. For example, the vias may be arranged as shown such that via 2 is located between vias 1 and 3. Thus, the differential signal pair formed by signal conductor vias 1 and 3 may be "split." It should be understood that increasing the distance between the conductors that form a pair increases impedance.

Additionally, as described above, adjacent vias may be separated from one another by a distance that allows for routing of traces between the vias that form the pairs. As shown, two pairs of traces may be routed between the vias that form the pairs. The arrangement also permits two ground pads, e.g., $AP_1$ and $AP_2$, to be coupled to the same ground via G. Thus, a number of ground vias may be eliminated.

The via arrangement may be altered to achieve an acceptable level of differential cross-talk. As is well-known, differential cross-talk within a column is a function of the sum of individual cross-talks. For example, for the third column from the top in the arrangement depicted in FIG. 12B, differential cross-talk may be computed by summing the individual cross-talks between signal conductors 1 and 2, 2 and 3, 3 and 4, and 1 and 4. The via arrangement may be altered, e.g., the vias may be moved around relative to one another, until the sum of all the individual cross-talks is near-zero (or at least below an acceptable level).

Figure 13A:
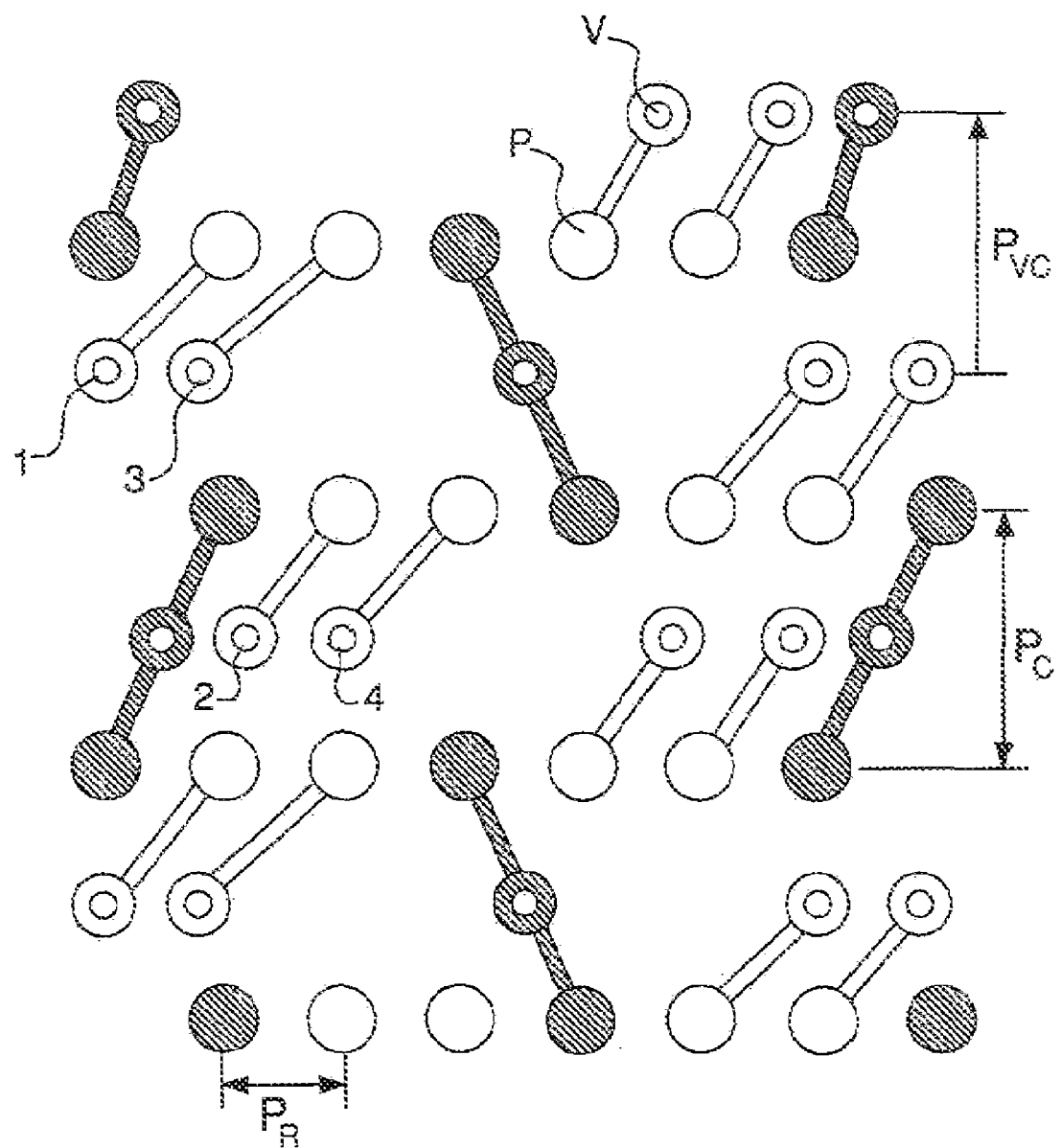
FIGS. 13A and 13B depict a footprint that provides for double-density routing without split signal pairs.
Figure 13B:
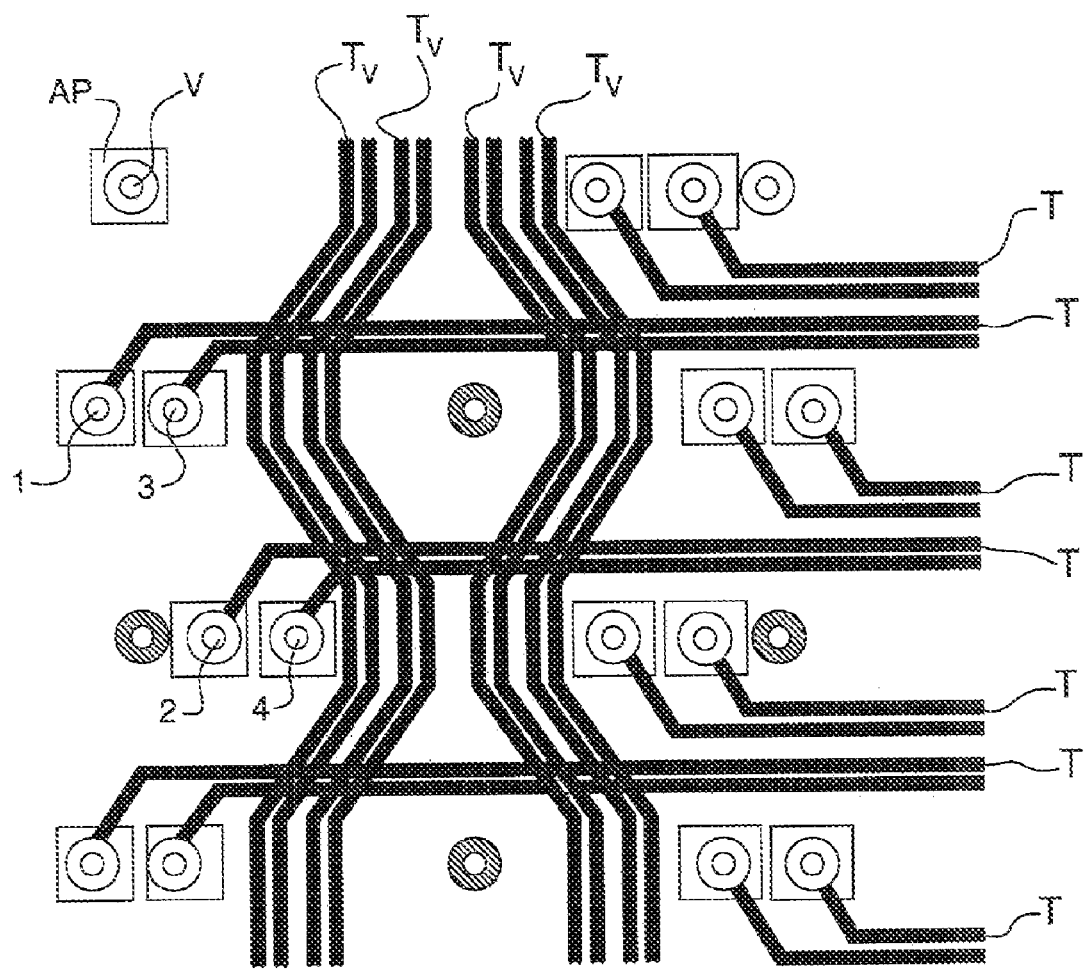

FIGS. 13A and 13B depict another footprint that provides for double-density routing without split signal pairs. The pad arrangement depicted in FIG. 13A is the same as the pad arrangement depicted in FIG. 12A. FIGS. 13A and 13B illustrate that the principle applied within a column as described in connection with the arrangement depicted in FIGS. 12A and 12B, can be applied between columns. That is, the vias may be moved around relative to one another until the differential cross-talk is below an acceptable level.

As shown in FIG. 13B, neighboring signal pairs 3,4 and 5,6 are separated from one another, but the signal pairs are not split (that is, each signal conductor is adjacent to the other signal conductor with which it forms a pair). Thus, adjacent via pairs may be separated from one another by a distance that allows for routing between them. As shown, four pairs of traces may be routed between via pairs 3,4 and 5,6.

Differential cross-talk between pairs may be computed by summing the individual cross-talks between the signal conductors. For example, differential cross-talk between pairs 1,2 and 3,4 may be computed by summing the individual cross-talks between signal conductors 1 and 3, 2 and 3, 2 and 4, and 1 and 4. The vias may be moved around until the differential cross-talk is below an acceptable level.

Figure 14A:
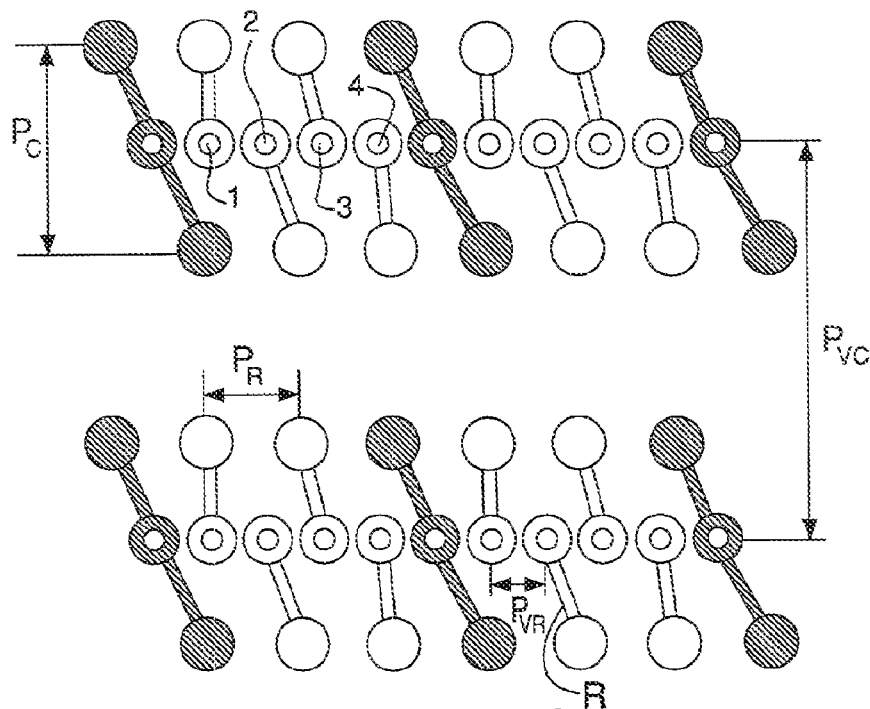
FIGS. 14A and 14B depict a footprint wherein two columns of pads are coupled to a single column of vias.
Figure 14B:
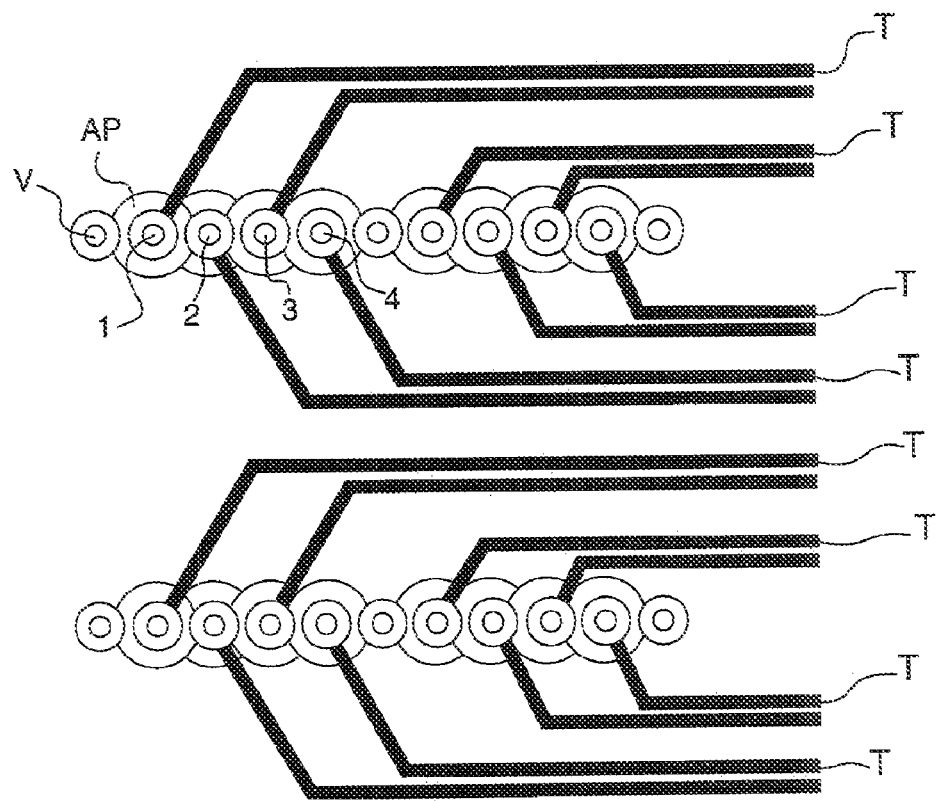

FIGS. 14A and 14B depict a footprint wherein two columns of pads are coupled to one column of vias. As shown, the via column pitch $P_{VC}$ may be twice the pad column pitch $P_C$. Thus, in an inner layer of the board, the routing channel between adjacent via columns may be twice as wide, though there may be only half as many such routing channels. As shown, four pairs may be routed in one channel, rather than two pairs in each of two channels. The via row pitch $P_{VR}$ may be half the pad row pitch $P_R$. Signal pairs may be split, however, to improve signal integrity. That is, adjacent signal conductor vias in a via column may belong to different signal pairs. For example, signal conductor visas 1 and 3 may form a first pair, and signal conductor vias 2 and 4 may form a second pair. As shown, two signal pairs may be disposed adjacent to one another without an intervening ground. A number of ground vias may be eliminated, as two grounds pads may be coupled to a single ground via.

Figure 15A:
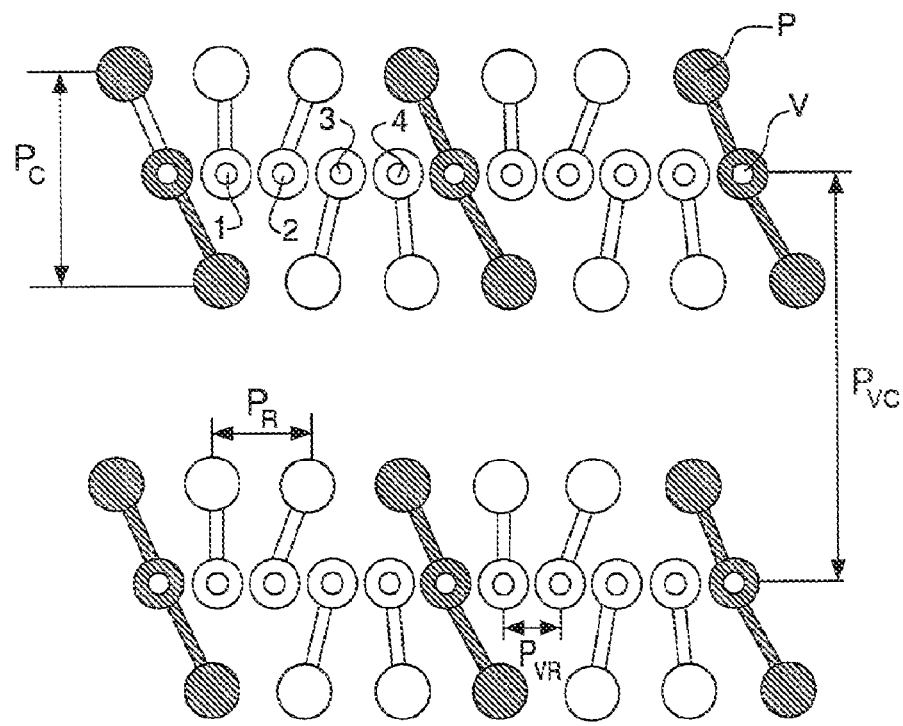
FIGS. 15A and 15B depict a footprint wherein two columns of pads are coupled to a single column of vias without split signal pairs.
Figure 15B:
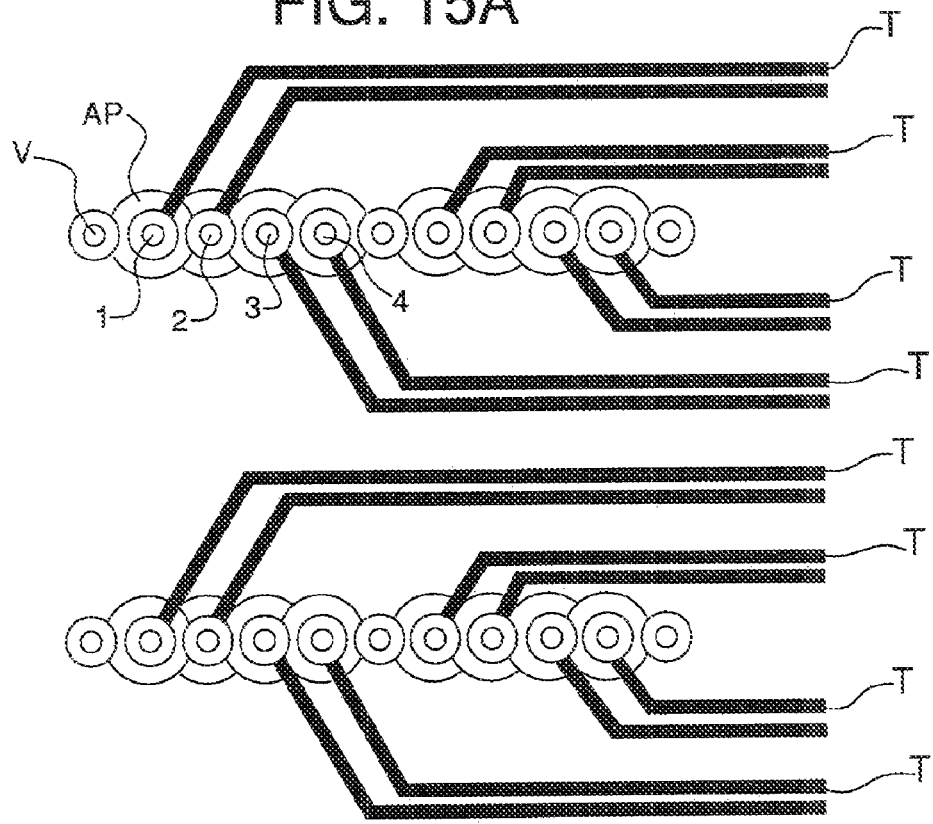

FIGS. 15A and 15B depict a footprint wherein two columns of pads are coupled to one column of vias, without split signal pairs. As shown, the via column pitch $P_{VC}$ may be twice the pad column pitch $P_C$. Thus, the routing channel between adjacent via columns may be twice as wide, though there may be only half as many such routing channels. As shown, four pairs may be routed in one channel, rather than two pairs in each of two channels. A number of ground vias may be eliminated, as two grounds pads may be coupled to a single ground via. The via row pitch $P_{VR}$ may be twice the pad row pitch $P_R$. Signal pairs may be interleaved along a row. That is, adjacent signal conductors may belong to the same pair (e.g., vias 1 and 2 may form a first pair; vias 3 and 4 may form a second pair), and two signal pairs (e.g., 1,2 and 3,4) may be disposed adjacent to one another without an intervening ground.

Figure 16A:
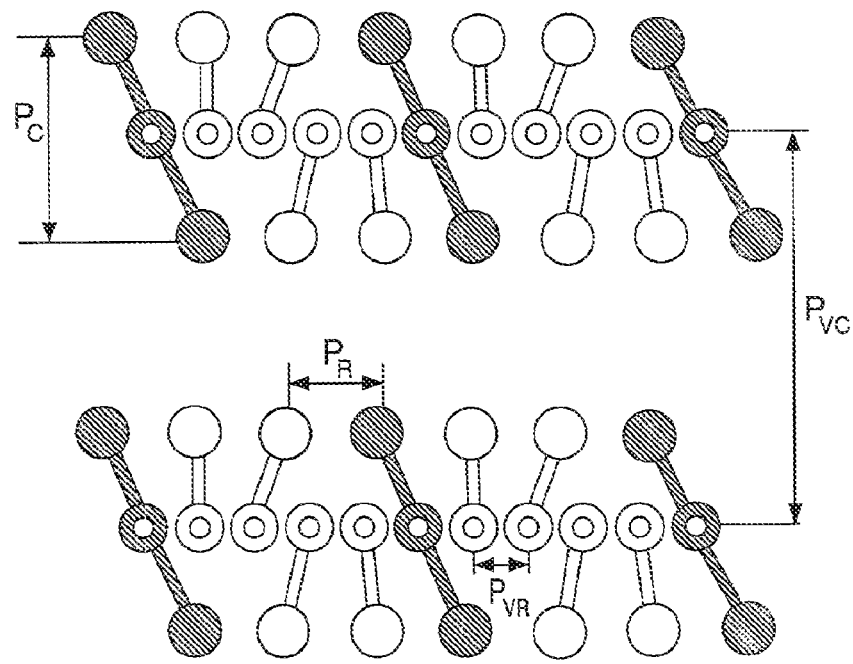
FIGS. 16A and 16B depict a footprint that provides for two-and-a-half times routing density.
Figure 16B:
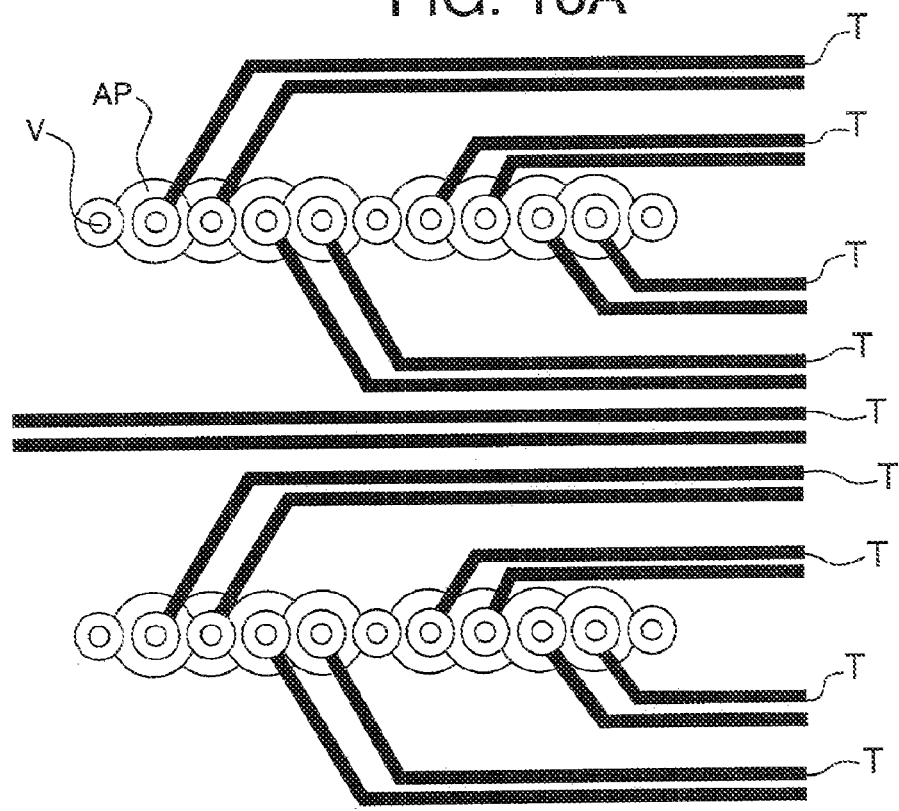

FIGS. 16A and 16B depict a footprint that provides for two-and-a-half times routing density. Though the footprint depicted in FIGS. 16A and 16B is depicted without split signal pairs, it should be understood that the signal pairs could be split. Note that the routing channels depicted in FIG. 16B are the same as the routing channels depicted in FIG. 15B. The footprint depicted in FIG. 16B differs from the footprint depicted in FIG. 15B, however, in that the traces depicted in FIG. 16B may be narrower than the traces depicted in FIG. 15B.

The use of narrower traces increases routing density within a routing channel of a given width. Wider traces are beneficial because insertion losses decrease as trace width increases. Traces may have widths in the range of about 100-300 μm, preferably in the range of about 100-200 μm.

In the example depicted in FIG. 16B, five pairs of traces may be routed between adjacent via columns. In an example conductor having four columns with five signal pairs per column, the 25% increase in routing density (i.e., an additional pair of routing traces for every four) means that only two board layers may be needed instead of three. As described above, reducing the number of board layers tends to reduce capacitance and, thereby, to increase impedance. Reducing the number of board layers may also reduce or eliminate the need for backdrilling of vias.

In accordance with the invention, any of the via arrangements depicted in FIGS. 14B, 15B, and 16B may be modified in accordance with the embodiments depicted in FIGS. 17-21 to improve routing density and electrical performance of the connector/substrate system.

Figure 17:
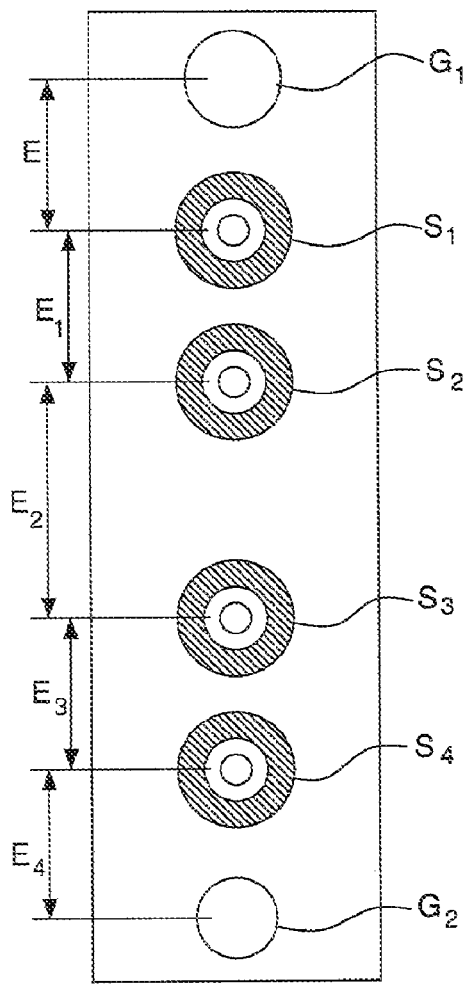
FIGS. 17-21 illustrate example modifications that may be made to via arrangements in accordance with the invention.

FIG. 17 depicts a partial view of a connector footprint that includes a first pair of signal conductor vias $S_1$ and $S_2$ and a second pair of signal conductor vias $S_3$ and $S_4$. Vias $S_1$ and $S_2$ may form a first differential signal pair and signal conductor vias $S_3$ and $S_4$ may form a second differential signal pair. As shown, the vias may be disposed in a linear arrangement.

The pitch $E_1$ between the signal conductor vias $S_1$ and $S_2$, and the pitch $E_3$ between the signal conductor vias $S_3$ and $S_4$ each may be less than the pitch $E_2$ between the signal conductor vias $S_2$ and $S_3$. Likewise the pitch E between the signal conductor via $S_1$ and the ground conductor via $G_1$, and the pitch $E_4$ between the signal conductor via $S_4$ and the ground conductor $G_2$ may be less than the pitch $E_2$. The pitches E, $E_1$, $E_3$, and $E_4$ may, in general, be the same as, or different from, one another. The actual distances E, $E_1$, $E_2$, $E_3$, and $E_4$ may be chosen to achieve a desired routing density, while optimizing signal transmission performance through better impedance-matching and cross-talk reduction.

Figure 18:
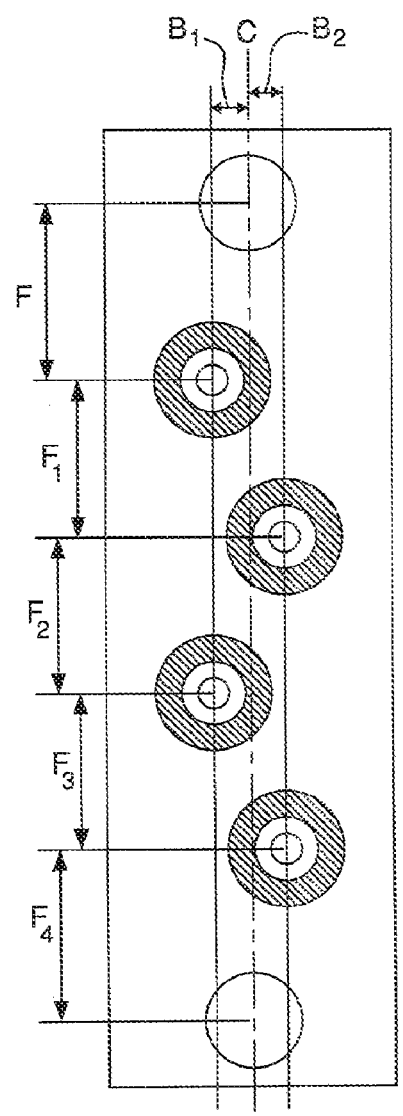

FIG. 18 depicts a partial view of an alternative embodiment of a connector footprint that includes two ground conductor vias $G_1$ and $G_2$, and four signal conductor vias $S_1$, $S_2$, $S_3$, and $S_4$. As shown in FIG. 18, the signal conductor vias $S_1$, $S_2$, $S_3$, and $S_4$ may be staggered relative to one another along the centerline C along which the vias are disposed. That is, the signal conductor vias $S_1$ and $S_3$, for example, may be offset by a distance $B_1$ from the centerline C in a first direction, and the signal conductor vias $S_2$ and $S_4$ may be offset by a distance $B_2$ from the centerline C in a direction that is opposite to the first direction. The offset $B_1$ may be the same as, or different from, the offset $B_2$. The ground conductor vias $G_1$ and $G_2$ may be located on the centerline C, as shown. Thus, the signal conductor vias $S_1$, $S_2$, $S_3$, and $S_4$ may be staggered with respect to each other in such a way as to be symmetrical with respect to the ground conductor vias $G_1$ and $G_2$ adjacent, respectively, to the signal conductor vias $S_1$ and $S_4$. The actual distances $B_1$ and $B_2$ may be chosen to achieve a desired routing density, while optimizing signal transmission performance through better impedance-matching and cross-talk reduction.

The pitches F, $F_1$, $F_2$, $F_3$, and $F_4$ may, in general, be the same as, or different from, one another. The actual distances F, $F_1$, $F_2$, $F_3$, and $F_4$ may be chosen to achieve a desired routing density, while optimizing signal transmission performance through better impedance-matching and cross-talk reduction. It is also expected that the sum of the distances F, $F_1$, $F_2$, $F_3$, and $F_4$ may be less than the sum of the distances E, $E_1$, $E_2$, $E_3$, and $E_4$ depicted in FIG. 17 to achieve the same electrical performance for the same connector lead arrangement.

Figure 19:
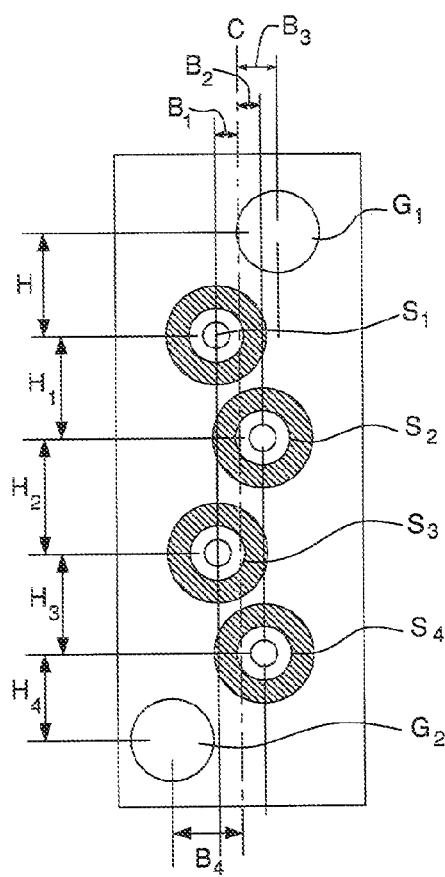

FIG. 19 depicts a partial view of an example embodiment of a connector footprint that includes two ground conductor vias $G_1$ and $G_2$, and four signal conductor vias $S_1$, $S_2$, $S_3$, and $S_4$. As shown in FIG. 19, the signal conductor vias $S_1$, $S_2$, $S_3$, and $S_4$ may be staggered relative to one another along the centerline C along which the vias are disposed. That is, the signal conductor vias $S_1$ and $S_3$, for example, may be offset by a distance $B_1$ from the centerline C in a first direction, and the signal conductor vias $S_2$ and $S_4$ may be offset by a distance $B_2$ from the centerline C in a direction that is opposite to the first direction. The offset $B_1$ may be the same as, or different from, the offset $B_2$.

The ground conductor vias $G_1$ and $G_2$ may also be offset relative to the centerline C. The ground conductor $G_1$ may be offset a distance $B_3$ from the centerline C, and may be offset in the same direction as the signal conductor vias $S_2$ and $S_4$.

The ground conductor $G_2$ may be offset a distance $B_4$ from the centerline C, and may be offset in the same direction as the signal conductor vias $S_1$ and $S_3$. In general, the offsets $B_1$, $B_2$, $B_3$, and $B_4$ may be the same as, or different from, one another. As shown, the vias may be be staggered with respect to each other in such a way as to be symmetrical with respect to the centerline C. The actual distances $B_1$, $B_2$, $B_3$, and $B_4$ may be chosen to achieve a desired routing density, while optimizing signal transmission performance through better impedance-matching and cross-talk reduction.

The pitches H, $H_1$, $H_2$, $H_3$, and $H_4$ may, in general, be the same as, or different from, one another. The actual distances H, $H_1$, $H_2$, $H_3$, and $H_4$ may be chosen to achieve a desired routing density, while optimizing signal transmission performance through better impedance-matching and cross-talk reduction. It is also expected that the sum of the distances H, $H_1$, $H_2$, $H_3$, and $H_4$ may be less than the sum of the distances F, $F_1$, $F_2$, $F_3$, and $F_4$ depicted in FIG. 19 to achieve the same electrical performance for the same connector lead arrangement.

Figure 20:
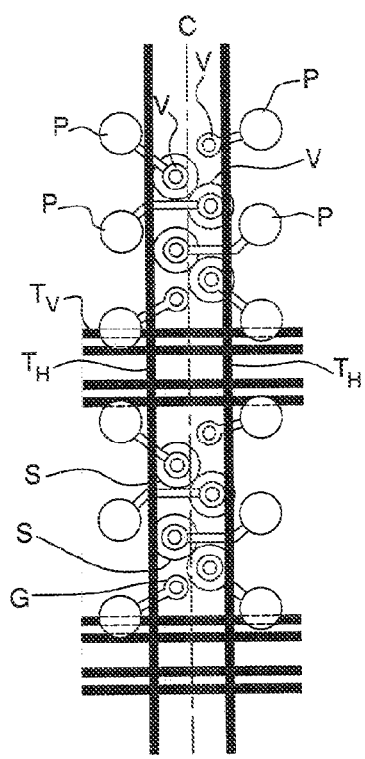

FIG. 20 depicts a partial view of a connector footprint including a plurality of pads P arranged to correspond with the arrangement of the terminal portions of the leads of an electrical connector (not shown) that is to be received by the substrate. The substrate may also include pluralities of vias V arranged into two-pair column cells. As shown, each column cell may include two pairs of signal conductor vias S, and two ground conductor vias G. Each via V is electrically connected to a respective pad P. The vias V may be offset relative to the via column centerline C, such as described in connection with FIG. 19.

As shown in FIG. 20, the spacing between adjacent column cells may be large compared to the spacing between adjacent vias or pairs within the column. Accordingly, the connector footprint depicted in FIG. 20 may improve routing density as it allows for additional traces $T_V$ to be disposed between adjacent column cells.

Figure 21:
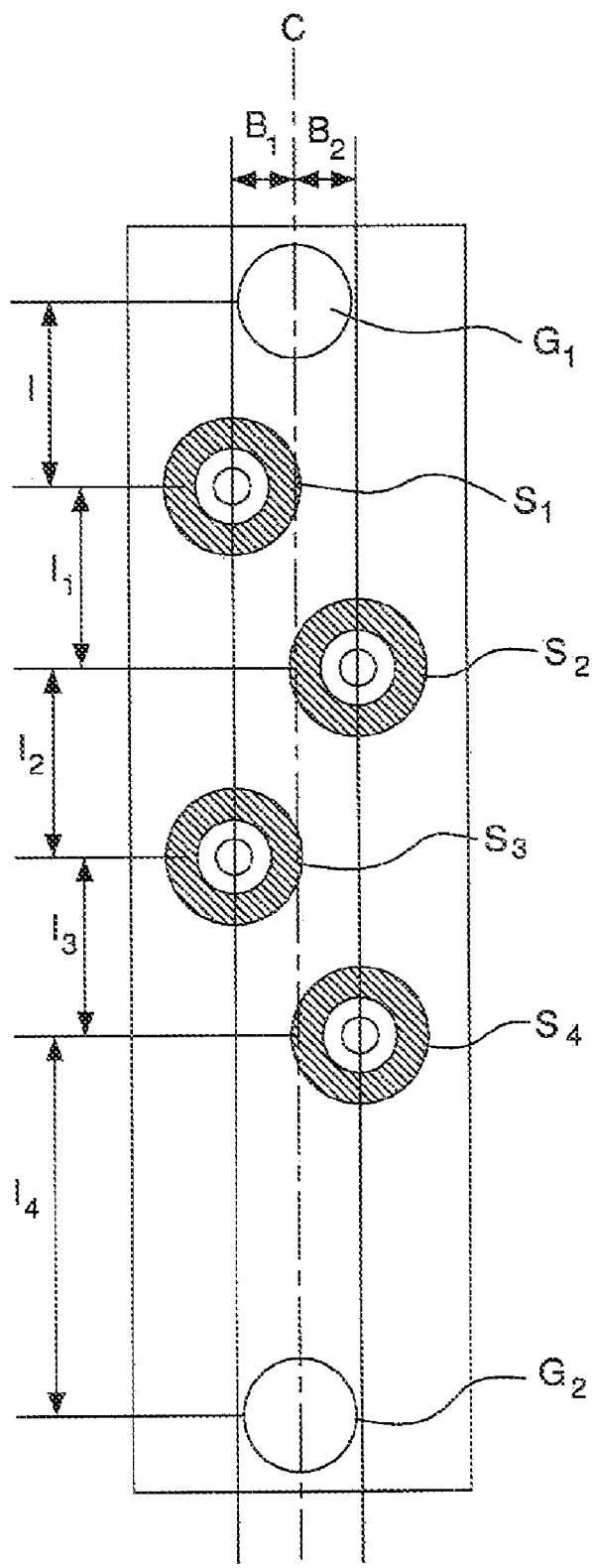

FIG. 21 depicts a partial view of an example embodiment of a connector footprint that includes two ground conductor vias $G_1$ and $G_2$, and four signal conductor vias $S_1$, $S_2$, $S_3$, and $S_4$. As shown in FIG. 21, the signal conductor vias $S_1$, $S_2$, $S_3$, and $S_4$ may be staggered relative to the centerline C along which the vias are disposed. That is, the signal conductor vias $S_1$ and $S_2$, for example, may be offset by a distance $B_1$ from the centerline C in a first direction, and the signal conductor vias $S_3$ and $S_4$ may be offset by a distance $B_2$ from the centerline C in a direction that is opposite to the first direction. The offset $B_1$ may be the same as, or different from, the offset $B_2$. The ground conductor vias $G_1$, $G_2$ may be located on the centerline C, as shown. Thus, the signal conductor vias $S_1$, $S_2$, $S_3$, and $S_4$ may be offset with respect to each other in such a way as to be symmetrical with respect to the ground conductor vias.

The pitches I, $I_1$, $I_3$, and $I_4$ may, in general, be the same as, or different from, one another. The pitch $I_4$ between the signal conductor $S_4$ and the ground conductor $G_2$ may be larger than any of the pitches I, $I_1$, $I_2$, and $I_3$. The actual distances I, $I_1$, $I_2$, $I_3$, and $I_4$ may be chosen to achieve a desired routing density, while optimizing signal transmission performance through better impedance-matching and cross-talk reduction.

Figure 22A:
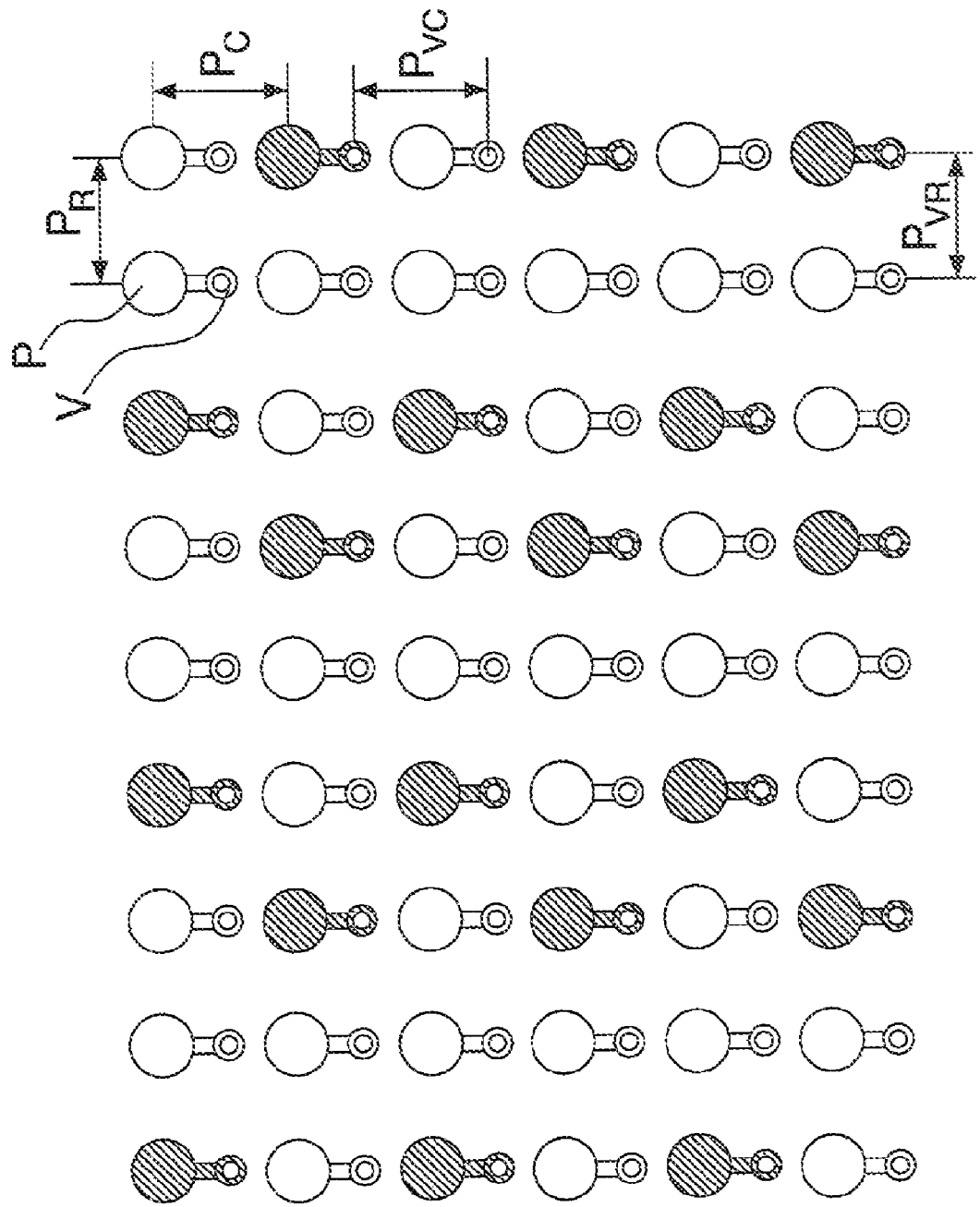

FIGS. 22A and 22B depicts a typical prior art footprint wherein the via arrangement is the same as the pad arrangement. That is, the vias V may be arranged into rows and columns, for example, just as the SMT pads P are arranged into rows and columns. Further, the row pitch $P_{VR}$ and column pitch $P_{VC}$ of the via arrangement may be the same as the row pitch $P_R$ and column pitch $P_C$ of the pad arrangement. As shown, adjacent via columns are not staggered relative to one another.

Figure 23A:
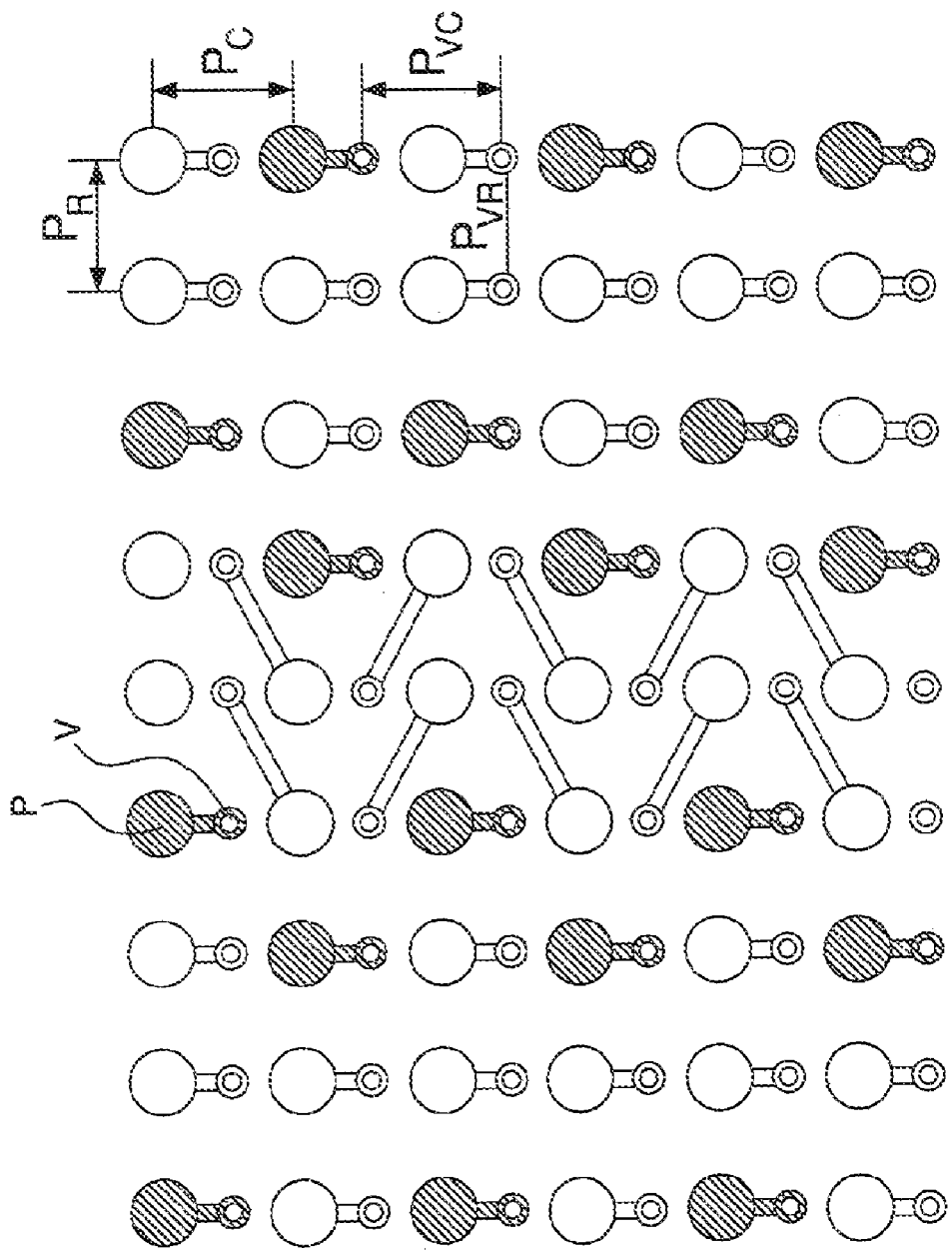
Figure 23C:
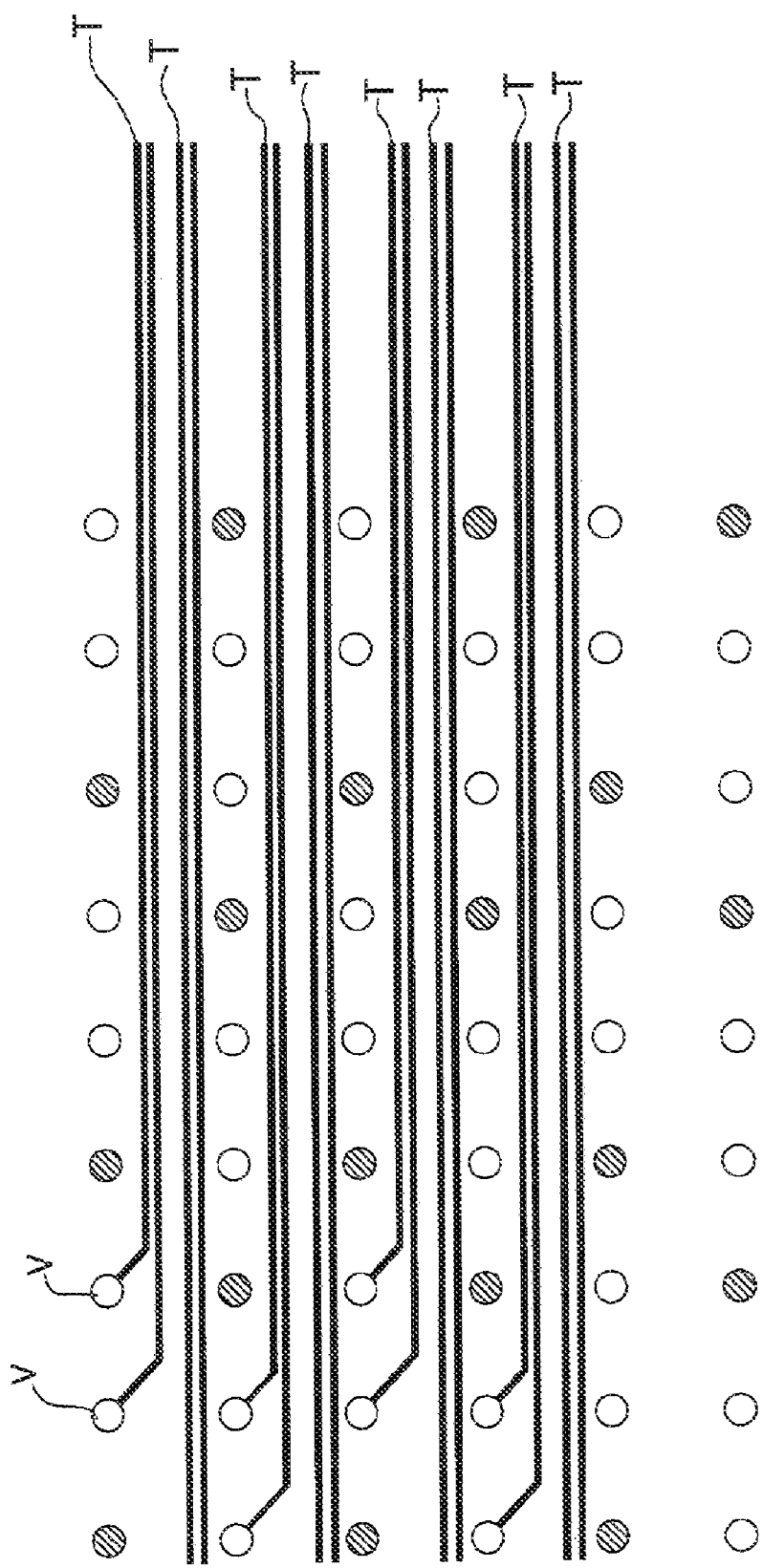

FIGS. 23A and 23B depict a footprint as depicted in FIGS. 22A and 22B, modified by redirecting certain signal pairs to different vias. As shown in FIG. 23B, the routing may be the same as that depicted in FIG. 22B, but the traces may route different signals. In the footprint depicted in FIG. 23C, traces may be made narrow enough such that two pairs of traces may be routed in the routing channel between adjacent columns, rather than only one pair as depicted in FIGS. 22B and 23B.

Figure 24A:
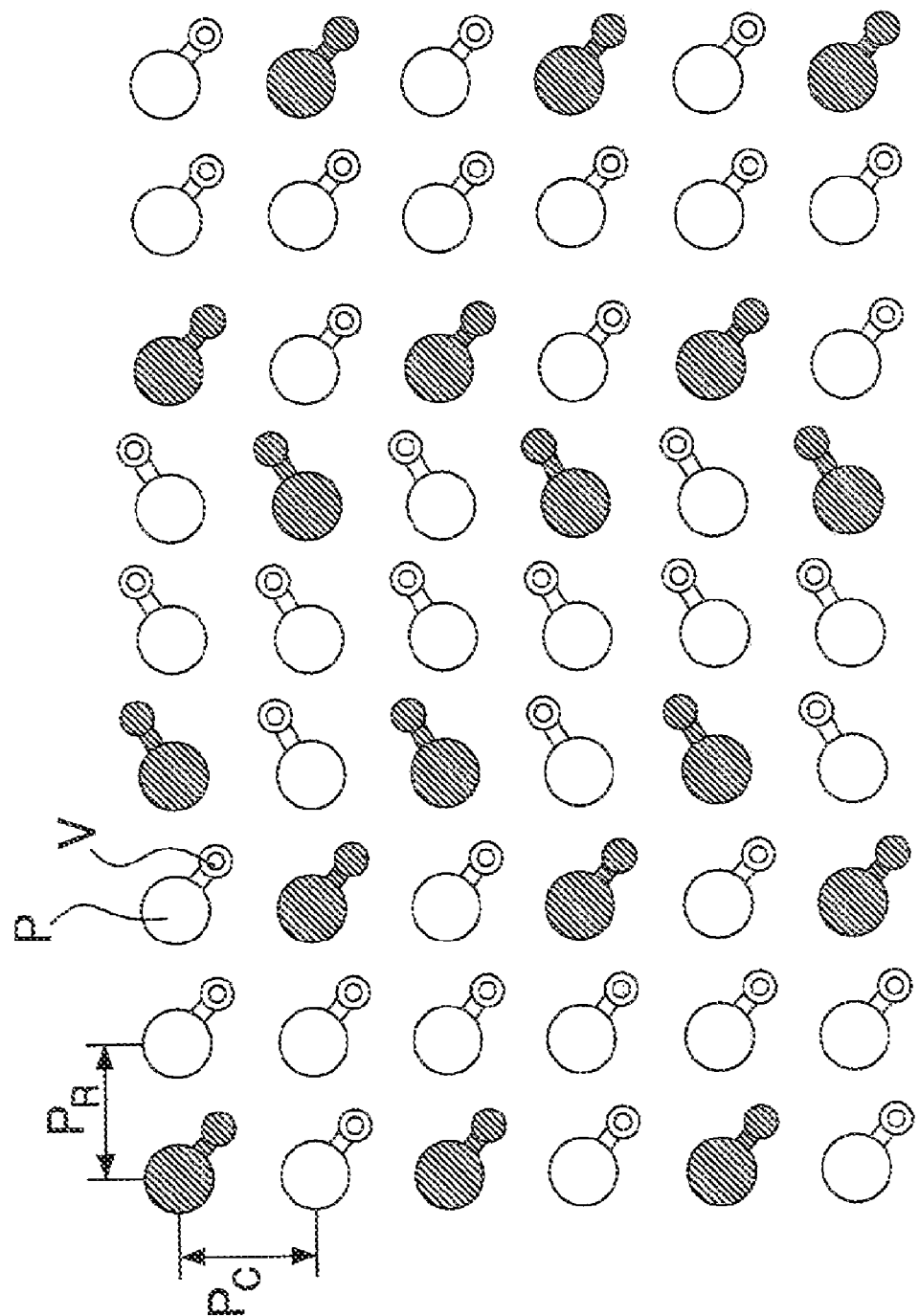
FIGS. 24A and 24B depict a footprint that provides for double-density routing.
Figure 24B:
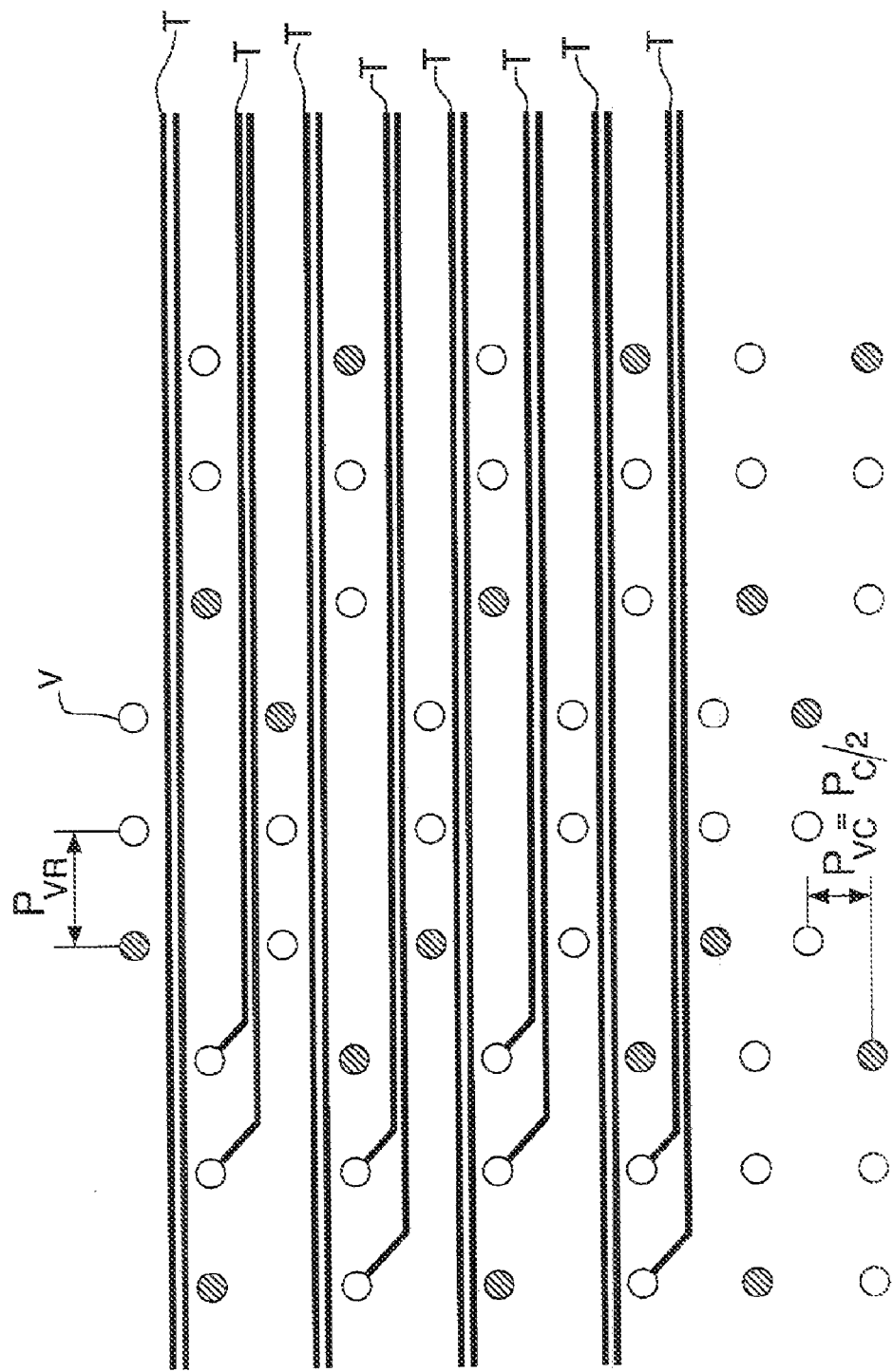

FIGS. 24A and 24B depict a footprint that provides for double-density routing, wherein adjacent signal pairs have been separated into different via columns. As shown, there may be twice as many via columns as pad columns. The via row pitch $P_{VR}$ may be the same as the pad row pitch $P_R$, and the via column pitch $P_{VC}$ may be half the pad column pitch $P_C$. Consequently, though the routing channel between adjacent via columns may be only half as wide, there may be twice as many such routing channels. Accordingly, one pair of traces T may be routed in each channel, rather than two pairs in each of half-as-many channels. Consequently, the routing density may be unchanged. However, moving the pairs farther apart tends to improve signal integrity. Alternatively, this configuration may be viewed as having one or more via rows offset relative to an adjacent row. As shown in FIG. 24B, for example, the via row fourth from the left is offset by half the pad column pitch $P_C$ from the row third from the left.

Figure 25A:
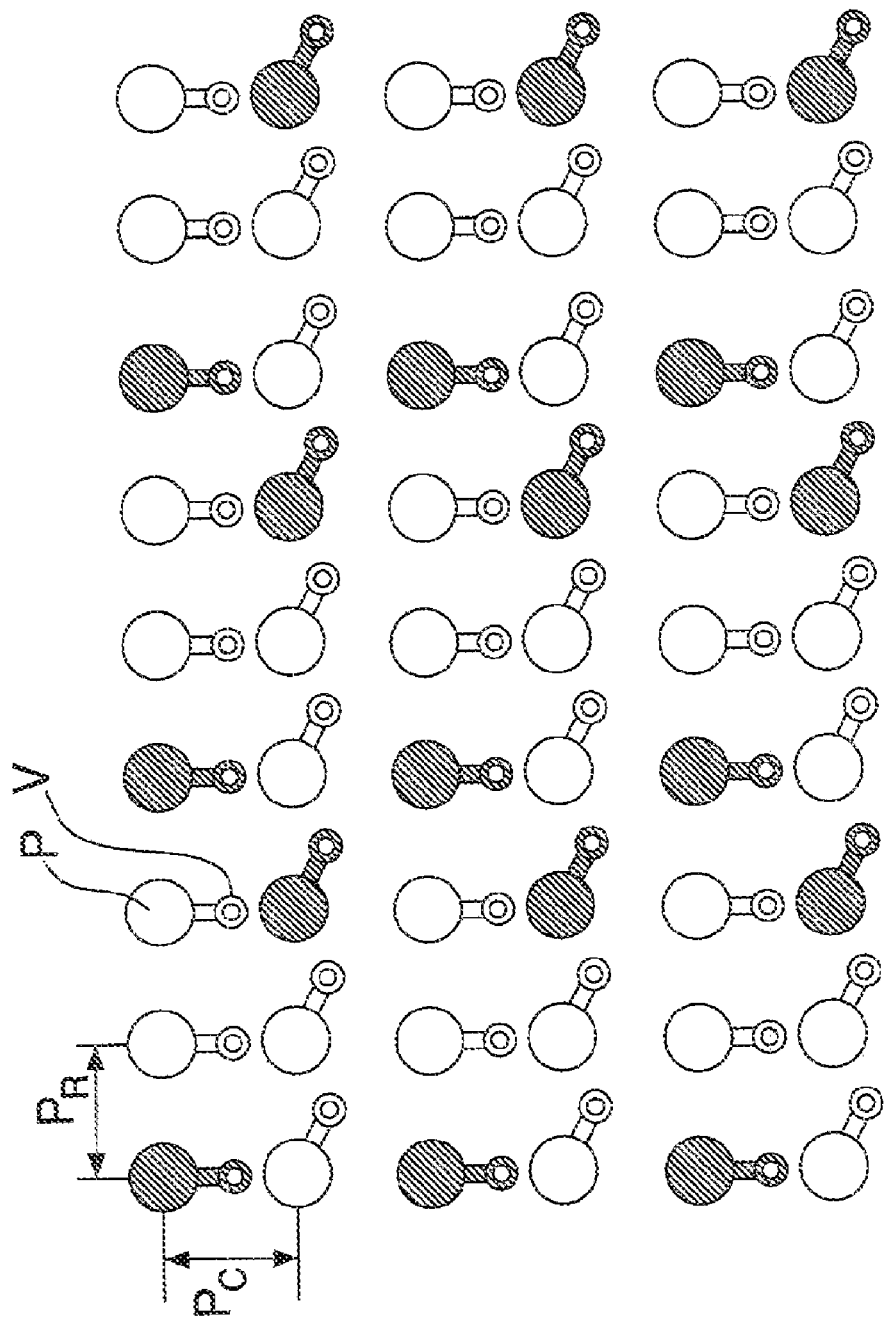
FIGS. 25A and 25B depict a footprint that provides for one-and-a-half times routing density.
Figure 25B:
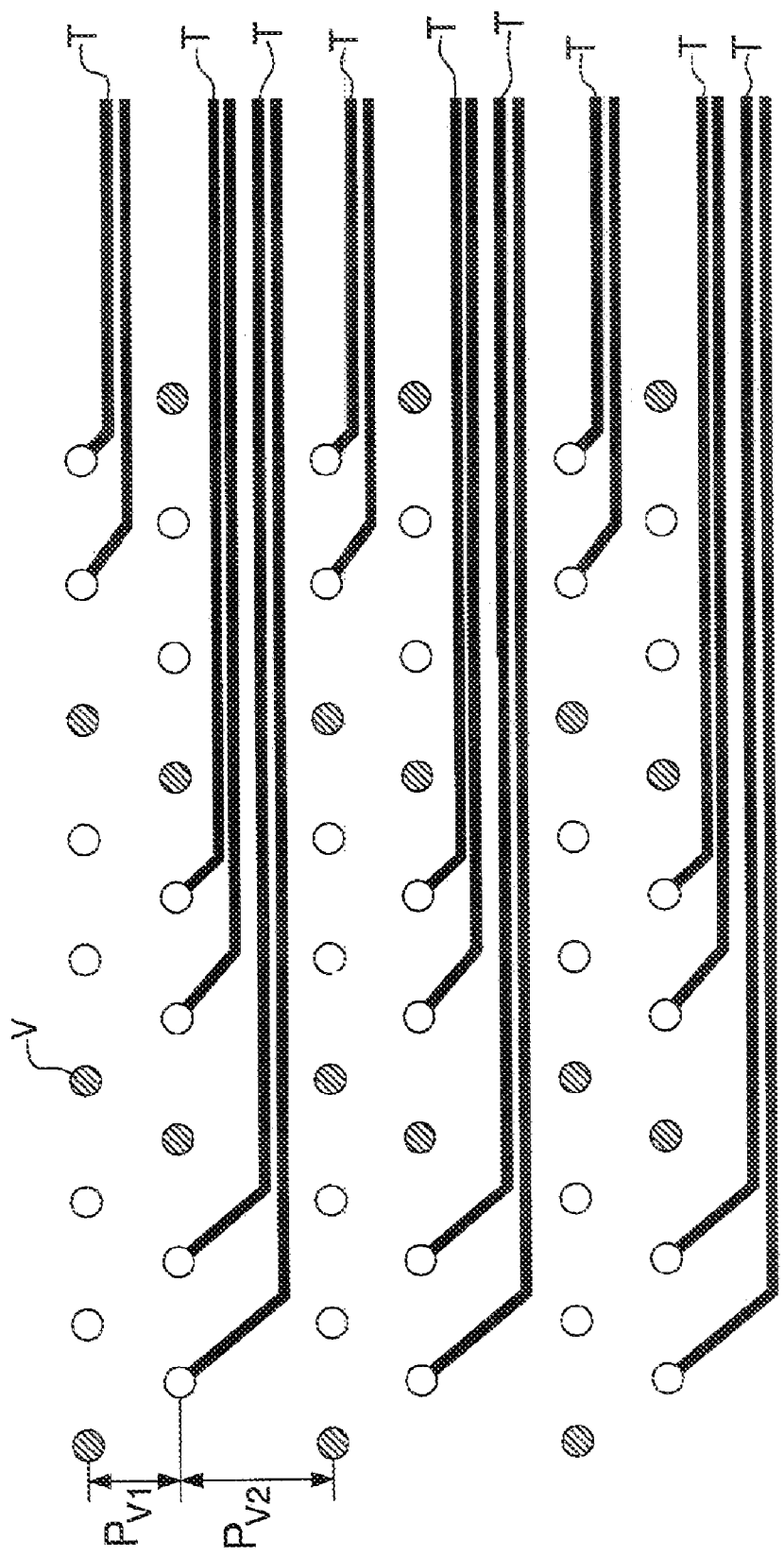

FIGS. 25A and 25B depict a footprint that provides for one-and-a-half times routing density. As shown, a first via column (e.g, the upper via column depicted in FIG. 25B) may be separated from the a second via column (e.g., the second via column from the top) by a first via column pitch $P_{V1}$. The second via column may be offset from the first via column by a distance $O_V$ along the direction along which the column extends. The second via column may be separated from the a third via column (e.g., the third via column from the top) by a second via column pitch $P_{V2}$ that is larger than the first via column pitch $P_{V1}$. Thus, a first, relatively narrow routing channel (having column pitch $P_{V1}$) may be formed between the first via column and the second via column, and a second, relatively wide routing channel (having column pitch $P_{V2}$) may be formed between the second via column and the third via column. One pair of traces T may be routed along the first routing channel. Two pairs of traces T may be routed along the second routing channel. Thus, the arrangement provides two adjacent routing channels that, combined, provide routing space for three pairs of traces.

Figure 26A:
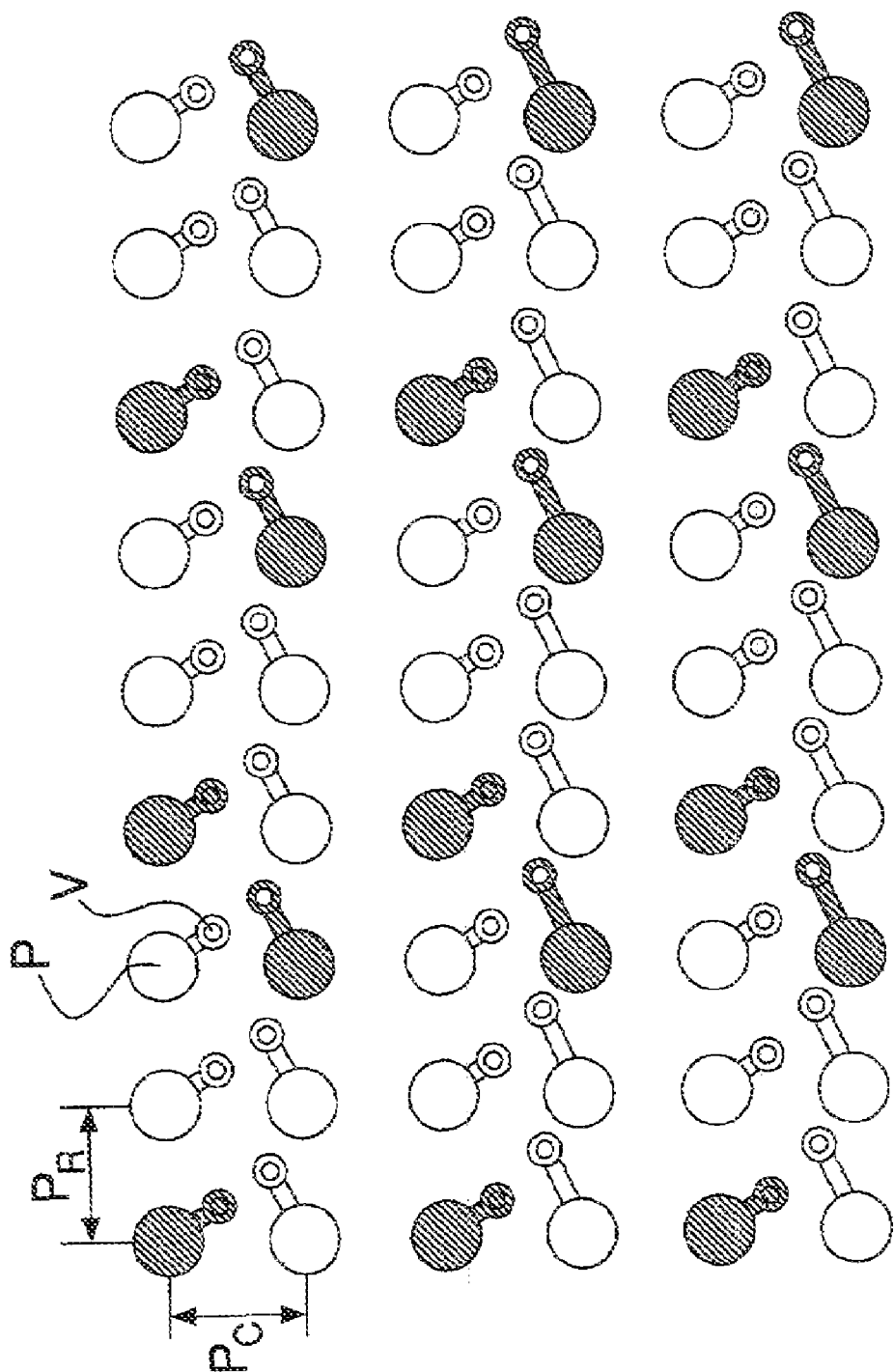
FIGS. 26A and 26B depict a footprint that provides for one-and-a-half times routing density.
Figure 26B:
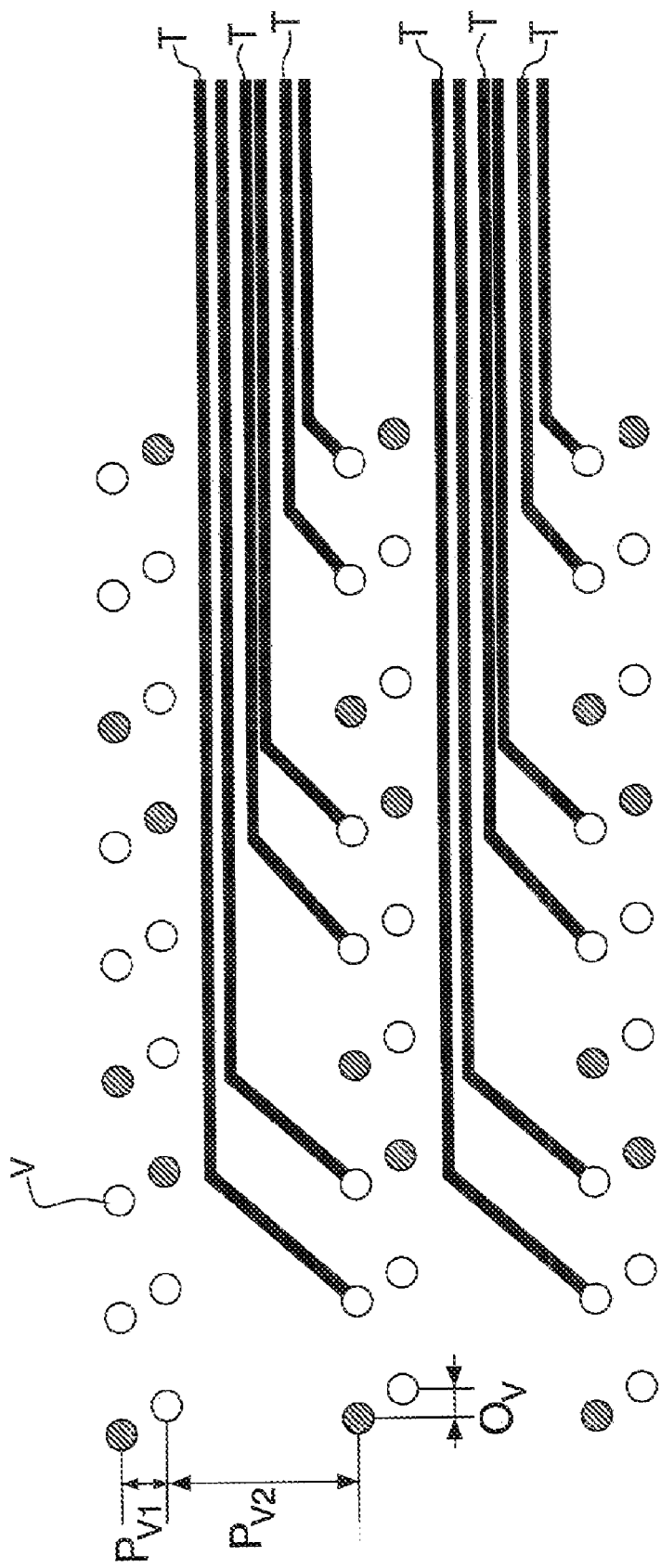

FIGS. 26A and 26B depict a footprint that provides for one-and-a-half times routing density. As shown, a first via column (e.g, the upper via column depicted in FIG. 26B) may be separated from a second via column (e.g., the second via column from the top) by a first via column pitch $P_{V1}$. The second via column may be offset from the first via column by an offset $O_V$. The second via column may be separated from the a third via column (e.g., the third via column from the top) by a second via column pitch $P_{V2}$ that is larger than the first via column pitch $P_{V1}$. Thus, a routing channel may be formed between the second and third via columns, as depicted in FIG. 26B, that is wide enough to route three pairs of traces. Accordingly, instead of two routing channels, each of which is capable of routing one pair of traces, the arrangement provides a single routing channel capable of routing three pairs of traces.

Figure 27A:
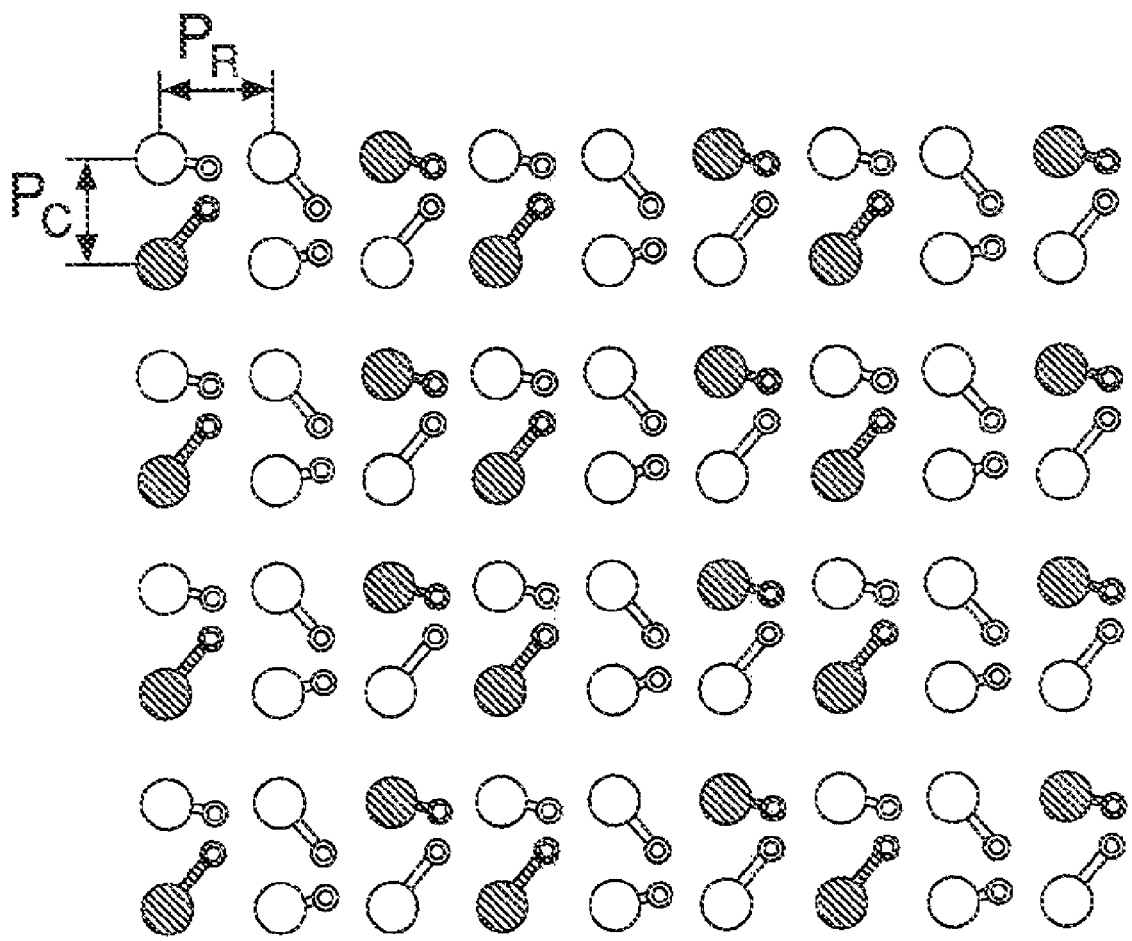
FIGS. 27A and 27B depict a footprint that provides for serpentine routing.
Figure 27B:
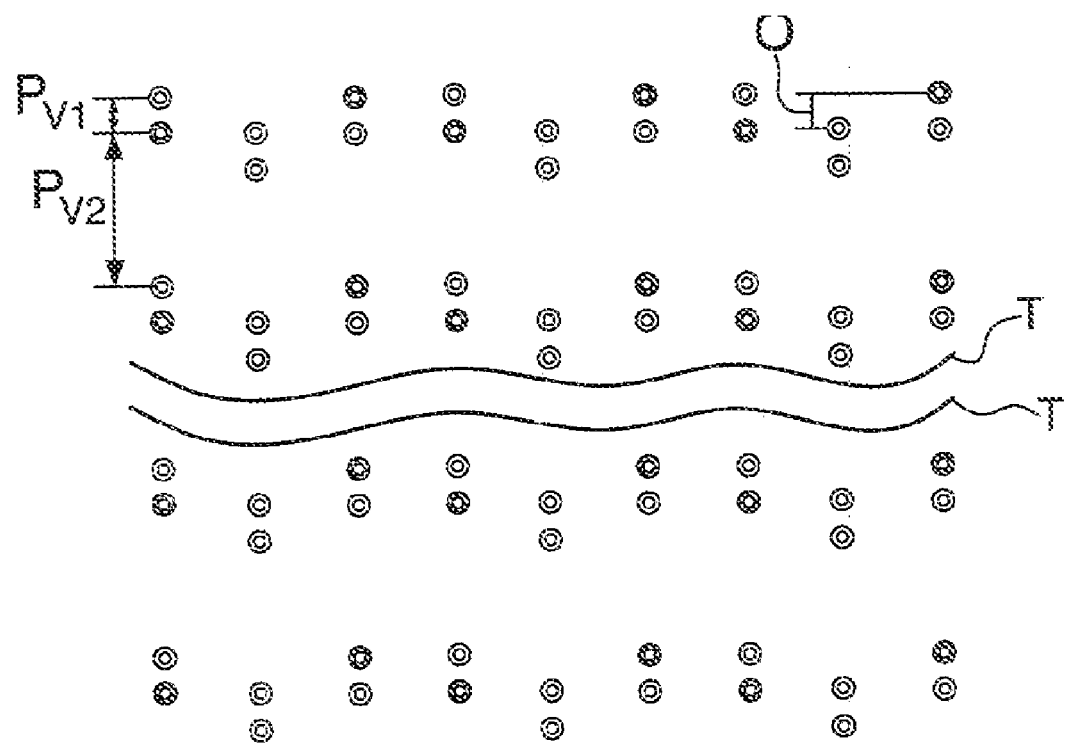

FIGS. 27A and 27B depict a footprint that provides for serpentine routing. As shown, a first via column (e.g, the upper via column depicted in FIG. 27B) may be separated from a second via column (e.g., the second via column from the top) by a first via column pitch $P_{V1}$. A first via row (e.g, the leftmost via row depicted in FIG. 27B) may be offset relative to a second via row (e.g., the second via row from the left) by a distance, which may be, as shown, the same as a via column pitch $P_{V1}$. The second via column may be separated from the a third via column (e.g., the third via column from the top) by a second via column pitch $P_{V2}$ that is larger than the first via column pitch $P_{V1}$. Adjacent rows may be staggered. That is, a first row maybe offset by a distance O from an adjacent row. As shown, every third row may be offset. Thus, as depicted in FIG. 27B, a serpentine routing channel may be formed between the second and third via columns. One or more serpentine traces T may be disposed along the serpentine routing channel.

Figure 28A:
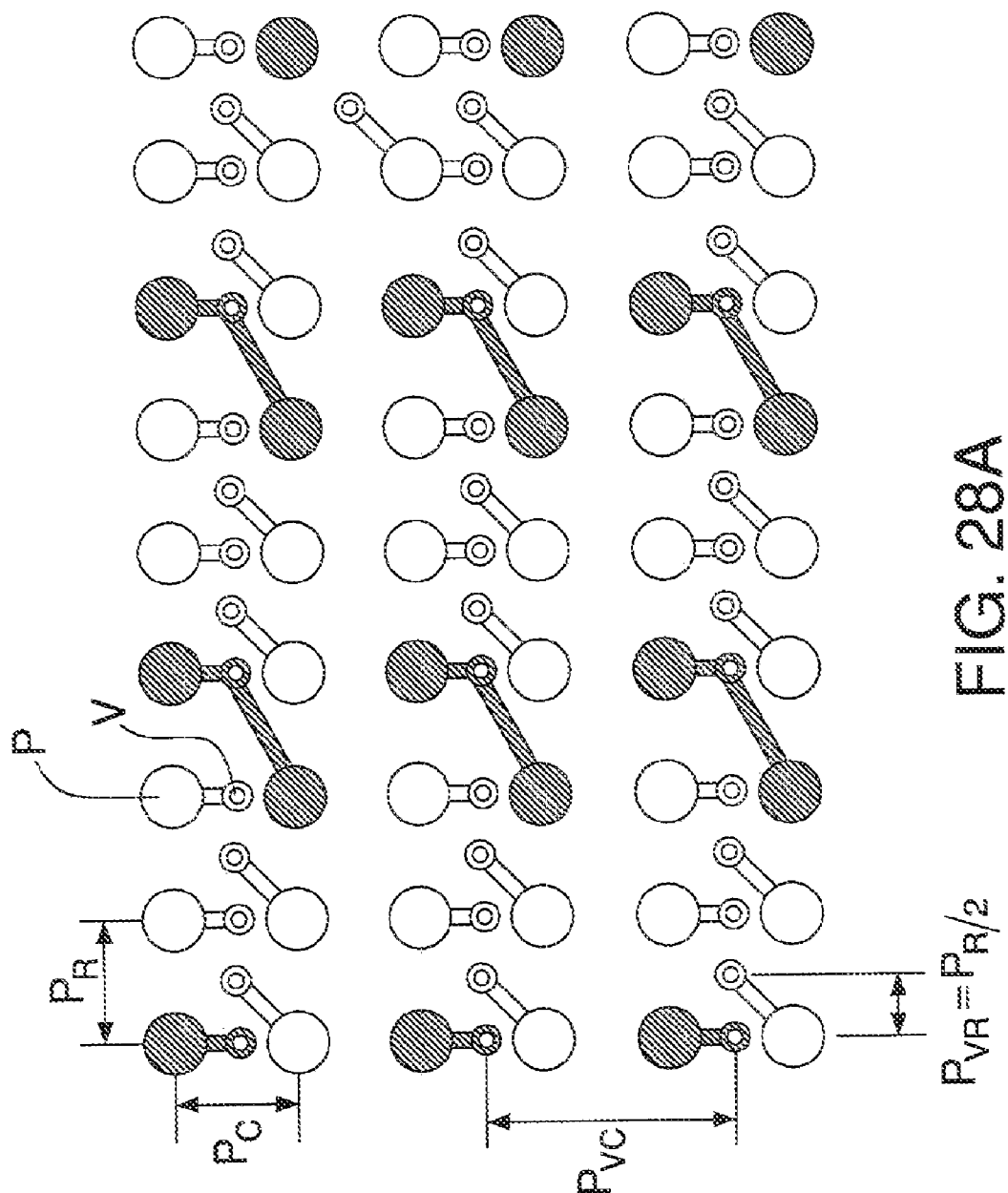
FIGS. 28A and 28B depict a footprint that provides for double-density routing.
Figure 28B:
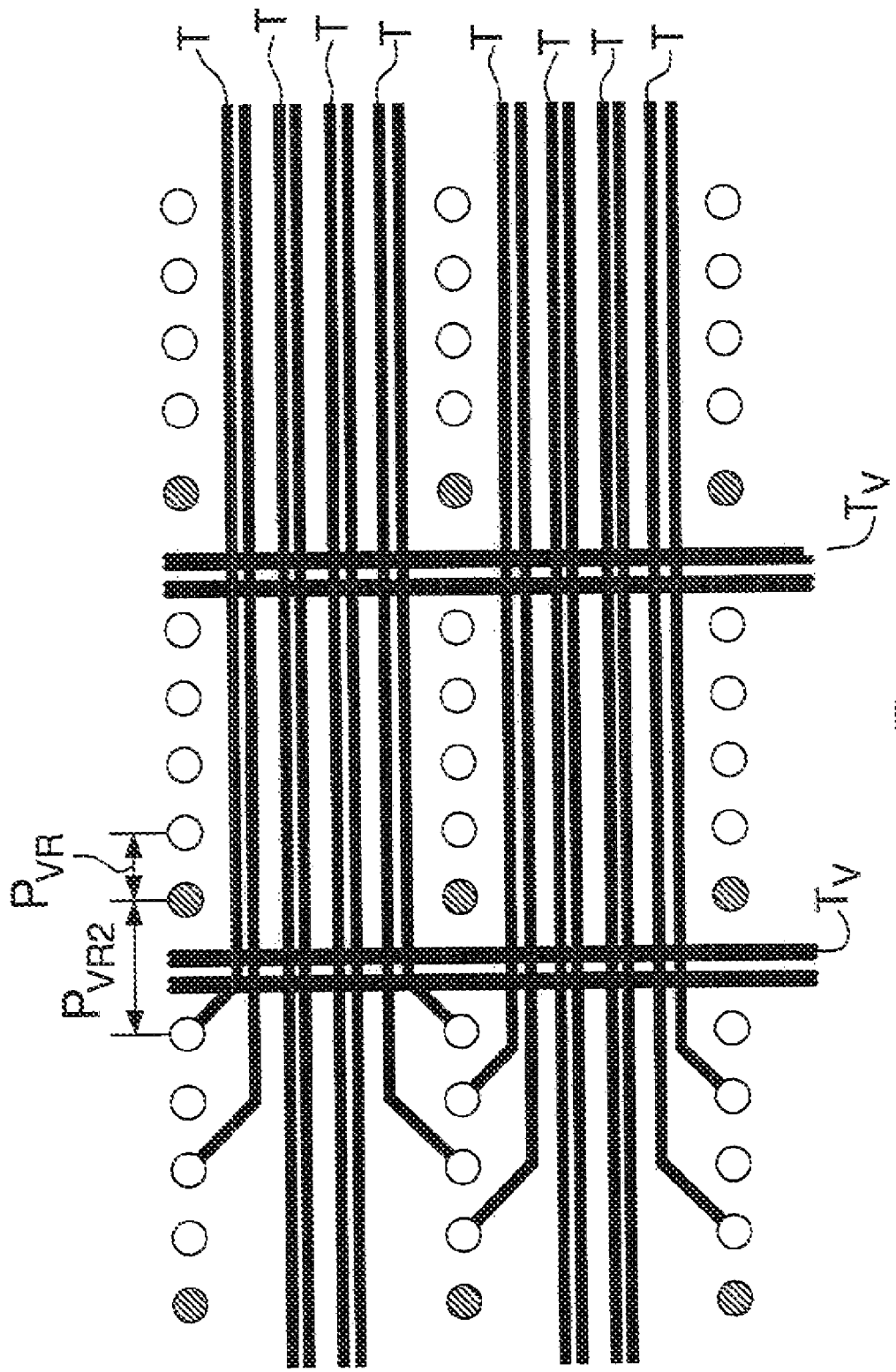

FIGS. 28A and 28B depict a footprint that provides for double-density routing. As shown, the vias V associated with the SMT pads P that form a first pad column (e.g, the upper pad column depicted in FIG. 28A) and the vias V associated with the pads P that form a second pad column (e.g., the second via column from the top) that is adjacent to the first pad column, may be arranged in a single via column, which may be disposed between the first and second pad columns. Consequently, no vias need be disposed between the second pad column and a third pad column that is adjacent to the second pad column.

As shown, pad columns may be separated by a distance $P_C$. Pad rows may be separated by a distance $P_R$. Via columns maybe separated by a distance $P_{VC}$, which may be approximately twice the pad column pitch $P_C$. Via rows may be separated by a distance $P_{VR}$, which may be approximately half the pad row pitch $P_R$. Thus, a routing channel may be formed between the second and third via columns, as depicted in FIG. 28B, that is wide enough to route four pairs of traces. Accordingly, instead of two routing channels, each of which is capable of routing one pair of traces, a single routing channel capable of routing four pairs of traces may be provided.

Note that, as shown in FIG. 28B, one ground via may be eliminated for every two pairs of signal conductor vias. Thus, the arrangement provides for routing channels between adjacent via cells (where each via cell includes a ground conductor via and two adjacent pairs of signal conductor vias). As shown, adjacent via cells may be separated by a distance $P_{VR2}$, which may be approximately twice the via row pitch $P_{VR}$.

Figure 28C:
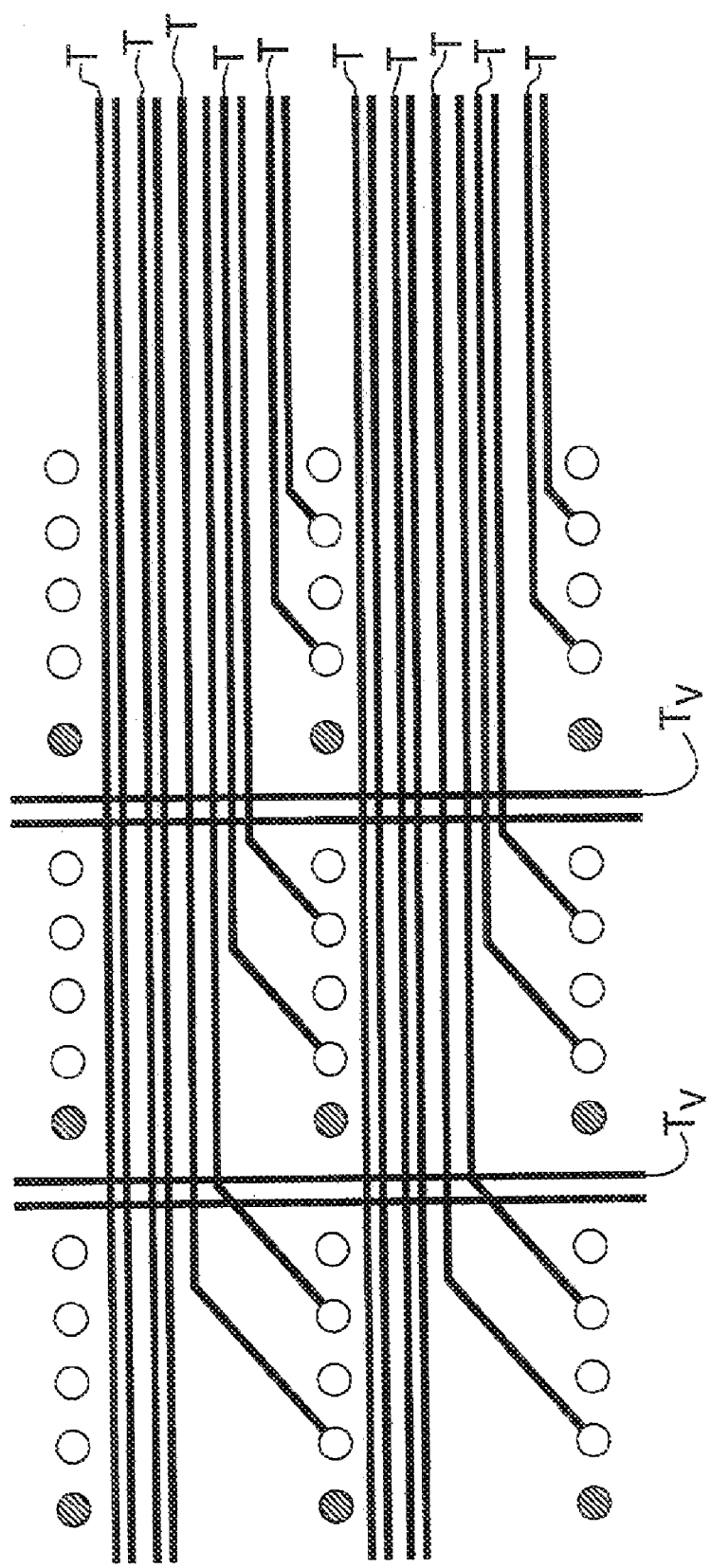
FIGS. 28C depicts a footprint that provides for two-and-a-half times routing density.

As depicted in FIG. 28C, the traces T may be made narrow enough such that five pairs of traces T may be routed in the routing channel between the adjacent via columns, rather than only four pairs as depicted in FIG. 28B. Thus, two-and-a-half times routing density may be achieved.

Figure 29A:
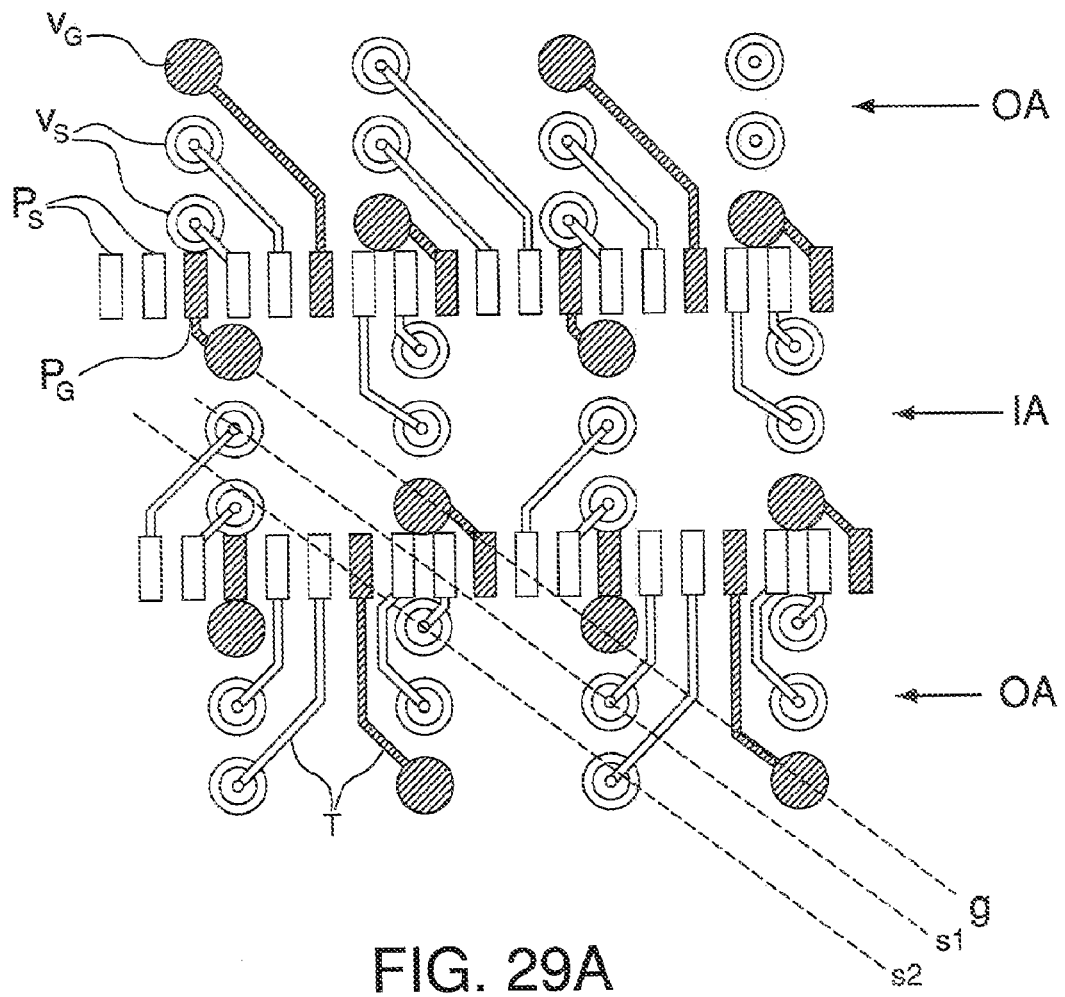
FIGS. 29A and 29B depict example footprints wherein pads are arranged in rows, and corresponding vias are arranged in staggered columns.
Figure 29B:
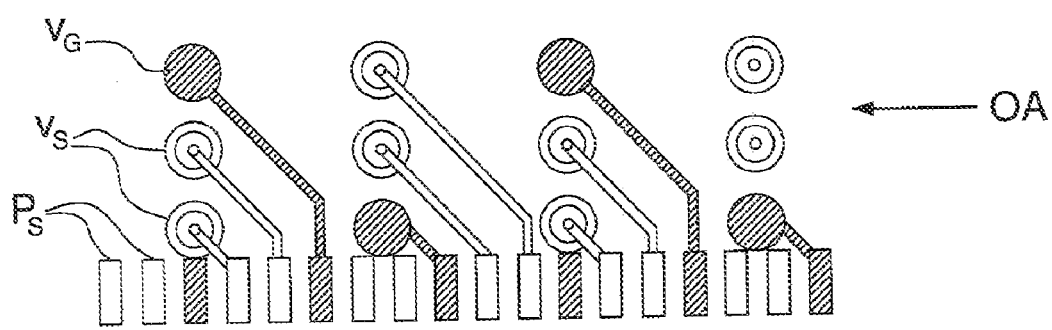

FIGS. 29A and 29B depict example connector footprints wherein pads $P_S$, $P_G$ are arranged in rows and vias $V_S$, $V_G$ are coupled with the pads $P_S$, $P_G$ and are arranged in columns. Two rows of pads $P_S$, $P_G$ are shown, each row in a signal-signal-ground configuration. The hatched rectangles denote ground pads $P_G$ and the open rectangles denote signal pads $P_S$. The signal pads $P_S$ of one row may be aligned with (i.e., in the same column as) signal pads $P_S$ of the adjacent row but may also be offset by, for example, a one position shift. Likewise, the ground pads $P_G$ of one row may be aligned with the ground pads $P_G$ of the other row. Thus, the signal and ground pads $P_S$, $P_G$ of one row may be vertically aligned with, respectively, the signal and ground pads $P_S$, $P_G$ of another row.

Each of the pads $P_S$, $P_G$ may be coupled to a respective via $V_S$, $V_G$ by traces T. The vias $V_S$, $V_G$ may be arranged vertically, that is, in columns. The vias $V_S$, $V_G$ may be located in an inside area IA located between the two rows of pads $P_S$, $P_G$ and/or may be located in outside areas OA, the outside areas OA being areas adjacent to a row on a side opposite the inside area IA. The columns of vias may extend across both rows of pads and contain vias associated with pads in both rows. The vias associated with the pads are preferably arranged in a plurality of side by side, generally parallel columns. The vias $V_S$, $V_G$ of each column may be in signal-signal-ground configuration. The shaded vias denote ground vias $V_G$ and the unshaded vias denote signal vias $V_S$. Adjacent columns of vias $V_S$, $V_G$ may be staggered such that each ground via $V_G$ in a column is adjacent to a signal via $V_S$ in an adjacent column. Thus each column of vias $V_S$, $V_G$, may be in a signal-signal-ground configuration, but the ground vias $V_G$ may be staggered with respect to ground vias $V_G$ in adjacent columns. The traces T may thus be routed in a manner to couple the staggered ground vias $V_G$ in the columns with the unstaggered ground pads $P_G$ in the rows. The trace configuration of FIG. 29A may create four columns of staggered vias $V_S$, $V_G$ from two rows of unstaggered pads $P_S$, $P_G$. This results in increased routing space between the vertical columns of vias. It will be understood that embodiments of the invention are envisioned for single-ended signaling as well and that the pad and via arrangement may be adjusted accordingly.

It should be noted that the via configuration of FIG. 29A shows an arrangement of ground vias $V_G$ in a linear arrangement on a diagonal across the four columns of staggered vias $V_S$, $V_G$. This diagonal arrangement is denote by a dotted line g. In between each diagonal linear arrangement of ground vias $V_G$ may be diagonal rows of signal vias $V_S$. The diagonal arrangement of signal vias $V_S$ is denoted by dotted lines s1 and s2. It will be understood, however, that alternative arrangements are envisioned to provide the staggering of the ground vias $V_G$ relative to adjacent via columns.

The vias $V_S$ and $V_G$ are shown in FIG. 29A as being linearly arranged in columns and with the signal vias and ground vias forming each signal-signal-ground cell being equally spaced from each other along the direction of the column. However, for desired trace routing and electrical characteristics, the spacing and relative positions of the vias may be arranged in accordance with embodiments previously described. For example, the relative spacing between vias may be as shown in FIG. 2B, with the distance between the signal vias being less than the distance between the ground via and the next adjacent signal via. Similarly, the vias can be arranged as shown in FIGS. 3B or 4B, with the signal vias being laterally offset from the column centerline.

In an alternative embodiment, the pads $P_S$, $P_G$ may be coupled with columns of plated through-holes, where the plated through-holes are in a staggered configuration similar to the configuration of the vias $V_S$, $V_G$. Alternatively, the signal pads $P_S$ may be coupled to signal vias $V_S$ and the ground pads $P_G$ may be coupled to ground plated through-holes, and vice versa.

FIG. 29B depicts such a pad arrangement that may be suitable for SMT edge card applications, for example. In the embodiment shown, the arrangement of pads is ideally suited for a differential pair edge card connector. The two connector terminals carrying the differential signals may be terminated to adjacent pads $P_S$ and these pairs of pads are separated from adjacent pairs of pads by ground pads $P_G$.

FIG. 30A depicts two pairs of signal-conducting vias S, with a ground via $G_S$ disposed between the pairs. The pairs may be differential signal pairs. The vias are arranged in a linear array disposed along a centerline C. Each via hole may be approximately the same size. FIG. 31B depicts the two pairs of signal-conducting vias S, with a relatively large ground via $G_L$ disposed between the pairs. As shown in FIG. 30B, the ground via hole may be larger than any of the signal via holes.

FIG. 31A depicts two pairs of signal-conducting vias S, with a ground via $G_S$ disposed between the pairs. The pairs may be differential signal pairs. The vias are arranged into two adjacent columns, separated by a distance $P_{VC}$. The columns are offset from one another by a distance $O_V$. As shown in FIG. 31A, each via hole may be approximately the same size. FIG. 31B depicts the two pairs of signal-conducting vias S, with a relatively large ground via $G_L$ disposed between the pairs. As shown in FIG. 31B, the ground via hole may be larger than any of the signal via holes.

Figure 32A:
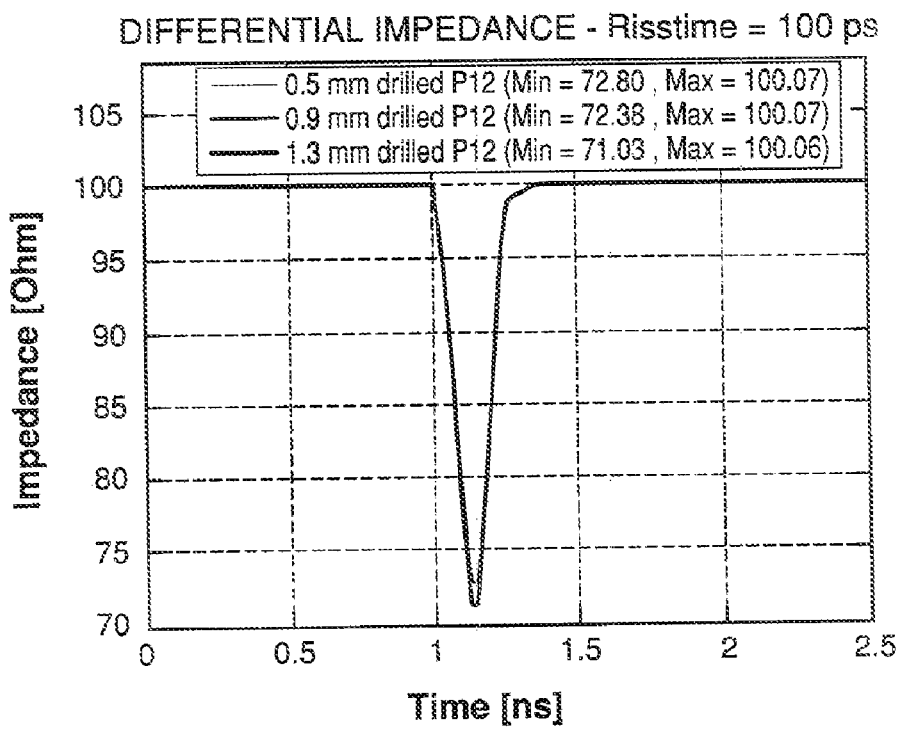
FIGS. 32A and 32B provide example plots of differential impedance and cross-talk, respectively, for various ground via hole sizes.
Figure 32B:
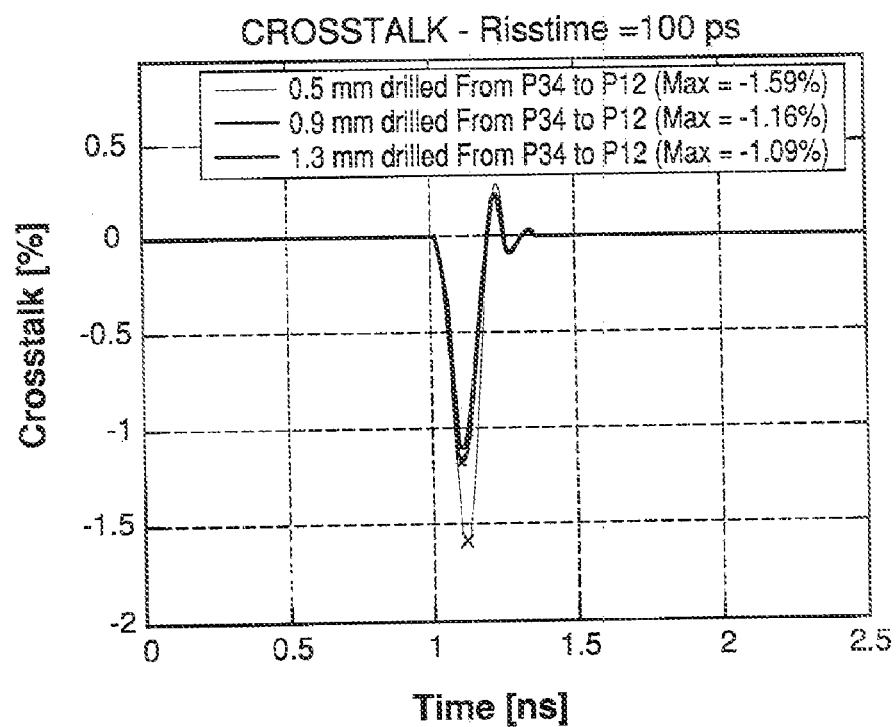

The larger the ground via hole, the less the crosstalk between the signal-conducting vias. FIGS. 32A and 32B provide example plots of differential impedance and cross-talk, respectively, for various ground via hole sizes. The data was gathered for footprints having signal via holes with diameters of about 0.5 mm, and ground via holes of about 0.5, 0.9, and 1.3 mm in diameter. It can be seen from FIG. 32A that differential impedance (i.e., impedance between the signal vias that form a differential signal pair) is relatively unaffected by the change in ground via hole size. It can be seen from FIG. 32B that cross-talk performance improves significantly as the ground via hole diameter increases.

Thus there have been described several embodiments of footprint definitions for SMT backplane and edge card applications. It should be understood that the foregoing illustrative embodiments have been provided merely for the purpose of explanation and are in no way to be construed as limiting of the invention. For example, though the foregoing example embodiments were described in connection with via arrangements including both ground conductor vias and signal conductor vias, it is expected that, in accordance with the principles of the invention, suitable arrangements may be designed for connectors having only signal contacts. Similarly, though the foregoing example embodiments were described in connection with via arrangements including differential signal pairs, it is expected that, in accordance with the principles of the invention, suitable arrangements may be designed for connectors having only single-ended signal conductors, and for connectors having a combination of differential signal pairs and single-ended signal conductors. Additionally, it should be understood that the concepts described above may be employed alone or in combination with any of the other concepts described above.

What is claimed:

1. A circuit board for receiving an electrical component, the circuit board comprising:
    a substrate;
    a plurality of electrically-conductive pads disposed on a surface of the substrate, the pads arranged in first and second adjacent rows that each include both ground pads and signal pads, the first and second rows of pads being devoid of power pads, the pads defining a pad row pitch; and
    a plurality of vias extending into the substrate, the vias arranged in first and second rows that each include both ground vias and signal vias, the first and second adjacent rows of vias being devoid of power vias, the vias defining a row pitch,
    wherein (i) each of the signal vias is electrically connected to a respective one of the pads (ii) the pads are disposed relative to one another in a pad arrangement, (iii) the vias are disposed relative to one another in a via arrangement that differs from the pad arrangement such that the via row pitch is different than the pad row pitch, and (iv) an electrical performance characteristic of the circuit board is improved relative to what the electrical performance characteristic would be if the via arrangement were the same as the pad arrangement.

2. The circuit board of claim 1, wherein the electrical performance characteristic is cross-talk.

3. The circuit board of claim 1, wherein the electrical performance characteristic is impedance.

4. The circuit board of claim 1, wherein the electrical performance characteristic is insertion loss.

5. The circuit board of claim 1, wherein the via row pitch is greater than the pad row pitch.

6. The circuit board of claim 1, wherein the rows of pads and vias are arranged in a ground-signal-signal-ground-signal-signal configuration.

7. A circuit board for receiving an electrical component, the circuit board comprising:
    a substrate;
    a first plurality of electrically-conductive pads disposed in a first linear array on a surface of the substrate;
    a second plurality of electrically-conductive pads disposed in a second linear array on the surface of the substrate; and
    a plurality of electrically-conductive vias disposed in a linear array, each of the vias extending into the substrate,
    wherein (i) the pads in each pad array are arranged in a ground-signal-signal-ground arrangement, and (ii) each of the pads is electrically connected to one of the vias, (iii) the vias are arranged in a ground-signal-signal-signal-signal-ground arrangement, (iv) a first two of the signal vias are electrically connected to pads in the first pad array, (v) a second two of the signal vias are electrically connected to pads in the second pad array, (vi) the first two of the signal vias form a first differential signal pair, (vii) the second two of the signal vias form a second differential signal pair.

8. A circuit board for receiving an electrical component, the circuit board comprising:
    a substrate;
    a first linear pad array of electrically-conductive pads disposed on a surface of the substrate, the first pad array comprising a first ground pad, a first signal pad adjacent to the first ground pad, a second signal pad adjacent to the first signal pad, and a second ground pad adjacent to the second signal pad;
    a second linear pad array of electrically-conductive pads disposed on the surface of the substrate, the second pad array comprising a third ground pad, a third signal pad adjacent to the third ground pad, a fourth signal pad adjacent to the third signal pad, and a fourth ground pad adjacent to the fourth signal pad; and
    a linear via array of electrically-conductive vias extending into the substrate, the via array comprising a first ground via, a first signal via adjacent to the first ground via, a second signal via adjacent to the first signal via, a third signal via adjacent to the second signal via, a fourth signal via adjacent to the third signal via, and a second ground via adjacent to the fourth signal via,
    wherein each of the ground pads is electrically connected to one of the ground vias, and each of the signal pads is electrically connected to a respective one of the signal vias.

9. The circuit board of claim 8, wherein a first two of the signal vias form a first differential signal pair, and a second two of the signal vias form a second differential signal pair.

10. The circuit board of claim 9, wherein the first and second signal vias form the first differential signal pair, and the third and fourth signal vias form the second differential signal pair.

11. The circuit board of claim 10, wherein the first signal via is electrically connected to the first signal pad, the second signal via is electrically connected to the second signal pad, the third signal via is electrically connected to the third signal pad, and the fourth signal via is electrically connected to the fourth signal pad.

12. The circuit board of claim 9, wherein the first and third signal vias form the first differential signal pair, and the second and fourth signal vias form the second differential signal pair.

13. The circuit board of claim 12, wherein the first signal via is electrically connected to the first signal pad, the third signal via is electrically connected to the second signal pad, the second signal via is electrically connected to the third signal pad, and the fourth signal via is electrically connected to the fourth signal pad.

14. The circuit board of claim 8, wherein the via array is positioned between the first and second pad arrays.

15. The circuit board of claim 14, wherein the via array is parallel to each of the first and second pad arrays.

16. The circuit board of claim 8, wherein each of the first and third ground pads is electrically connected to the first ground via.

17. The circuit board of claim 16, wherein each of the second and fourth ground pads is electrically connected to second ground via.

18. A circuit board for receiving an electrical component, the circuit board comprising:
a substrate;
a first plurality of electrically-conductive pads disposed in a first linear array on a surface of the substrate;
a second plurality of electrically-conductive pads disposed on the surface of the substrate in a second linear array that is parallel to the first linear array; and
a plurality of electrically-conductive vias extending into the substrate, wherein each of the vias is electrically connected to a respective one of the pads, and the vias are positioned between the pad arrays,
wherein each of first plurality of pads and the second plurality of pads are each arranged in a repeating signal-signal-ground configuration, and the plurality of vias include ground vias electrically connected to the ground pads, and signal vias electrically connected to the signal pads.

19. The circuit board of claim 18, wherein select vias of the plurality of vias are positioned in a third linear array.

20. The circuit board of claim 19, wherein the third linear array is perpendicular to the first linear array.

21. The circuit board of claim 20, wherein the first and second signal pads form a first differential signal pair.

22. The circuit board of claim 18, wherein (i) the first plurality of pads includes a first signal pad and a second signal pad adjacent to the first signal pad, (ii) the second plurality of pads includes a first ground pad, a third signal pad, and a fourth signal pad adjacent to the third signal pad, (iii) the first plurality of pads further includes a second ground pad, (iii) the plurality of vias includes a first ground via that is electrically connected to the first ground pad, a first signal via that is electrically connected to the first signal pad, a second signal via that is electrically connected to the second signal pad, and a second ground via that is electrically connected to the second ground pad, a third signal via that is electrically connected to the third signal pad, and a fourth signal via that is electrically connected to the fourth signal pad.

23. The circuit board of claim 22, wherein (i) the first signal via, the second signal via, and the first ground via are positioned in a third linear array, and (ii) the third signal via, the fourth signal via, and the second ground via are positioned in a fourth linear array.

24. The circuit board of claim 23, wherein each of the third and fourth linear arrays is perpendicular to the first linear array.

25. The circuit board of claim 24, wherein (i) the first ground via and the third signal via are positioned along a first row of vias, (ii) the first signal via and the fourth signal via are positioned along a second row of vias, and (iii) the second signal via and the second ground pad are positioned along a third row of vias.

26. The circuit board of claim 25, wherein the third linear array is adjacent to the fourth linear array.

27. The circuit board of claim 26, wherein (i) the first and second signal pads form a first differential signal pair and (ii) the third and fourth signal pads form a second differential signal pair.

28. The circuit board of claim 18, wherein the first and second plurality of pads are each devoid of power pads.

29. An electrical connector system, comprising:
an electrical connector comprising a plurality of electrical contacts, the electrical connector having a mounting interface defined by terminal ends of the electrical contacts, the electrical connector defining a connector impedance at the mounting interface; and
a circuit board comprising a substrate, a plurality of electrically-conductive pads disposed on a surface of the substrate, and a plurality of vias extending into the substrate;
wherein (i) each of the vias is electrically connected to a respective one of the pads, (ii) the pads are disposed relative to one another in a pad arrangement, (iii) the vias are disposed relative to one another in a via arrangement that differs from the pad arrangement, (iv) the terminal ends of the electrical contacts are mounted to respective pads on the circuit board, and (v) the circuit board has a board impedance that substantially matches the connector impedance.

30. A circuit board for receiving an electrical component, the circuit board comprising:
a substrate; and
first, second, and third electrically-conductive vias disposed along an array centerline that extends along a first direction, each of the vias extending into the substrate,
wherein (i) the first and second vias form a differential signal pair, (ii) the first and second vias are spaced apart from one another by a first distance along the first direction, (ii) the third via is a ground via, (iv) the third via is adjacent to the first via, (v) the first and third vias are spaced apart from one another by a second distance along the first direction, and (vi) the second distance is different from the first distance.

31. The circuit board of claim 30, wherein (i) the first via is offset from the array centerline by a third distance in a second direction that is perpendicular to the first direction, and (ii) the second via is offset from the array centerline by a fourth distance in a third direction that is opposite to the second direction.

32. The circuit board of claim 31, wherein the third and fourth distances are equal.

33. The circuit board of claim 31, wherein (i) the third via is offset from the array centerline by a fifth distance in the third direction, and (ii) the fifth distance is greater than the third distance.

34. The circuit board of claim 30, further comprising a fourth electrically-conductive via disposed adjacent to the second via along the array centerline, wherein (i) the second and fourth vias are spaced apart from one another by a third distance along the first direction, and (ii) the third distance is different from the first distance.

35. The circuit board of claim 34, wherein the second and third distances are equal.

36. The circuit board of claim 34, wherein (i) the first via is offset from the array centerline by a fourth distance in a second direction that is perpendicular to the first direction, and (iv) the second via is offset from the array centerline by a fifth distance in a third direction that is opposite to the second direction.

37. The circuit board of claim 36, wherein the fourth and fifth distances are equal.

38. The circuit board of claim 30, further comprising:
fourth, fifth, and sixth electrically-conductive vias disposed along a second array centerline that extends parallel to the first array centerline,
wherein (i) the fourth and fifth vias form a second differential signal pair, (ii) the fifth and sixth vias are spaced apart from one another by the first distance along the first direction, (iii) the sixth via is a ground via, (iv) the sixth via is adjacent to the fourth via, (v) the fourth and sixth vias are spaced apart from one another by the second distance along the first direction, (vi) the second array is offset from the first array in the first direction, and (vii) the second array is offset from the first array by not more than the second distance in the first direction.

39. The circuit board of claim 30, further comprising:
fourth, fifth, and sixth electrically-conductive vias disposed along the array centerline,
wherein (i) the fourth and fifth vias form a second differential signal pair, (ii) the fourth via is adjacent to the second via, (iii) the fifth via is adjacent to the fourth via, (iv) the sixth via is adjacent to the fifth via, (v) the fourth and fifth vias are spaced apart from one another by the first distance along the first direction, (vi) the fifth and sixth vias are spaced apart from one another by the second distance along the first direction, (vii) the second and fourth vias are spaced apart from one another by a third distance along the first direction, and (viii) the third distance is longer than first distance.

40. A circuit board for receiving an electrical component, the circuit board comprising:
a substrate;
a first linear pad array of electrically-conductive pads disposed on a surface of the substrate, the first pad array comprising a first ground pad, a first signal pad adjacent to the first ground pad, a second signal pad adjacent to the first signal pad, and a second ground pad adjacent to the second signal pad;
a second linear pad array of electrically-conductive pads disposed on the surface of the substrate, the second pad array comprising a third ground pad, a third signal pad adjacent to the third ground pad, a fourth signal pad adjacent to the third signal pad, and a fourth ground pad adjacent to the fourth signal pad;
a first linear via array of electrically-conductive vias disposed between the pad arrays, the first via array comprising a first ground via, a first signal via adjacent to the first ground via, and a second signal via adjacent to the first signal via; and
a second linear via array of electrically-conductive vias disposed parallel to the first linear via array between the pad arrays, the second via array comprising a third signal via, a fourth signal via adjacent to the third signal via, and a second ground via adjacent to the fourth signal via,
wherein (i) the first ground pad is electrically connected to the first ground via, (ii) the second ground pad is electrically connected to the second ground via, (iii) the first signal pad is electrically connected to the fourth signal via, (iv) the second signal pad is electrically connected to the second signal via, (v) the third signal pad is electrically connected to the third signal via, and (vi) the fourth signal pad is electrically connected to the first signal via.

* * * * *